(12) United States Patent
Choi et al.

(10) Patent No.: US 12,494,465 B2
(45) Date of Patent: Dec. 9, 2025

(54) DISPLAY DEVICE AND TILE-SHAPED DISPLAY DEVICE INCLUDING THE SAME

(71) Applicant: Samsung Display Co., LTD., Yongin-si (KR)

(72) Inventors: Byeong Kyun Choi, Suwon-si (KR); Byoung Yong Kim, Seoul (KR); Jae Phil Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

(21) Appl. No.: 18/158,401

(22) Filed: Jan. 23, 2023

(65) Prior Publication Data

US 2023/0238398 A1     Jul. 27, 2023

(30) Foreign Application Priority Data

Jan. 27, 2022    (KR) .................. 10-2022-0012359
Apr. 26, 2022    (KR) .................. 10-2022-0051145

(51) Int. Cl.
    *H01L 25/16*        (2023.01)
    *G09G 3/3233*     (2016.01)
           (Continued)

(52) U.S. Cl.
    CPC ......... H01L 25/167 (2013.01); *G09G 3/3233* (2013.01); *H10D 86/443* (2025.01);
             (Continued)

(58) Field of Classification Search
    CPC .. H01L 25/167; G09G 3/3233; H10D 86/443; H10D 86/60
    See application file for complete search history.

(56) References Cited

U.S. PATENT DOCUMENTS 11,328,629 B2     5/2022    Lee et al.
2017/0025070 A1*   1/2017    Kang ................... G09G 3/3233
                (Continued)

FOREIGN PATENT DOCUMENTS

KR         2007-0025153 A     3/2007
KR    10-2016-0054664 A     5/2016
              (Continued)

OTHER PUBLICATIONS

Korean Office Action for KR Application No. 10-2022-0051145, dated Jun. 14, 2025, 11 pages.

*Primary Examiner* — Peter M Albrecht
(74) *Attorney, Agent, or Firm* — Womble Bond Dickinson (US) LLP

(57) ABSTRACT

A display device, and a tile-shaped display device including the same are provided. The display device includes a transistor array layer on a first surface of a substrate, and a plurality of light emitting elements on the transistor array layer. The transistor array layer includes a plurality of pixel drivers and two or more gate drivers in a circuit area of a display area, a first gate voltage supply line around the circuit area, and two or more first gate voltage auxiliary lines connected between the first gate voltage supply line and each of the two or more gate drivers. One end of each of the two or more first gate voltage auxiliary lines is spaced from an edge of the substrate adjacent to the first gate voltage supply line than the first gate voltage supply line.

29 Claims, 36 Drawing Sheets

(51) Int. Cl.
*H10D 86/40* (2025.01)
*H10D 86/60* (2025.01)
*H01L 23/00* (2006.01)

(52) U.S. Cl.
CPC ....... *H10D 86/60* (2025.01); *G09G 2300/026* (2013.01); *G09G 2300/0426* (2013.01); *G09G 2300/0819* (2013.01); *G09G 2300/0842* (2013.01); *G09G 2330/04* (2013.01); *H01L 24/16* (2013.01); *H01L 24/17* (2013.01); *H01L 2224/05022* (2013.01); *H01L 2224/05073* (2013.01); *H01L 2224/05083* (2013.01); *H01L 2224/05124* (2013.01); *H01L 2224/05138* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/0518* (2013.01); *H01L 2224/05186* (2013.01); *H01L 2224/05561* (2013.01); *H01L 2224/05567* (2013.01); *H01L 2224/05686* (2013.01); *H01L 2224/16145* (2013.01); *H01L 2224/16225* (2013.01); *H01L 2224/17181* (2013.01); *H01L 2924/0106* (2013.01); *H01L 2924/0549* (2013.01); *H01L 2924/12041* (2013.01)

(56) References Cited

U.S. PATENT DOCUMENTS

| | | |
|---|---|---|
| 2019/0348491 A1 | 11/2019 | Chung et al. |
| 2022/0013576 A1 | 1/2022 | Cho et al. |

FOREIGN PATENT DOCUMENTS

| | | |
|---|---|---|
| KR | 2016-0079476 A | 7/2016 |
| KR | 2017-0080754 A | 7/2017 |
| KR | 10-2021-0018582 A | 2/2021 |
| KR | 2021-0012391 A | 2/2021 |
| KR | 10-2288309 B1 | 8/2021 |
| KR | 10-2330553 B1 | 11/2021 |
| KR | 2022-0007754 A | 1/2022 |

* cited by examiner

DISPLAY DEVICE AND TILE-SHAPED DISPLAY DEVICE INCLUDING THE SAME

CROSS-REFERENCE TO RELATED APPLICATION

This application claims priority to and the benefit of Korean Patent Application No. 10-2022-0012359 filed on Jan. 27, 2022 in the Korean Intellectual Property Office and Korean Patent Application No. 10-2022-0051145 filed on Apr. 26, 2022 in the Korean Intellectual Property Office, the entire disclosures of both of which are incorporated by reference herein.

BACKGROUND

1. Field

The present disclosure relates to a display device, and a tile-shaped display device including the same.

2. Description of the Related Art

As the information society develops, the demand for display devices for displaying images is increasing in various forms. The display devices may be flat panel display devices, such as liquid crystal display devices, field emission display devices, and light emitting display panels.

Light emitting display devices may include an organic light emitting display device including an organic light emitting diode (OLED) element as a light emitting element or an inorganic light emitting display devices including an inorganic light emitting diode element such as a light emitting diode (LED) as a light emitting element. The organic light emitting display device adjusts the magnitude of a driving current applied to the organic light emitting diode element to adjust the luminance or gray level of light of the organic light emitting diode element. However, because in the inorganic light emitting diode element, a wavelength of emitted light varies according to a driving current, the image quality may be degraded when the inorganic light emitting diode element is driven in the same manner as the organic light emitting diode element.

SUMMARY

The present disclosure is directed to providing a display device, which can prevent short-circuit defects of lines disposed adjacent to an edge of a substrate, and a tile-shaped display device including the same.

According to one or more embodiments, a display device comprises a substrate including a display area in which a plurality of sub-pixels is arranged, and a non-display area at a periphery of the display area, a transistor array layer on a first surface of the substrate, and a plurality of light emitting elements in the display area on the transistor array layer, and corresponding to the plurality of sub-pixels. The transistor array layer includes a plurality of pixel drivers in a circuit area of the display area, each of the plurality of pixel drivers corresponding to the plurality of sub-pixels, and each of the plurality of pixel drivers including at least one transistor, two or more gate drivers in the circuit area, spaced from each other in one direction, and configured to supply each signal to gate lines connected to the plurality of pixel drivers, a first gate voltage supply line around the circuit area of the display area, and extending in one direction, and two or more first gate voltage auxiliary lines extending in the other direction crossing the one direction, and connected between the first gate voltage supply line and each of the two or more gate drivers. One end of each of the two or more first gate voltage auxiliary lines is connected to the first gate voltage supply line through at least one first gate voltage line contact hole, and is spaced from an edge of the substrate adjacent to the first gate voltage supply line than the first gate voltage supply line.

Each of the plurality of light emitting elements is a flip chip type micro light emitting diode element.

Each pixel of a plurality of pixels includes two or more sub-pixels of the plurality of sub-pixels adjacent in the one direction or the other direction. The display device further includes an anti-ESD pattern layer in a part of the non-display area of the first surface of the substrate. The anti-ESD pattern layer includes a main pattern in parallel with an edge of the display area, and a plurality of sub-patterns protruding from the main pattern toward the display area. The plurality of sub-patterns is respectively located between pixels adjacent to the main pattern from among the plurality of pixels. At least one of the plurality of sub-patterns overlaps the first gate voltage line contact hole.

The first gate voltage supply line is located adjacent to the main pattern of the anti-ESD pattern layer.

The non-display area includes at least one pad area in which pads connected to the transistor array layer are located. The anti-ESD pattern layer is spaced from the at least one pad area.

The display device further comprises connection lines on a second surface of the substrate opposite to the first surface of the substrate, and side surface lines on one side surface between the first surface and the second surface of the substrate, the side surface lines being connected between the line pads and the connection lines. Each of the connection lines is connected to a flexible film through a conductive adhesive member.

The one end of each of the two or more first gate voltage auxiliary lines extends in the one direction and overlaps the first gate voltage supply line.

The transistor array layer further includes a second gate voltage supply line located around the circuit area of the display area, extending in the one direction, and further spaced from the edge of the substrate than the first gate voltage supply line, and two or more second gate voltage auxiliary lines extending in the other direction, and connected between each of the two or more gate drivers and the second gate voltage supply line. The first gate voltage supply line and the two or more first gate voltage auxiliary lines are configured to transmit a first gate level voltage to the two or more gate drivers. The second gate voltage supply line and the two or more second gate voltage auxiliary lines transmit a second gate level voltage having a voltage level different from the first gate level voltage to the two or more gate drivers.

The transistor array layer includes a gate insulating layer covering a semiconductor layer on the first surface of the substrate, a first interlayer insulating layer covering a first conductive layer on the gate insulating layer, a second interlayer insulating layer covering a second conductive layer on the first interlayer insulating layer, a first planarization layer covering a third conductive layer on the second interlayer insulating layer, a second planarization layer covering a fourth conductive layer on the first planarization layer, and a third planarization layer covering a fifth conductive layer on the second planarization layer. The third conductive layer includes the first gate voltage supply line. The fourth conductive layer includes the two or more first gate voltage auxiliary lines.

The transistor array layer further includes a sixth conductive layer on the third planarization layer, the sixth conductive layer including a plurality of anode electrodes corresponding to the plurality of sub-pixels and a plurality of cathode electrodes corresponding to the plurality of sub-pixels, each of the plurality of cathode electrodes being adjacent to a corresponding one of the plurality of anode electrodes; and a seventh conductive layer on the sixth conductive layer and including a transparent conductive material, the seventh conductive layer including a plurality of anode pads covering the plurality of anode electrodes and a plurality of cathode pads covering the plurality of cathode electrodes, wherein the plurality of light emitting elements is located on the plurality of anode pads and the plurality of cathode pads.

The seventh conductive layer includes anti-ESD pattern layer. A part of an edge of the second planarization layer adjacent to the edge of the substrate is exposed to the outside of the third planarization layer, and a part of an edge of the first planarization layer adjacent to the edge of the substrate is exposed to the outside of the second planarization layer. The plurality of sub-patterns of the anti-ESD pattern layer come into contact with the first planarization layer, the second planarization layer, and the third planarization layer.

The transistor array layer further includes a scan write line configured to receive a scan write signal from any one of the two or more gate drivers, a scan initialization line configured to receive a scan initialization signal from any one of the two or more gate drivers, a sweep signal line a sweep signal from any one of the two or more gate drivers, a first data line configured to receive a first data voltage, and a second data line configured to receive a second data voltage. The pixel driver of each of the plurality of sub-pixels is connected to the scan write line, the scan initialization line, the sweep signal line, the first data line, and the second data line. The pixel driver of each of the plurality of sub-pixels includes a first pixel drive circuit unit configured to generate a control current according to the first data voltage of the first data line, a second pixel drive circuit unit configured to generate a drive current applied to the anode electrode according to the second data voltage of the second data line, and a third pixel drive circuit unit configured to control a period in which the drive current is applied to the anode electrode according to the control current of the first pixel drive circuit unit. The first pixel drive circuit unit includes a first transistor configured to generate the control current according to the first data voltage, a second transistor configured to apply the first data voltage of the first data line to a first electrode of the first transistor according to the scan write signal, a third transistor configured to apply an initialization voltage of an initialization voltage line to a gate electrode of the first transistor according to the scan initialization signal, a fourth transistor configured to connect the gate electrode and a second electrode of the first transistor according to the scan write signal, and a first capacitor located between the sweep signal line and the gate electrode of the first transistor.

The transistor array layer further includes a first power supply line configured to receive a first power supply voltage, a second power supply line configured to receive a second power supply voltage, a first light emitting line configured to receive a first light emitting signal from any one of the two or more gate drivers, and a scan control line configured to receive a scan control signal from any one of the two or more gate drivers. The two or more first gate voltage auxiliary lines are further connected to the pixel driver of each of the plurality of sub-pixels. The first pixel drive circuit unit further includes a fifth transistor configured to connect the first power supply line to the first electrode of the first transistor according to the first light emitting signal, a sixth transistor configured to connect the second electrode of the first transistor to the third pixel drive circuit unit according to the first light emitting signal, and a seventh transistor configured to connect a first node between the sweep signal line and the first capacitor to the first gate voltage auxiliary line according to the scan control signal.

The second pixel drive circuit unit includes an eighth transistor configured to generate the drive current according to the second data voltage, a ninth transistor configured to apply the second data voltage of the second data line to a first electrode of the eighth transistor according to the scan write signal, a tenth transistor configured to apply the initialization voltage of the initialization voltage line to a gate electrode of the eighth transistor according to the scan initialization signal, and an eleventh transistor configured to connect the gate electrode and a second electrode of the eighth transistor according to the scan write signal.

The second pixel drive circuit unit further includes a twelfth transistor configured to connect the second power supply line to the first electrode of the eighth transistor according to the first light emitting signal, a thirteenth transistor configured to connect the first power supply line to a second node according to the scan control signal, a fourteenth transistor configured to connect the second power supply line to the second node according to the first light emitting signal, and a second capacitor located between the gate electrode of the eighth transistor and the second node.

The third pixel drive circuit unit is connected to the sixth transistor of the first pixel drive circuit unit at a third node. The third pixel drive circuit unit includes a fifteenth transistor including a gate electrode connected to the third node, a sixteenth transistor configured to connect the third node to the initialization voltage line according to the scan control signal, a seventeenth transistor configured to connect a second electrode of the fifteenth transistor to the anode electrode according to the second light emitting signal, an eighteenth transistor configured to connect the anode electrode to the initialization voltage line according to the scan control signal, and a third capacitor located between the third node and the initialization voltage line.

The transistor array layer further includes a third power supply line connected to the plurality of cathode electrodes, and configured to receive a third power supply voltage, a plurality of first anode connection electrodes corresponding to the plurality of sub-pixels, and a plurality of second anode connection electrodes each corresponding to the plurality of sub-pixels, and each of the plurality of second anode connection electrodes are connected to the plurality of first anode connection electrodes. The semiconductor layer includes channel, a source electrode, and a drain electrode of each of the first, second, third, fourth, fifth, sixth, seventh, eighth, ninth, tenth, eleventh, twelfth, thirteenth, fourteenth, fifteenth, sixteenth, seventeenth, and eighteenth transistors. The first conductive layer includes a gate electrode of each of the first, second, third, fourth, fifth, sixth, seventh, eighth, ninth, tenth, eleventh, twelfth, thirteenth, fourteenth, fifteenth, sixteenth, seventeenth, and eighteenth transistors, and first, third, and fifth capacitor electrodes that are one ends of the respective first, second, and third capacitors. The second conductive layer includes second, fourth, and sixth capacitor electrodes that are the other ends of the respective first, second, and third capacitors. The third conductive layer includes the initialization voltage line, the scan initialization line, the scan write line, the first light emitting line, the second light emitting line, a first power supply horizontal line configured to receive the first power supply voltage, the sweep signal line, the first gate voltage auxiliary line, the scan control line, and a third power supply auxiliary line configured to receive the third power supply voltage. The fourth conductive layer includes the first data line, a first power supply vertical line configured to receive the first power supply voltage, the second data line, and the plurality of first anode connection electrodes. The fifth conductive layer includes the second power supply line and the plurality of second anode connection electrodes. The third power supply line is spaced from the second power supply line, and is a part of the fifth conductive layer or the sixth conductive layer.

According to one or more embodiments, a tile-shaped display device includes a plurality of display devices arranged in parallel with each other, and a seaming part located between the plurality of display devices. Any one of the plurality of display devices includes a substrate including a display area in which a plurality of sub-pixels is arranged, and a non-display area that is periphery of the display area, a transistor array layer on a first surface of the substrate, and a plurality of light emitting elements in the display area on the transistor array layer, where the plurality of light emitting elements corresponds to the plurality of sub-pixels. The transistor array layer further includes a plurality of pixel drivers in a circuit area of the display area, the plurality of pixel drivers corresponding to the plurality of sub-pixels, each of the plurality of sub-pixels including at least one transistor, a first gate voltage supply line at a part of an edge of the display area that is a periphery of the circuit area, and extending in one direction, two or more gate drivers in the circuit area, spaced from each other in the one direction, and configured to supply a gate signal to gate lines connected to the plurality of pixel drivers, and two or more first gate voltage auxiliary lines extending in the other direction crossing the one direction, and connected between the first gate voltage supply line and each of the two or more gate drivers. One end of each of the two or more first gate voltage auxiliary lines is connected to the first gate voltage supply line through at least one first gate voltage line contact hole, and further spaced from an edge of the substrate adjacent to the first gate voltage supply line than the first gate voltage supply line.

Each of the plurality of light emitting elements is a flip chip type micro light emitting diode element.

Each of the plurality of display devices includes a plurality of pixels, each of the plurality of pixels including two or more sub-pixels adjacent in the one direction or the other direction, from among the plurality of sub-pixels. Any one of the plurality of display devices further includes an anti-ESD pattern layer on a part of the non-display area of the first surface of the substrate. The anti-ESD pattern layer includes a main pattern disposed in parallel with an edge of the display area, and a plurality of sub-patterns protruding from the main pattern toward the display area. The plurality of sub-patterns is respectively disposed between pixels adjacent to the main pattern from among the plurality of pixels. At least one of the plurality of sub-patterns overlaps the first gate voltage line contact hole.

The first gate voltage supply line is located adjacent to the main pattern of the anti-ESD pattern layer.

The non-display area includes at least one pad area in which pads connected to the transistor array layer are located. The anti-ESD pattern layer is spaced from the at least one pad area.

Each of the plurality of display devices further includes: connection lines on a second surface of the substrate opposite to the first surface of the substrate, and side surface lines on one side surface between the first surface and the second surface of the substrate, and each of the side surface lines being connected between the line pads and the connection lines. Each of the connection lines is connected to a flexible film through a conductive adhesive member.

The one end of each of the two or more first gate voltage auxiliary lines extends in the one direction, and overlaps the first gate voltage supply line.

The transistor array layer further includes a second gate voltage supply line located at a part of the edge of the display area, extending in the one direction, and further spaced from the edge of the substrate than the first gate voltage supply line, and two or more second gate voltage auxiliary lines extending in the other direction, and connected between each of the two or more gate drivers and the second gate voltage supply line. The first gate voltage supply line and the two or more first gate voltage auxiliary lines transmit a predetermined first gate level voltage to the two or more gate drivers. The second gate voltage supply line and the two or more second gate voltage auxiliary lines transmit a second gate level voltage having a voltage level different from the first gate level voltage to the two or more gate drivers.

The transistor array layer includes a gate insulating layer covering a semiconductor layer on the first surface of the substrate, a first interlayer insulating layer covering a first conductive layer on the gate insulating layer, a second interlayer insulating layer covering a second conductive layer on the first interlayer insulating layer, a first planarization layer covering a third conductive layer on the second interlayer insulating layer, a second planarization layer covering a fourth conductive layer on the first planarization layer, and a third planarization layer covering a fifth conductive layer on the second planarization layer, the first gate voltage supply line is a part of the third conductive layer, and the two or more first gate voltage auxiliary lines are a part of the fourth conductive layer.

The transistor array layer further includes a sixth conductive layer on the third planarization layer, the sixth conductive layer including a plurality of anode electrodes corresponding to the plurality of sub-pixels and a plurality of cathode electrodes corresponding to the plurality of sub-pixels, each of the plurality of cathode electrodes being adjacent to a corresponding one of the plurality of anode electrodes; and a seventh conductive layer on the sixth conductive layer and including a transparent conductive material, the seventh conductive layer including a plurality of anode pads covering the plurality of anode electrodes and a plurality of cathode pads covering the plurality of cathode electrodes, wherein the plurality of light emitting elements is located on the plurality of anode pads and the plurality of cathode pads.

The anti-ESD pattern layer is formed of the seventh conductive layer. A part of an edge of the second planarization layer adjacent to the edge of the substrate is exposed to the outside of the third planarization layer, and a part of an edge of the first planarization layer adjacent to the edge of the substrate is exposed to the outside of the second planarization layer. The plurality of sub-patterns of the anti-ESD pattern layer come into contact with the first planarization layer, the second planarization layer, and the third planarization layer.

The plurality of display devices is arranged in a matrix form having M rows and N columns.

A display device and a tile-shaped display device including the same according to the embodiment include two or more gate drivers disposed in a circuit area, a first gate voltage supply line disposed around the circuit area, and two or more first gate voltage auxiliary lines connected between each of the two or more gate drivers and the first gate voltage supply line. Here, one end of each of the two or more first gate voltage auxiliary lines is further spaced apart from the edge of the substrate than the first gate voltage supply line. Accordingly, it is possible to prevent one end of each of the two or more gate voltage auxiliary lines overlapping the first gate voltage supply line disposed adjacent to the edge of the substrate from being exposed to the outside of a planarization layer covering the first gate voltage auxiliary lines. Accordingly, the short-circuit defect of the first gate voltage supply line disposed adjacent to the edge of the substrate can be prevented.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
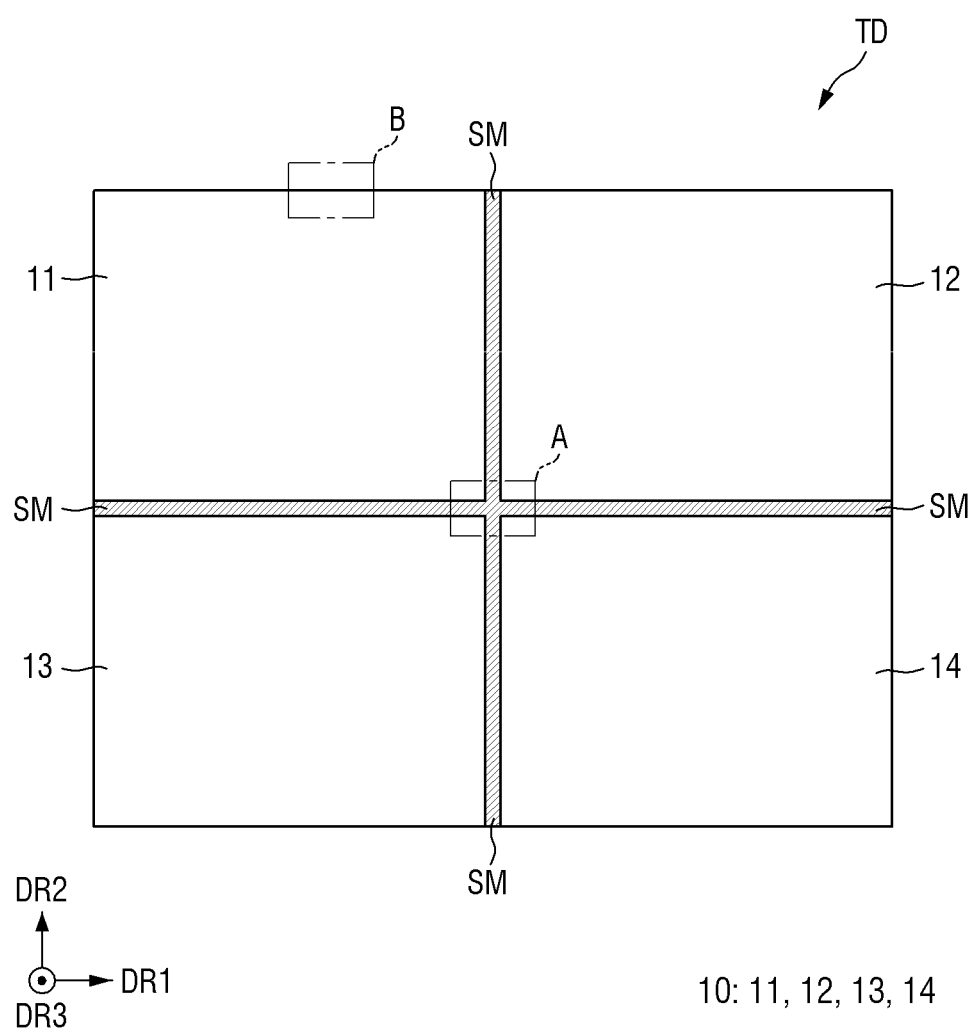
FIG. 1 is a perspective view showing a tile-shaped display device according to one or more embodiments.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts that are not associated with the description may not be provided in order to describe embodiments of the present disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

FIG. 1 is a perspective view showing a tile-shaped display device according to one or more embodiments.

Referring to FIG. 1, a tile-shaped display device TD according to one or more embodiments may include a plurality of display devices 10: 11, 12, 13, and 14 arranged in parallel along a first direction DR1 and a second direction DR2, and a seaming part SM between the plurality of display devices 10.

The plurality of display devices 10 may be arranged in a grid shape. The plurality of display devices 10 may be arranged in a matrix form including m rows (m is a natural number greater than or equal to 1) and n columns (n is a natural number greater than or equal to 1).

For example, the plurality of display devices 10 provided in the tile-shaped display device TD may include a first display device 11, a second display device 12, a third display device 13, and a fourth display device 14, which are arranged in a 2×2 matrix.

In this case, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 10 according to one or more embodiments are not limited to those shown in FIG. 1. In other words, the number and arrangement of the plurality of display devices 10 provided in the tile-shaped display device TD may be changed according to the size and shape of each of the display device 10 and the tile-shaped display device TD.

A detailed description of each of the plurality of display devices 10 will be described below.

The seaming part SM may include a coupling member or an adhesive member. In other words, the plurality of display devices 10 may be connected to each other through the coupling member or the adhesive member of the seaming part SM.

According to the example in FIG. 1, the seaming part SM may be disposed between the first display device 11 and the second display device 12, between the first display device 11 and the third display device 13, between the second display device 12 and the fourth display device 14, and between the third display device 13 and the fourth display device 14.

Figure 2:
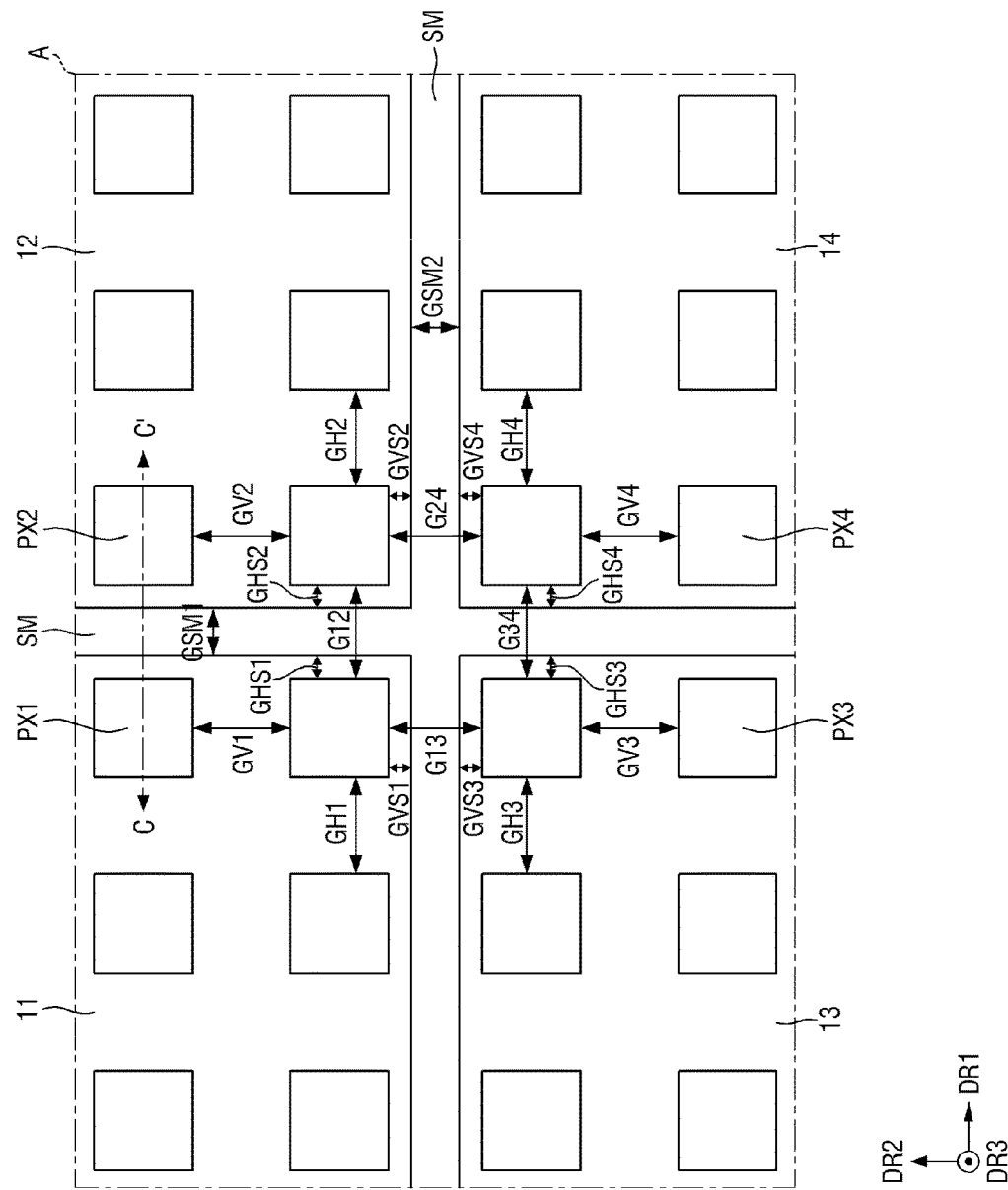
FIG. 2 is an enlarged layout view specifically showing an area A in FIG. 1.

FIG. 2 is an enlarged layout view specifically showing an area A in FIG. 1.

Referring to FIG. 2, the seaming part SM may have a planar shape of a crisscross, a cross, or a plus sign in a central area of the tile-shaped display device TD in which the first display device 11, the second display device 12, the third display device 13, and the fourth display device 14 are adjacent to each other.

Each of the plurality of display devices 11, 12, 13, and 14 (10) may include a plurality of pixels arranged in a matrix form along the first direction DR1 and the second direction DR2 to display images.

In other words, the first display device 11 may include first pixels PX1 arranged in a matrix form along the first direction DR1 and the second direction DR2 to display images. The second display device 12 may include second pixels PX2 arranged in a matrix form along the first direction DR1 and the second direction DR2 to display images. The third display device 13 may include third pixels PX3 arranged in a matrix form along the first direction DR1 and the second direction DR2 to display images. The fourth display device 14 may include fourth pixels PX4 arranged in a matrix form along the first direction DR1 and the second direction DR2 to display images.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same as each other.

The seaming part SM may be disposed between the first pixel PX1 and the second pixel PX2 adjacent in the first direction DR1. A minimum distance G12 between the first and second pixels PX1 and PX2 adjacent in the first direction DR1 may be the sum of a minimum distance GHS1 between the first pixel PX1 and the seaming part SM in the first direction DR1, a minimum distance GHS2 between the second pixel PX2 and the seaming part SM in the first direction DR1, and a width GSM1 of the seaming part SM in the first direction DR1.

The minimum distance G12 between the first and second pixels PX1 and PX2 adjacent in the first direction DR1, the first horizontal separation distance GH1, and the second horizontal separation distance GH2 may be substantially the same as each other. To this end, the minimum distance GHS1 between the first pixel PX1 and the seaming part SM in the first direction DR1 may be smaller than the first horizontal separation distance GH1, and the minimum distance GHS2 between the second pixel PX2 and the seaming part SM in the first direction DR1 may be smaller than the second horizontal separation distance GH2. In addition, the width GSM1 of the seaming part SM in the first direction DR1 may be smaller than the first horizontal separation distance GH1 or the second horizontal separation distance GH2.

A minimum distance between the third pixels PX3 adjacent in the first direction DR1 may be defined as a third horizontal separation distance GH3, and the minimum distance between the fourth pixels PX4 adjacent in the first direction DR1 may be defined as a fourth horizontal separation distance GH4. The third horizontal separation distance GH3 and the fourth horizontal separation distance GH4 may be substantially the same as each other.

The seaming part SM may be disposed between the third and fourth pixels PX3 and PX4 adjacent in the first direction DR1. A minimum distance G34 between the third and fourth pixels PX3 and PX4 adjacent in the first direction DR1 may be the sum of a minimum distance GHS3 between the third pixel PX3 and the seaming part SM in the first direction DR1, a minimum distance GHS4 between the fourth pixel PX4 and the seaming part SM in the first direction DR1, and the width GSM1 of the seam in the first direction DR1.

The minimum distance G34 between the third and fourth pixels PX3 and PX4 adjacent in the first direction DR1, the third horizontal separation distance GH3, and the fourth horizontal separation distance GH4 may be substantially the same as each other. To this end, the minimum distance GHS3 between the third pixel PX3 and the seaming part SM in the first direction DR1 may be smaller than the third horizontal separation distance GH3, and the minimum distance GHS4 between the fourth pixel PX4 and the seaming part SM in the first direction DR1 may be smaller than the fourth horizontal separation distance GH4. In addition, the width GSM1 of the seaming part SM in the first direction DR1 may be smaller than the third horizontal separation distance GH3 or the fourth horizontal separation distance GH4.

A minimum distance between the first pixels PX1 adjacent in the second direction DR2 may be defined as a first vertical separation distance GV1, and a minimum distance between the third pixels PX3 adjacent in the second direction DR2 may be defined as a third vertical separation distance GV3. The first vertical separation distance GV1 and the third vertical separation distance GV3 may be substantially the same as each other.

The seaming part SM may be disposed between the first and third pixels PX1 and PX3 adjacent in the second direction DR2. A minimum distance G13 between the first and third pixels PX1 and PX3 adjacent in the second direction DR2 may be the sum of a minimum distance GVS1 between the first pixel PX1 and the seaming part SM in the second direction DR2, a minimum distance GVS3 between the third pixel PX3 and the seaming part SM in the second direction DR2, and a width GSM2 of the seaming part SM in the second direction DR2.

The minimum distance G13 between the first and third pixels PX1 and PX3 adjacent in the second direction DR2, the first vertical separation distance GV1, and the third vertical separation distance GV3 may be substantially the same as each other. To this end, the minimum distance GVS1 between the first pixel PX1 and the seaming part SM in the second direction DR2 may be smaller than the first vertical separation distance GV1, and the minimum distance GVS3 between the third pixel PX3 and the seaming part SM in the second direction DR2 may be smaller than the third vertical separation distance GV3. In addition, the width GSM2 of the seaming part SM in the second direction DR2 may be smaller than the first vertical separation distance GV1 or the third vertical separation distance GV3.

A minimum distance between the second pixels PX2 adjacent in the second direction DR2 may be defined as a second vertical separation distance GV2, and a minimum distance between the fourth pixels PX4 adjacent in the second direction DR2 may be defined as a fourth vertical separation distance GV4. The second vertical separation distance GV2 and the fourth vertical separation distance GV4 may be substantially the same as each other.

The seaming part SM may be disposed between the second and fourth pixels PX2 and PX4 adjacent in the second direction DR2. A minimum distance G24 between the second and fourth pixels PX2 and PX4 adjacent in the second direction DR2 may be the sum of the minimum distance GVS2 between the second pixel PX2 and the seaming part SM in the second direction DR2, the minimum distance GVS4 between the fourth pixel PX4 and the seaming part SM in the second direction DR2, and the distance GSM2 of the seaming part SM in the second direction DR2.

The minimum distance G24 between the second and fourth pixels PX2 and PX4 adjacent in the second direction DR2, the second vertical separation distance GV2, and the fourth vertical separation distance GV4 may be substantially the same as each other. To this end, the minimum distance GVS2 between the second pixel PX2 and the seaming part SM in the second direction DR2 may be smaller than the second vertical separation distance GV2, and the minimum distance GVS4 between the fourth pixel PX4 and the seaming part SM in the second direction DR2 may be smaller than the fourth vertical separation distance GV4. In addition, the width GSM2 of the seaming part SM in the second direction DR2 may be smaller than the second vertical separation distance GV2 or the fourth vertical separation distance GV4.

As described above, according to one or more embodiments, in order to prevent the seaming part SM from being visually recognized from the images by the plurality of display devices 10, the minimum distance between the pixels of the display devices adjacent to each other may be substantially the same as the minimum distance between the respective pixels of the display devices.

Figure 3:
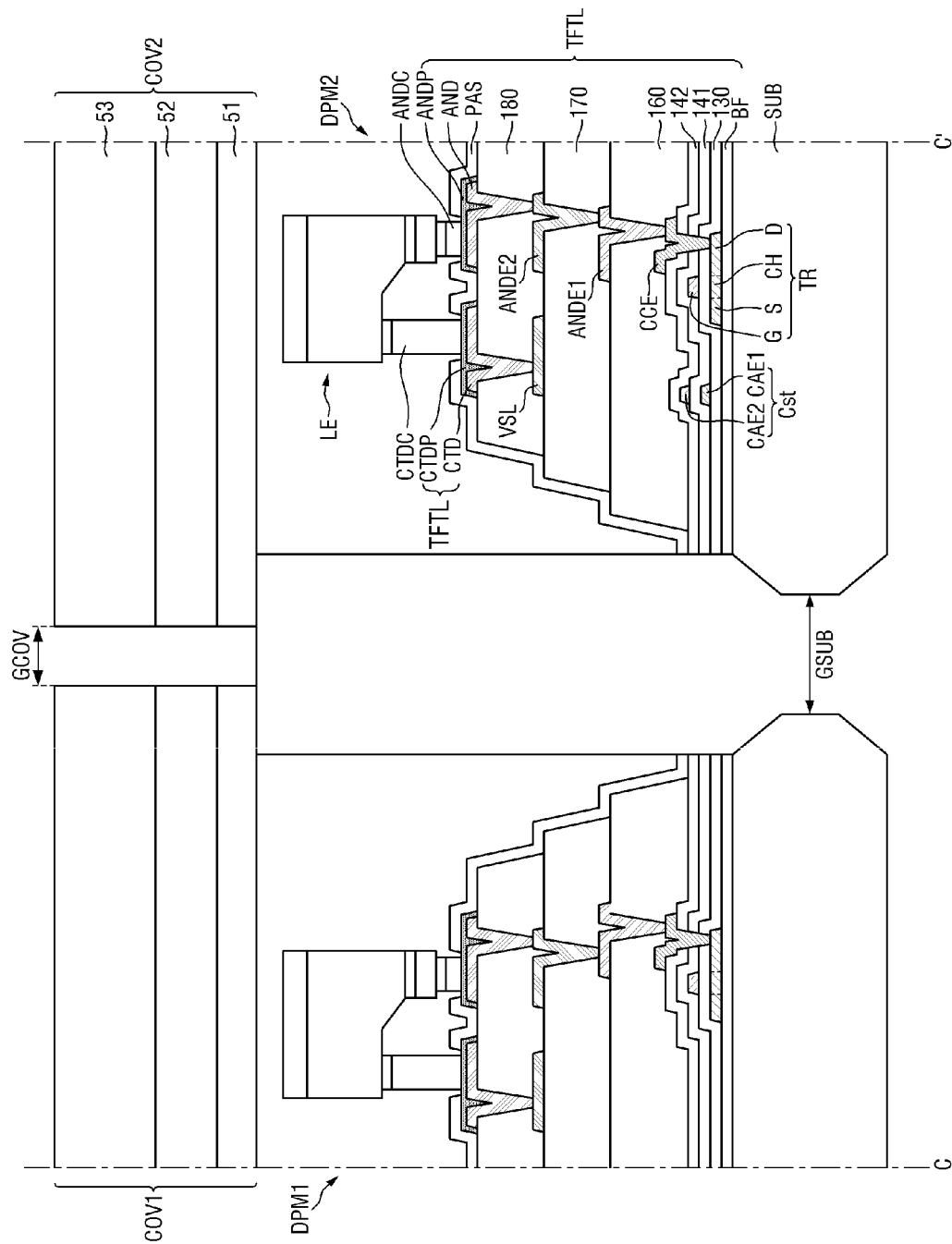
FIG. 3 is a cross-sectional view showing one example of a surface taken along the line C-C' in FIG. 2.

FIG. 3 is a cross-sectional view showing one example of a surface taken along the line C-C' in FIG. 2.

Each of the plurality of display devices 11, 12, 13, and 14 (10) may include a display module configured to emit light for displaying images and a front cover disposed on a light emitting surface of the display module.

In other words, referring to FIG. 3, the first display device 11 includes a first display module DPM1 and a first front cover COV1. The second display device 12 includes a second display module DPM2 and a second front cover COV2.

Each of the first display module DPM1 and the second display module DPM2 includes a substrate SUB, a transistor array layer TFTL, and a light emitting element LE.

The transistor array layer TFTL may include a buffer layer BF disposed on the substrate SUB, a gate insulating layer 130 covering semiconductor layers CH, S, and D on the buffer layer BF, a first interlayer insulating layer 141 covering a gate electrode G and a first capacitor electrode CAE1 on the gate insulating layer 130, a second interlayer insulating layer 142 covering a second capacitor electrode CAE2 on the first interlayer insulating layer 141, a first planarization layer 160 covering a connection electrode CCE on the second interlayer insulating layer 142, a second planarization layer 170 covering a first anode connection electrode ANDE1 on the first planarization layer 160, a third planarization layer 180 covering a second anode connection electrode ANDE2 and a third power supply line VSL on the second planarization layer 170, a cathode electrode CTD and an anode electrode AND on the third planarization layer 180, a cathode pad CTDP covering the cathode electrode CTD, and an anode pad ANDP covering the anode electrode AND.

The semiconductor layers CH, S, and D on the buffer layer BF may include a channel CH, and a source electrode S and a drain electrode D that come into contact with both sides of the channel CH.

The gate electrode G on the gate insulating layer 130 may overlap the channel CH of the semiconductor layer in a thickness direction of the substrate SUB.

A transistor TR may be provided by the channel CH, the source electrode S, the drain electrode D, and the gate electrode G.

A capacitor Cst may be provided by an area where the first capacitor electrode CAE1 and the second capacitor electrode CAE2 overlap each other in the thickness direction of the substrate SUB.

The anode electrode AND may be connected to the drain electrode D of the transistor TR through the connection electrode CCE, the first anode connection electrode ANDE1, and the second anode connection electrode ANDE2.

The cathode electrode CTD may be connected to the third power supply line VSL.

The light emitting element LE may be disposed on the anode pad ANDP and the cathode pad CTDP. An anode contact electrode ANDC and a cathode contact electrode CTDC may be disposed between each of the anode pad ANDP and the cathode pad CTDP and the light emitting element LE.

The light emitting element LE may be provided as a flip type light emitting diode, but one or more embodiments are not limited to that shown in FIG. 3.

A detailed description of the transistor array layer TFTL and the light emitting element LE will be described below.

The substrate SUB may include a first surface and a second surface opposite to each other, and a first side surface between the first surface and the second surface. The transistor array layer TFTL may be disposed on the first surface of the substrate SUB. The first surface may be a front side or a top side of the substrate SUB, and the second surface may be a rear side or a bottom side of the substrate SUB.

The substrate SUB may further include a chamfer surface that is disposed between the first surface and the first side surface and between the second surface and the first side surface, and formed of an inclined surface.

The transistor array layer TFTL and the light emitting element LE may not be disposed on the chamfer surface. Because a width of the first side surface is reduced due to the chamfer surface, damage caused by collision between the substrate SUB of the first display device 11 and the substrate SUB of the second display device 12 can be reduced.

The chamfer surface may also be disposed between the first surface and each of the other side surfaces other than the first side surface and between the second surface and each of the other side surfaces other than the first side surface. For example, when the first display device 11 and the second display device 12 have a rectangular planar shape as shown in FIG. 2, the substrate SUB may include the chamfer surfaces disposed between the first surface and each of a second side surface, a third side surface, and a fourth side surface, and disposed between the second surface and each of the second side surface, the third side surface, and the fourth side surface.

The first front cover COV1 may overlap the chamfer surface of the substrate SUB. For example, the first front cover COV1 may protrude more than the substrate SUB in the first direction DR1 and the second direction DR2. Accordingly, a distance GSUB between the substrate SUB of the first display device 11 and the substrate SUB of the second display device 12 may be greater than a distance GCOV between the first front cover COV1 and the second front cover COV2.

Each of the first front cover COV1 and the second front cover COV2 may include an adhesive member 51, a light transmittance adjustment layer 52 disposed on the adhesive member 51, and an anti-glare layer 53 disposed on the light transmittance adjustment layer 52.

The adhesive member 51 of the first front cover COV1 is attached to the first display module DPM1.

The adhesive member 51 of the second front cover COV2 is attached to the second display module DPM2.

The adhesive member 51 may be a transparent adhesive member capable of transmitting light. For example, the adhesive member 51 may be an optically clear adhesive film or an optically clear resin.

The anti-glare layer 53 may be designed to diffusely reflect external light in order to prevent a reduction in image visibility due to full reflection of external light. Accordingly, a contrast ratio of images displayed by the first display device 11 and the second display device 12 may increase due to the anti-glare layer 53.

The light transmittance adjustment layer 52 may be designed to reduce transmittance of external light or light reflected from the first display module DPM1 and the second display module DPM2. Accordingly, the gap GSUB between the substrate SUB of the first display module DPM1 and the substrate SUB of the second display module DPM2 may be prevented from being visually recognized from the outside.

The anti-glare layer 53 may be implemented as a polarizing plate, and the light transmittance adjustment layer 52 may be implemented as a phase retardation layer, but one or more embodiments are not limited thereto.

Figure 4:
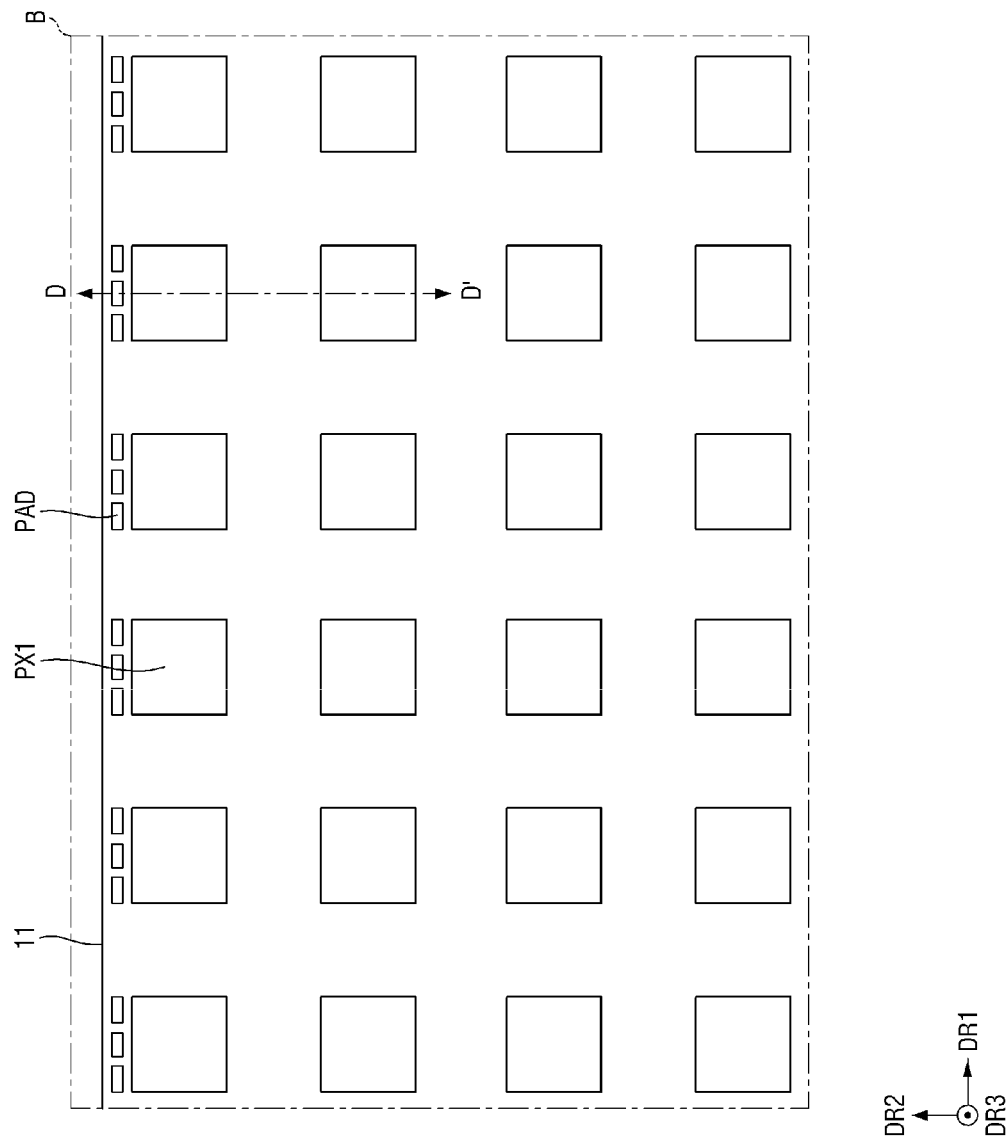
FIG. 4 is an enlarged layout view specifically showing an area B in FIG. 1.

FIG. 4 is an enlarged layout view specifically showing an area B in FIG. 1.

Referring to FIG. 4, the first display device 11 may further include pads PAD disposed at a top edge.

For example, the first display device 11 may further include data lines connected to the pads PAD and extending in the second direction DR2. Here, the pads PAD may be disposed at the edge of at least one side of the first surface of the substrate SUB of the first display device 11 in the second direction DR2. For example, the pads PAD may be disposed at the top edge and a bottom edge of the first surface of the substrate SUB of the first display device 11.

Figure 5:
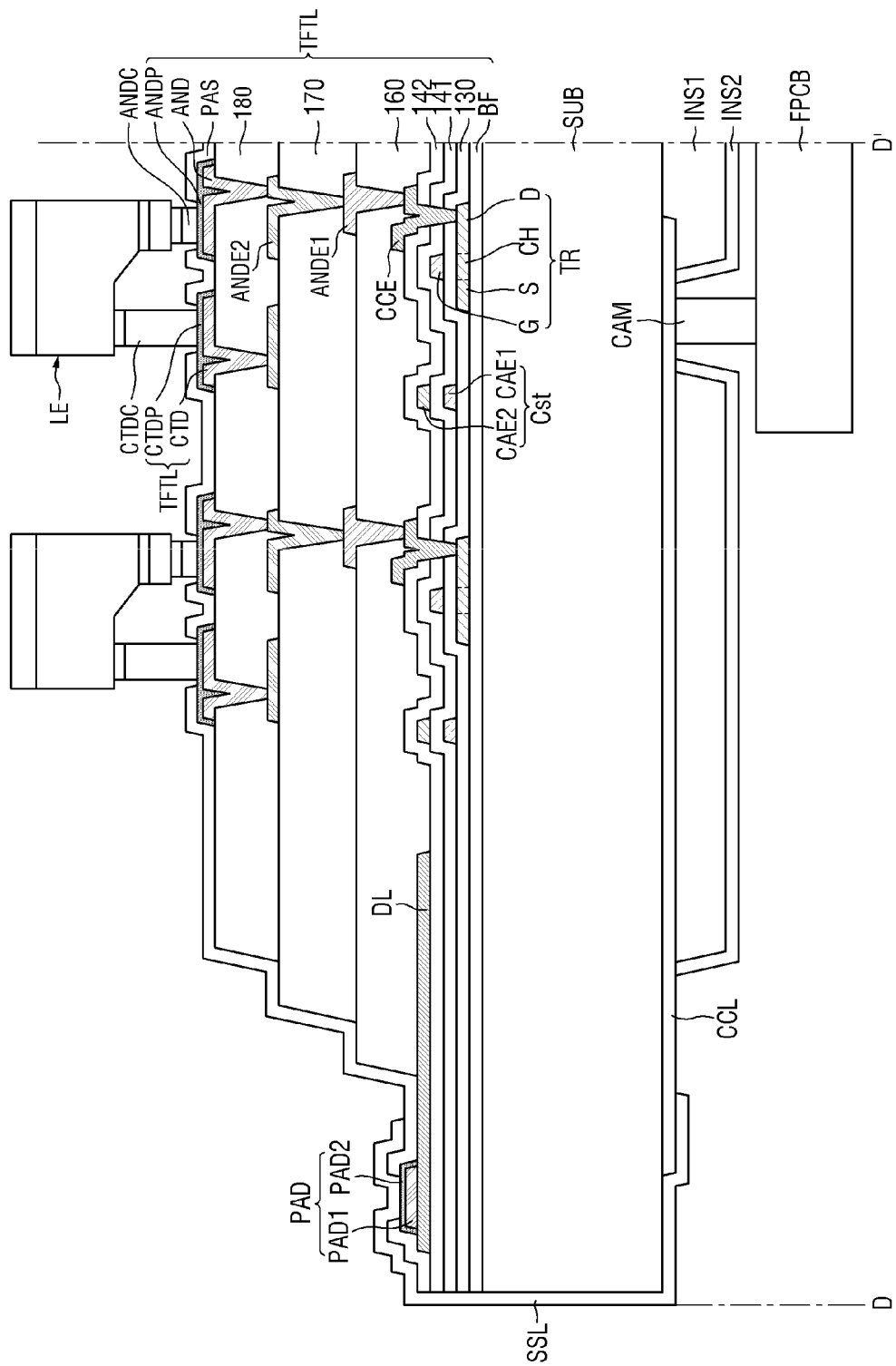
FIG. 5 is a cross-sectional view showing one example of a surface taken along the line D-D' in FIG. 4.

FIG. 5 is a cross-sectional view showing one example of a surface taken along the line D-D' in FIG. 4.

Referring to FIG. 5, the first display device 11 may further include a data line DL disposed on the second interlayer insulating layer 142, a side surface line SSL connected to the pads PAD and extending to the second surface from the side surface of the substrate SUB, and a connection line CCL disposed on the second surface of the substrate SUB and connected to the side surface line SSL.

The pad PAD connected to one end of the data line DL may be disposed on one end of the data line DL.

For example, the pad PAD may include a first pad layer PAD1 formed at the same layer as the first anode connection electrode ANDE1, and a second pad layer PAD2 covering the first pad layer PAD1 and formed at the same layer as the anode pad ANDP and the cathode pad CTDP.

As another example, the pad PAD connected to one end of the data line DL may be formed as a part of the data line DL.

As still another example, the pad PAD connected to one end of the data line DL may be disposed on an insulating film covering the data line DL and formed of a conductive pattern that comes into contact with a part of the data line DL through a hole that passes through the insulating film.

However, this is only an example, and the pad PAD according to one or more embodiments is not limited to that shown in FIG. 5.

When the pad PAD has a structure including the first pad layer PAD1 and the second pad layer PAD2, a part of the pad PAD may be exposed without being covered by the planarization layer or other insulating films.

The first pad layer PAD1 may include a metallic material having a high reflectance such as a stacked structure of aluminum and titanium (Ti/Al/Ti), a stacked structure of aluminum and indium tin oxide (ITO) (ITO/Al/ITO), an APC alloy, and a stacked structure of an APC alloy and ITO (ITO/APC/ITO).

The second pad layer PAD2 may be made of a transparent conductive material (TCO) such as ITO or IZO.

The connection line CCL disposed on the second surface of the substrate SUB may be a single layer or a multi-layer made of any one of molybdenum (Mo), aluminum (Al), chromium (Cr), gold (Au), titanium (Ti), nickel (Ni), neodymium (Nd), and copper (Cu), or an alloy thereof.

The first display device 11 may further include a lower planarization layer INS1 disposed on the second surface of the substrate SUB and covering a part of the connection line CCL, and a lower insulating layer INS2 covering the lower planarization layer INS1.

The lower planarization layer INS1 may be formed of an organic film such as an acryl resin, an epoxy resin, a phenolic resin, a polyamide resin, a polyimide resin, or the like.

The lower insulating layer INS2 may be formed of an inorganic film, for example, a silicon nitride layer, a silicon oxynitride layer, a silicon oxide layer, a titanium oxide layer, or an aluminum oxide layer.

The connection line CCL may be connected to a flexible film FPCB disposed under the lower insulating layer INS2.

The flexible film FPCB may be connected to the connection line CCL through a hole that passes through the lower planarization layer INS1 and the lower insulating layer INS2, and a conductive adhesive member CAM. A source drive circuit configured to supply data voltages to the data lines DL may be disposed on a lower surface of the flexible film FPCB. The conductive adhesive member CAM may be an anisotropic conductive film or an anisotropic conductive paste.

The side surface line SSL may be disposed over the edge of the second surface, the side surface, and the edge of the first surface of the substrate SUB. One end of the side surface line SSL may be disposed on the second surface and connected to the connection line CCL. The other end of the side surface line SSL may be disposed on the first surface and connected to the pad PAD. When the side surface line SSL is disposed on a passivation layer PAS, the other end of the side surface line SSL may be connected to the pad PAD through a contact hole that passes through the passivation layer PAS.

The side surface line SSL may be disposed on a side surface of the substrate SUB, a side surface of the buffer layer BF, a side surface of the gate insulating layer 130, a side surface of the first interlayer insulating layer 141, a side surface of the second interlayer insulating layer 142, and a side surface of the passivation layer PAS.

As described above, the first display device 11 included in the tile-shaped display device TD according to one or more embodiments includes the connection line CCL and the side surface line SSL configured to connect the data line DL disposed on the first surface of the substrate SUB to the source drive circuit of the flexible film FPCB disposed under the second surface of the substrate SUB. In other words, because the source drive circuit is disposed under the second surface of the substrate SUB, a non-display area other than the display area in which the pixels are disposed from among the first surface of the substrate SUB may be reduced or minimized.

Figure 6:
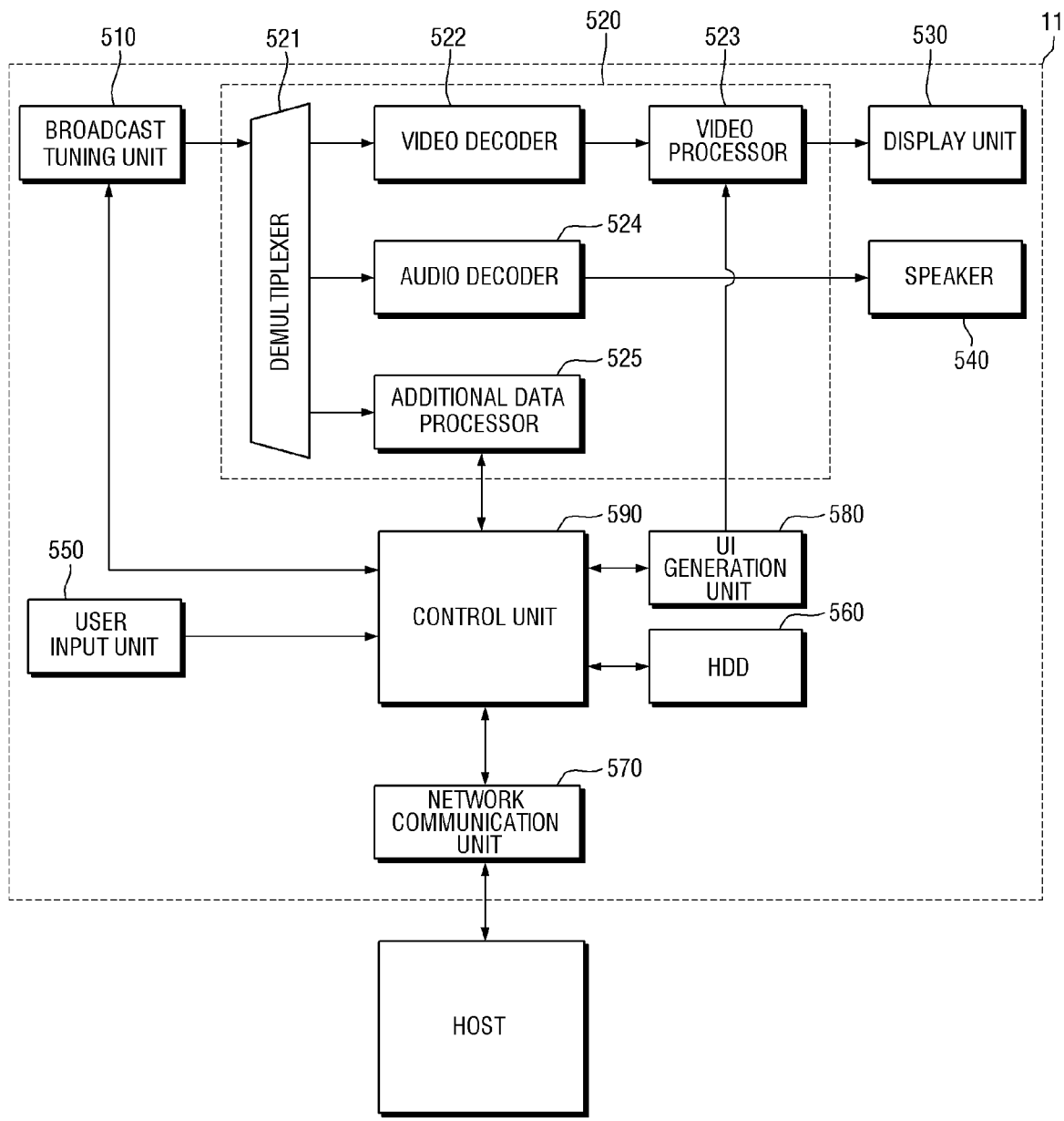
FIG. 6 is a block diagram showing the tile-shaped display device according to one or more embodiments.

FIG. 6 is a block diagram showing the tile-shaped display device according to one or more embodiments.

Referring to FIG. 6, the tile-shaped display device TD is connected to a host system HOST.

The host system HOST may be implemented as any one of a television system, a home theater system, a set-top box, a navigation system, a DVD player, a Blu-ray player, a personal computer (PC), a mobile phone system, and a tablet.

A user's command may be input to the host system HOST in various formats. For example, a command by a user's touch input may be input to the host system HOST. Alternatively, a user's command may be input to the host system HOST by a keyboard input or a button input of a remote controller.

The host system HOST may receive original video data corresponding to original images from an external device. The host system HOST may divide the original video data by the number of display devices. For example, the host system HOST may divide the original video data into first video data corresponding to a first image, second video data corresponding to a second image, third video data corresponding to a third image, and fourth video data corresponding to a fourth image corresponding to the first display device 11, the second display device 12, the third display device 13, and the fourth display device 14. The host system HOST may transmit the first video data to the first display device 11, transmit the second video data to the second display device 12, transmit the third video data to the third display device 13, and transmit the fourth video data to the fourth display device 14.

The first display device 11 may display the first image according to the first video data, the second display device 12 may display the second image according to the second video data, the third display device 13 may display the third image according to the third video data, and the fourth display device 14 may display the fourth image according to the fourth video data. Accordingly, the user may view the original image in which the first to fourth images displayed on the first to fourth display devices 11, 12, 13, and 14 are combined.

The first display device 11 may include a broadcast tuning unit 510, a signal processor 520, a display unit 530, a speaker 540, a user input unit 550, an HDD 560, a network communication unit 570, a UI generation unit 580, and a control unit 590.

The broadcast tuning unit 510 may receive a broadcast signal of the corresponding channel through an antenna by tuning a suitable channel frequency (e.g., a predetermined channel frequency) under the control of the control unit 590. The broadcast tuning unit 510 may include a channel detection module and an RF demodulation module.

The broadcast signal demodulated by the broadcast tuning unit 510 is processed by the signal processor 520 and output to the display unit 530 and the speaker 540. Here, the signal processor 520 may include a demultiplexer 521, a video decoder 522, a video processor 523, an audio decoder 524, and an additional data processor 525.

The demultiplexer 521 separates the demodulated broadcast signal into a video signal, an audio signal, and additional data. The separated video signal, audio signal, and additional data are restored by the video decoder 522, the audio decoder 524, and the additional data processor 525, respectively. At this point, the video decoder 522, the audio decoder 524, and the additional data processor 525 restore the video signal, the audio signal, and the additional data into a decoding format corresponding to an encoding format when the broadcast signal is transmitted.

In one or more embodiments, the decoded video signal is converted to meet a vertical frequency, resolution, an aspect ratio, etc. that meet the output standard of the display unit 530 by the video processor 523, and the decoded audio signal is output to the speaker 540.

The display unit 530 includes a display panel 100 (e.g., see FIG. 6) on which images are displayed and a panel driver configured to control the driving of the display panel 100. Because a specific block diagram of the display panel 100 and the panel driver are shown in FIG. 4 and the like, the overlapping description thereof will be omitted.

The user input unit 550 may receive a signal transmitted by the host system HOST. The user input unit 550 may be provided to allow the user to select commands related to communication with other display devices 12 to 14 as well as data related to the selection of channels and the selection and operation of a user interface (UI) menu transmitted by the host system HOST, and allow data for input to be input.

The HDD 560 may store various software programs including OS programs, recorded broadcast programs, moving images, photos, and other data, and may be formed of a storage medium such as a hard disk or a non-volatile memory.

The network communication unit 570 is used for short-distance communication with the host system HOST and other display devices 12 to 14, and may be implemented as a communication module including an antenna pattern capable of implementing mobile communication, data communication, Bluetooth, RF, Ethernet, etc.

The network communication unit 570 may also transmit and receive radio signals with at least one of a base station, an external terminal, and a server on a mobile communication network constructed according to technique standards or communication methods (e.g., global system for mobile communication (GSM), code division multi access (CDMA), code division multi access 2000 (CDMA2000), enhanced voice-data optimized or enhanced voice-data only (EV-DO), wideband CDMA (WCDMA), high speed downlink packet access (HSDPA), high speed uplink packet access (HSUPA), long term evolution (LTE), long term evolution-advanced (LTE-A), and 5G) for mobile communication through an antenna pattern to be described below.

The network communication unit 570 may also transmit and receive the radio signals in a communication network according to wireless Internet techniques through the antenna pattern to be described below. As the wireless Internet technique, there are, for example, wireless LAN (WLAN), wireless-fidelity (Wi-Fi), wireless fidelity (Wi-Fi) direct, digital living network alliance (DLNA), wireless broadband (WiBro), world interoperability for microwave access (WiMAX), high speed downlink packet access (HSDPA), high speed uplink packet access (HSUPA), long term evolution (LTE), long term evolution-advanced (LTE-A), etc., and the antenna pattern transmits and receives data according to at least one wireless Internet technique within a range including Internet techniques not listed above.

The UI generation unit 580 generates a UI menu for communication with the host system HOST and other display devices 12 to 14, and may be implemented by an algorithm code and an On-Screen-Display Integrated Circuit (OSD IC). The UI menu for communication with the host system HOST and other display devices 12 to 14 may be a menu for designating a counterpart digital TV that requires communication and selecting a desired function.

The control unit 590 is in charge of the overall control of the first display device 11 and is in charge of the communication control of the host system HOST and the second to fourth display devices 12, 13, and 14, may store the corresponding algorithm code for control, and may be implemented by a micro controller unit (MCU) in which the stored algorithm codes are executed.

The control unit 590 controls the corresponding control commands and data to be transmitted to the host system HOST and the second to fourth display devices 12, 13, and 14 through the network communication unit 570 according to the input and selection of the user input unit 550. Of course, when suitable control commands (e.g., predetermined control commands) and data are input from the host system HOST and the second to fourth display devices 12, 13, and 14, an operation is performed according to the corresponding control commands.

Because a block diagram of the second display device 12, a block diagram of the third display device 13, and a block diagram of the fourth display device 14 are substantially the same as the block diagram of the first display device 11 shown in FIG. 6, a description thereof will be omitted.

Next, a display device according to one or more embodiments will be described. For reference, the display device according to one or more embodiments may be provided as a part of the tile-shaped display device TD in FIG. 1. However, the display device according to one or more embodiments is not limited to being provided as a part of the tile-shaped display device TD, and may also be provided as a single device.

Figure 7:
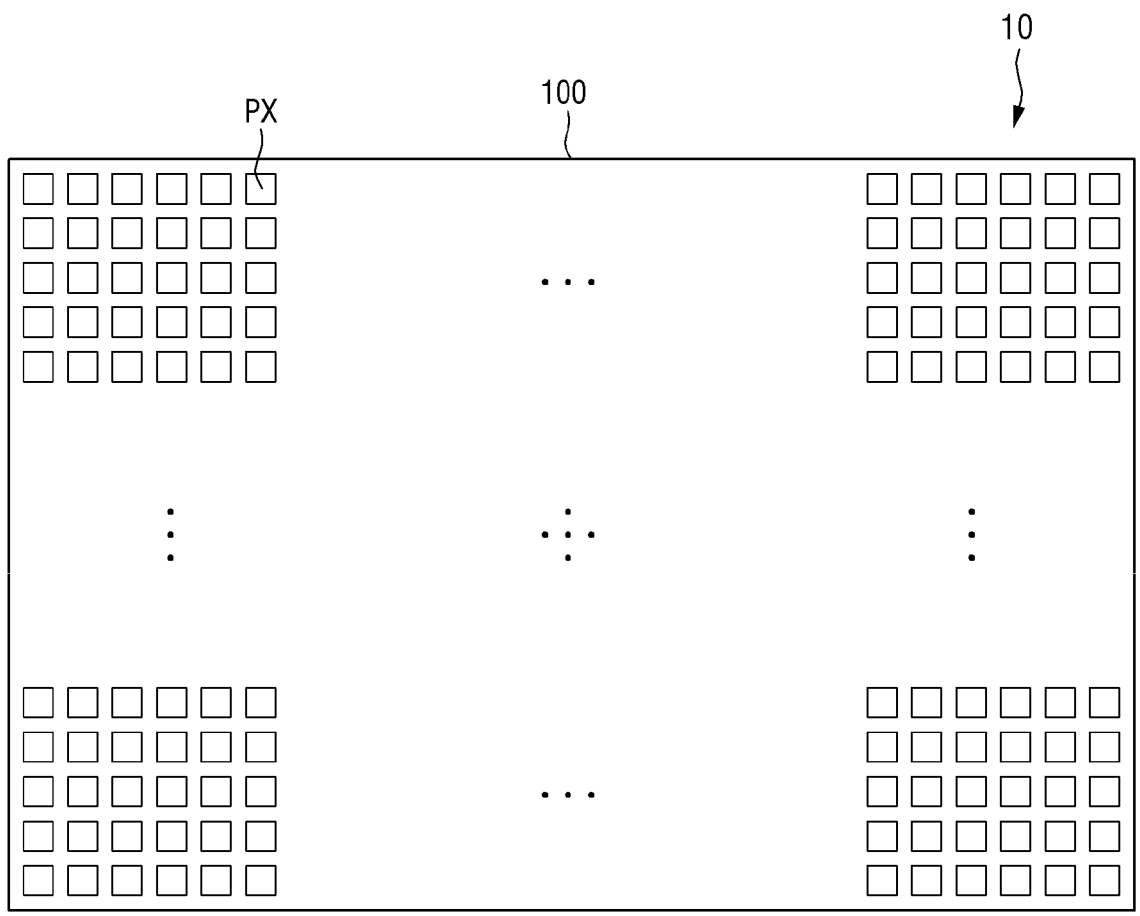
FIG. 7 is a plan view showing a display panel of a display device according to one or more embodiments.
Figure 8:
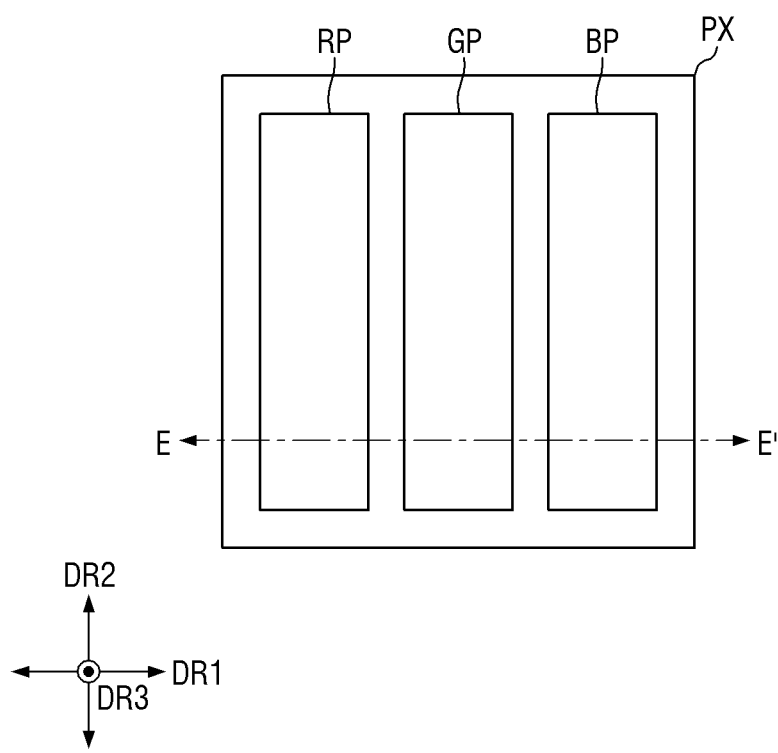
FIGS. 8 and 9 are views showing examples of pixels in FIG. 7.
Figure 9:
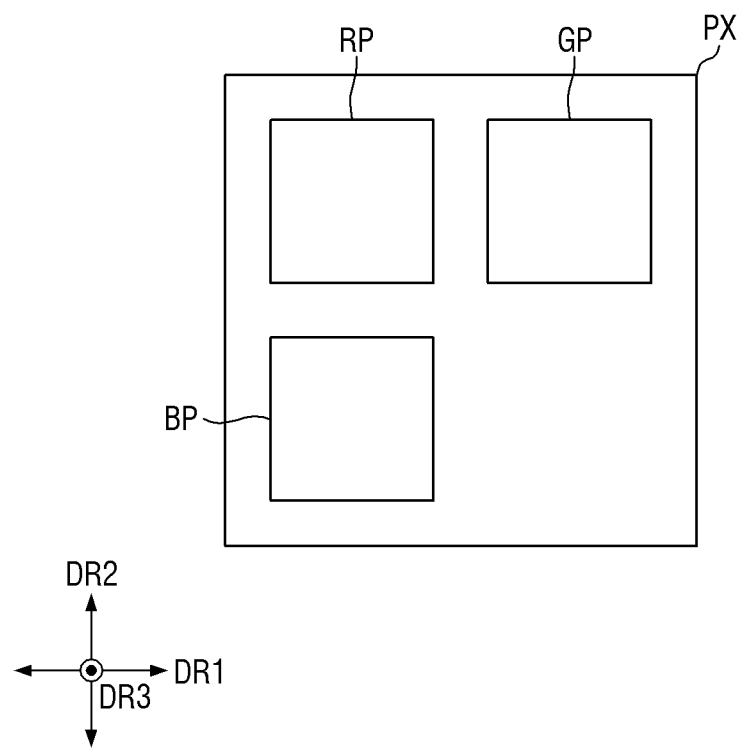

FIG. 7 is a plan view showing a display panel of a display device according to one or more embodiments. FIGS. 8 and 9 are views showing examples of pixels in

FIG. 7.

Referring to FIG. 7, the display device 10 includes a flat panel display panel 100, and the display panel 100 includes a plurality of pixels PX arranged in a matrix form along the first direction DR1 and the second direction DR2.

The display device 10 is a device configured to display moving images or still images, and may be used as display screens of various products such as a TV, a notebook, a monitor, a billboard, Internet of Things (I), etc. as well as portable electronic devices such as a mobile phone, a smart phone, a tablet personal computer, a smart watch, a watch phone, a mobile communication terminal, an electronic notebook, an e-book, a portable multimedia player (PMP), a navigation system, an ultra-mobile PC (UMPC), etc.

The display panel 100 may be formed as a rectangular plane having long sides in the first direction DR1 and short sides in the second direction DR2 crossing the first direction DR1. A corner where the long side of the first direction DR1 and the short side of the second direction DR2 meet may be formed to be rounded to have a suitable curvature (e.g., a predetermined curvature) or formed at a right angle. The planar shape of the display panel 100 is not limited to a quadrangle, and may be formed in other polygons, circles, or ovals. The display panel 100 may be formed to be flat but is not limited thereto. For example, the display panel 100 may include curved portions formed at left and right ends and having a constant curvature or a varying curvature. In addition, the display panel 100 may be flexibly formed to be curved, bent, folded, or rolled.

As shown in FIGS. 8 and 9, each of the plurality of pixels PX may include a plurality of sub-pixels RP, GP, and BP. FIGS. 8 and 9 show an example in which each of the plurality of pixels includes three sub-pixels RP, GP, and BP corresponds to different colors, that is, a first sub-pixel RP, a second sub-pixel GP, and a third sub-pixel BP, but embodiments of the present specification are not limited thereto.

Each of the first sub-pixel RP, the second sub-pixel GP, and the third sub-pixel BP may have a planar shape of a rectangular, a square, or a rhombus.

For example, as shown in FIG. 8, each of the first sub-pixel RP, the second sub-pixel GP, and the third sub-pixel BP may have a rectangular shape having short sides in the first direction DR1 and long sides in the second direction DR2. In addition, the first sub-pixel RP, the second sub-pixel GP, and the third sub-pixel BP may be arranged along the first direction DR1.

Alternatively, as shown in FIG. 9, each of the first sub-pixel RP, the second sub-pixel GP, and the third sub-pixel BP may have a square or rhombus shape including sides having the same lengths in the first direction DR1 and the second direction DR2.

Any one of the second sub-pixel GP and the third sub-pixel BP, and the first sub-pixel RP may be arranged in the first direction DR1, and the other one and the first sub-pixel RP may be arranged along the second direction DR2.

For example, the first sub-pixel RP and the second sub-pixel GP may be arranged along the first direction DR1, and the first sub-pixel RP and the third sub-pixel BP may be arranged along the second direction DR2.

As another example, one of the first sub-pixel RP and the third sub-pixel BP, and the second sub-pixel GP may be arranged along the first direction DR1, and the other one and the second sub-pixel GP may be arranged along the second direction DR2. Alternatively, any one of the first sub-pixel RP and the second sub-pixel GP, and the third sub-pixel BP may be arranged along the first direction DR1, and the other one and the third sub-pixel BP may be arranged along the second direction DR2.

The first sub-pixel RP may emit first light, the second sub-pixel GP may emit second light having a color different from that of the first light, and the third sub-pixel BP may emit third light having a color different from those of the first light and the second light.

For example, the first light may be light of a red wavelength band, the second light may be light of a green wavelength band, and the third light may be light of a blue wavelength band. Here, the red wavelength band may be a wavelength band of about 600 nm to 750 nm, the green wavelength band may be a wavelength band of about 480 nm to 560 nm, and the blue wavelength band may be a wavelength band of about 370 nm to 460 nm, but embodiments of the present specification are not limited thereto.

Each of the first sub-pixel RP, the second sub-pixel GP, and the third sub-pixel BP may include an inorganic light emitting element having an inorganic semiconductor as a light emitting element configured to emit light. For example, the inorganic light emitting element may be a flip chip type micro light emitting diode (LED), but embodiments of the present specification are not limited thereto.

An area of the first sub-pixel RP, an area of the second sub-pixel GP, and an area of the third sub-pixel BP may be substantially the same, but one or more embodiments are not limited thereto.

For example, at least one of the area of the first sub-pixel RP, the area of the second sub-pixel GP, and the area of the third sub-pixel BP may be different from another one.

In other words, any two of the area of the first sub-pixel RP, the area of the second sub-pixel GP, and the area of the third sub-pixel BP are substantially the same, and the remaining one may be different from the two. Alternatively, the area of the first sub-pixel RP, the area of the second sub-pixel GP, and the area of the third sub-pixel BP may be different from each other.

Figure 10:
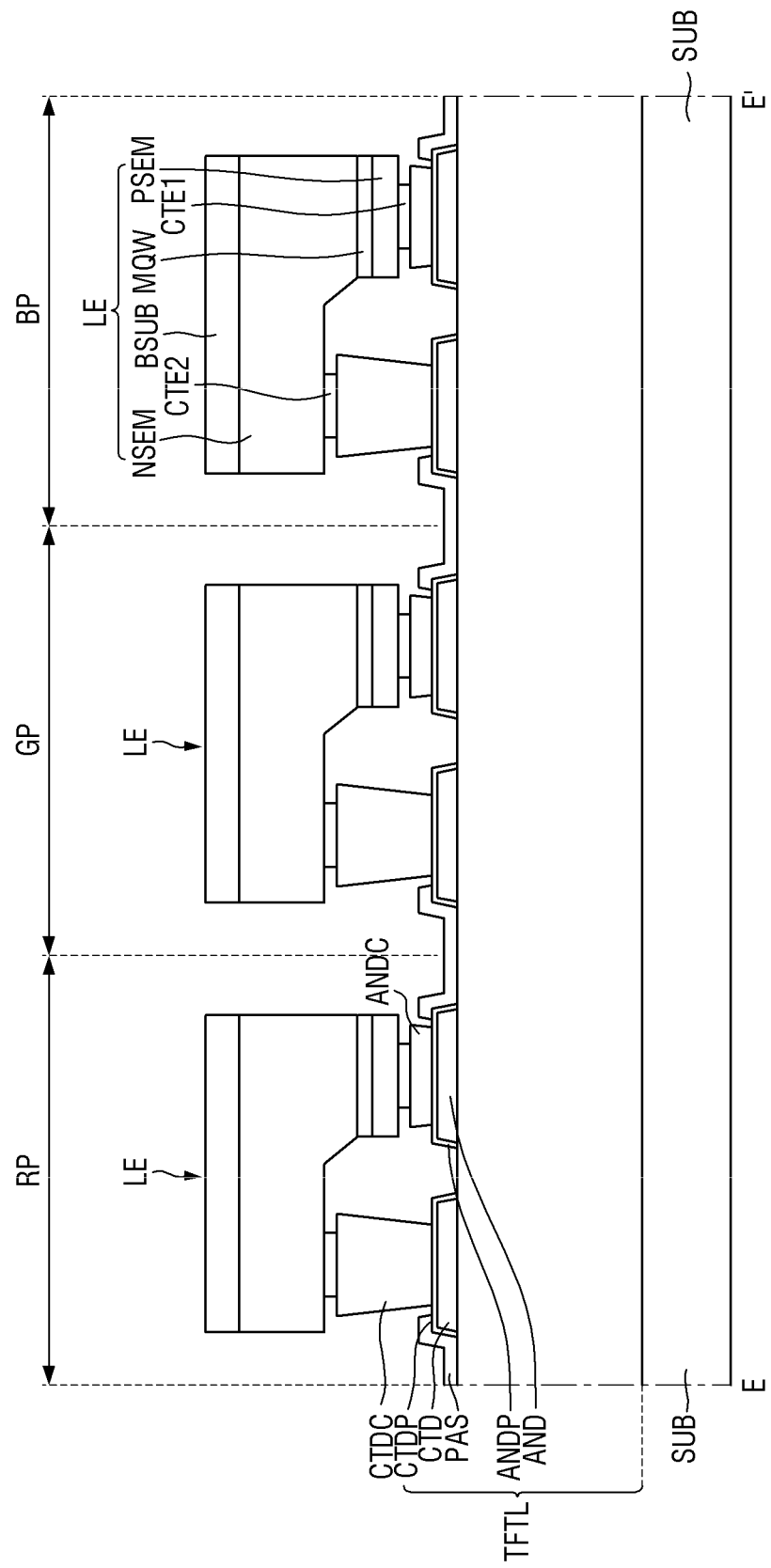
FIG. 10 is a cross-sectional view showing one example of a surface taken along the line E-E' in FIG. 8.

FIG. 10 is a cross-sectional view showing one example of a surface taken along the line E-E' in FIG. 8.

Referring to FIG. 10, the display device 10 may include a substrate SUB, a transistor array layer TFTL disposed on the substrate SUB, and a plurality of light emitting elements LE disposed on the transistor array layer TFTL.

The substrate SUB may be a member configured to support the transistor array layer TFTL and the plurality of light emitting elements LE.

The substrate SUB may be a rigid substrate made of a glass material.

Alternatively, the substrate SUB may be a flexible substrate capable of bending, folding, rolling, etc. In this case, the substrate SUB may include an insulating material of a polymer resin such as polyimide (PI).

The transistor array layer TFTL may include anode electrodes AND, cathode electrodes CTD, anode pads ANDP, and cathode pads CTDP.

An anode contact electrode ANDC may be disposed between the anode pad ANDP and the light emitting element LE, and a cathode contact electrode CTDC may be disposed between the cathode pad CTDP and the light emitting element LE.

Each of the plurality of light emitting elements LE may include a base substrate BPUB, an n-type semiconductor NSEM, an active layer MQW, a p-type semiconductor PSEM, a first contact electrode CTE1, and a second contact electrode CTE2.

The base substrate BSUB may be a sapphire substrate, but one or more embodiments are not limited thereto.

The n-type semiconductor NSEM may be disposed on one surface of the base substrate BSUB. For example, the n-type semiconductor NSEM may be disposed on a lower surface of the base substrate BSUB.

The n-type semiconductor (NSEM) may be made of GaN doped with an n-type conductive dopant such as Si, Ge, or Sn.

The active layer MQW may be disposed on a part of the n-type semiconductor NSEM.

The active layer MQW may include a material having a single or multiple quantum well structure. When the active layer MQW includes a material of a multiple quantum well structure, the active layer MQW may also have a structure in which a plurality of well layers and barrier layers are alternately stacked. At this point, the well layer may be made of InGaN, and the barrier layer may be made of GaN or AlGaN, but one or more embodiments are not limited thereto.

Alternatively, the active layer MQW may also have a structure in which semiconductor materials having large band gap energy and semiconductor materials having small band gap energy are alternately stacked, and may also include other Group III to Group V semiconductor materials according to the wavelength band of the light to be emitted.

The p-type semiconductor PSEM may be disposed on the active layer MQW. The p-type semiconductor PSEM may be made of GaN doped with a p-type conductive dopant such as Mg, Zn, Ca, Se, or Ba.

The first contact electrode CTE1 may be disposed on the p-type semiconductor PSEM.

The second contact electrode CTE2 may be disposed at the other portion other than the part of the n-type semiconductor NSEM on which the active layer MQW is disposed. The other portion of the n-type semiconductor NSEM on which the second contact electrode CTE2 is disposed may be disposed to be spaced from a part of one surface of the n-type semiconductor NSEM on which the active layer MQW is disposed.

The first contact electrode CTE1 and the anode electrode AND may be bonded to each other through the anode contact electrode ANDC.

The second contact electrode CTE2 and the cathode electrode CTD may be bonded to each other through the cathode contact electrode CTDC.

The anode contact electrode ANDC and the cathode contact electrode CTDC may be a conductive adhesive member such as an anisotropic conductive film (ACF) or an anisotropic conductive paste (ACP).

Alternatively, the light emitting element LE may not include the anode contact electrode ANDC and the cathode contact electrode CTDC. In this case, the bonding may be performed between the first contact electrode CTE1 and the anode electrode AND and between the second contact electrode CTE2 and the cathode electrode CTD through a soldering process.

The light emitting element LE may be a flip chip type micro-LED.

The flip chip-type light emitting element LE includes the first contact electrode CTE1 disposed on the p-type semiconductor PSEM and the second contact electrode CTE2 disposed on the n-type semiconductor NSEM exposed by removing parts of the active layer MQW and the p-type semiconductor PSEM. In other words, the flip chip-type light emitting element LE has a mesa structure in which the first contact electrode CTE1 protrudes more than the second contact electrode CTE2.

Each of the first sub-pixel RP, the second sub-pixel GP, and the third sub-pixel BP includes the light emitting element LE connected to the anode electrode AND and the cathode electrode CTD. The anode electrode AND may be referred to as a pixel electrode because it corresponds to each of the plurality of sub-pixels RP, GP, and BP. In addition, the cathode electrode CTD may be referred to as a common electrode because it commonly corresponds to the plurality of sub-pixels RP, GP, and BP.

The anode electrodes AND and the cathode electrodes CTD may include a metallic material having a high reflectance such as a stacked structure of aluminum and titanium (Ti/Al/Ti), a stacked structure of aluminum and ITO (ITO/Al/ITO), an APC alloy, and a stacked structure of an APC alloy and ITO (ITO/APC/ITO). The APC alloy is an alloy of silver (Ag), palladium (Pd), and copper (Cu).

In the light emitting element LE, each of a length in the first direction DR1, a length in the second direction DR2, and a length in a third direction DR3 may be several to several hundreds of μm. For example, each of the lengths of the light emitting element LE in the first direction DR1, the second direction DR2, and the third direction DR3 may be about 100 μm or less.

The light emitting elements LE may be grown and formed on a semiconductor substrate such as a silicon wafer. Each of the light emitting elements LE may be directly transferred to the anode pad ANDP and the cathode pad CTDP of the substrate SUB from the silicon wafer. Alternatively, each of the light emitting elements LE may be transferred to the anode pad ANDP and the cathode pad CTDP of the substrate SUB through an electrostatic method using an electrostatic head or a stamp method using an elastic polymer material such as PDMS or silicon as a transfer substrate.

The display panel 100 may further include a passivation layer PAS covering an edge of each of the anode pad ANDP and the cathode pad CTDP.

For example, the passivation layer PAS may be made of an inorganic film such as a silicon nitride layer, a silicon oxynitride layer, a silicon oxide layer, a titanium oxide layer, and an aluminum oxide layer.

Figure 11:
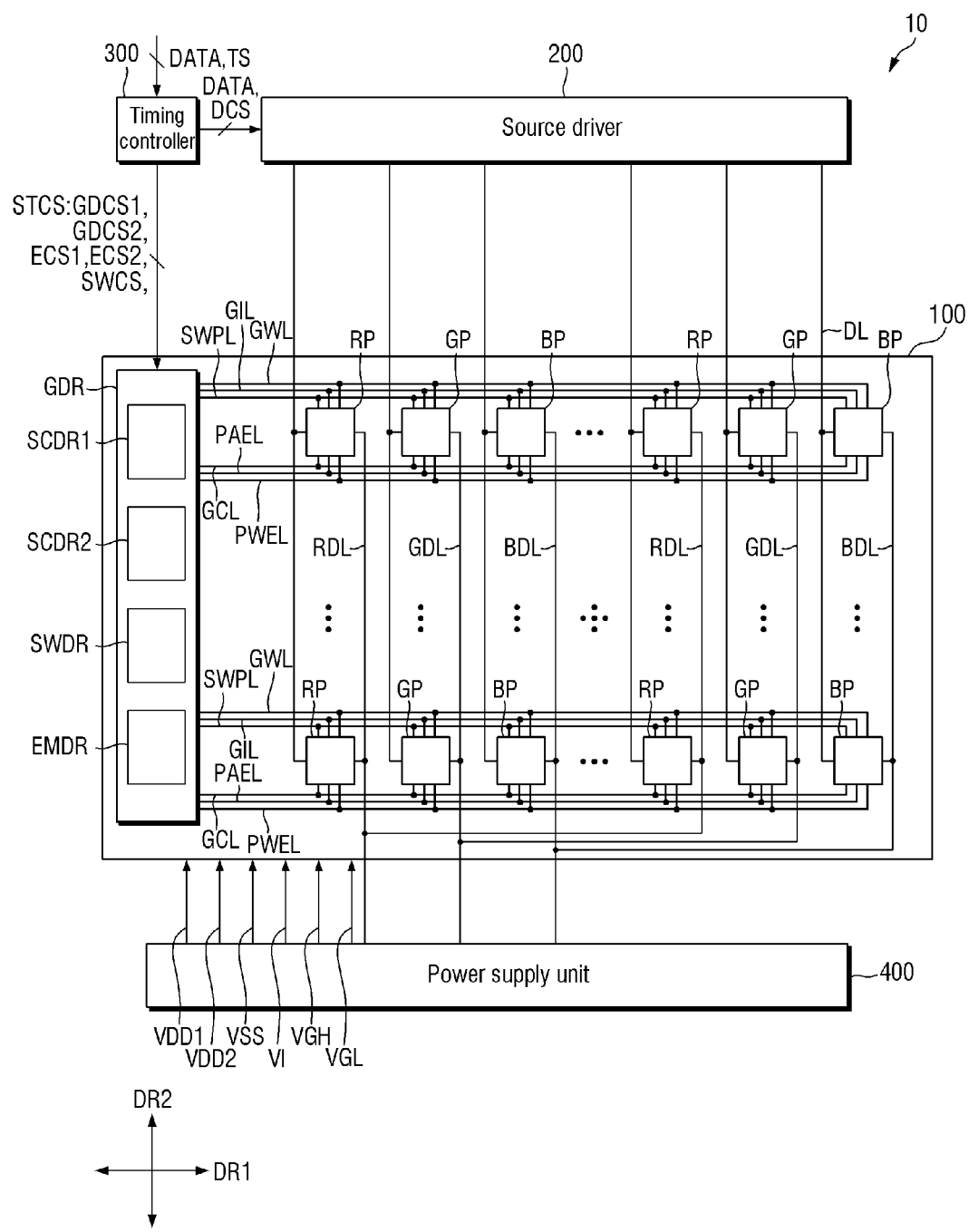
FIG. 11 is a block diagram showing any one of display devices in FIG. 1.

FIG. 11 is a block diagram showing any one of display devices in FIG. 1.

Referring to FIG. 11, the display device 10 according to one or more embodiments may include a display panel 100, a gate driver GDR, a source driver 200, a timing controller 300, and a power supply unit 400.

The display panel 100 may include sub-pixels RP, GP, and BP configured to emit each light for displaying images, and gate lines, data lines, and voltage lines that are connected to the sub-pixels RP, GP, and BP.

The gate lines may extend in the first direction DR1, and include scan write lines GWL, scan initialization lines GIL, scan control lines GCL, sweep signal lines SWPL, pulse width modulation (PWM) light emitting lines PWEL, and pulse amplitude modulation (PAM) light emitting lines PAEL.

The data lines may extend in the second direction DR2, and include PWM data lines DL, first PAM data lines RDL, second PAM data lines GDL, and third PAM data lines BDL. The first PAM data lines RDL may be electrically connected to each other, the second PAM data lines GDL may be electrically connected to each other, and the third PAM data lines BDL may be electrically connected to each other.

The voltage lines may correspond to each of a first power supply voltage VDD1, a second power supply voltage VDD2, a third power supply voltage VSS, an initialization voltage VI, and gate level voltages VGH, VGL.

The sub-pixels RP, GP, and BP may include a first sub-pixels RP configured to emit first light, a second sub-pixels GP configured to emit second light, and a third sub-pixels BP configured to emit third light. The first light indicates light of a red wavelength band, the second light indicates light of a green wavelength band, and the third light indicates light of a blue wavelength band. For example, a main peak wavelength of the first light may be located between about 600 nm and 750 nm, a main peak wavelength of the second light may be located between about 480 nm and 560 nm, and a main peak wavelength of the third light may be located between about 370 nm and 460 nm.

Each of the sub-pixels RP, GP, and BP may be connected to any one of the scan write lines GWL, any one of the scan initialization lines GIL, any one of the scan control lines GCL, any one of the sweep signal lines SWL, any one of the PWM light emitting lines PWEL, and any one of the PAM light emitting lines PAEL. In addition, each of the first sub-pixels RP may be connected to any one of the PWM data lines DL and any one of the first PAM data lines RDL. In addition, each of the second sub-pixels GP may be connected to any one of the PWM data lines DL and any one of the second PAM data lines GDL. In addition, each of the third sub-pixels BP may be connected to any one of the PWM data lines DL and any one of the third PAM data lines BDL.

The display panel 100 may include the gate driver GDR configured to apply each signal to the gate lines including the scan write lines GWL, the scan initialization lines GIL, the scan control lines GCL, the sweep signal lines SPWL, the PWM light emitting lines PWEL, and the PAM light emitting lines PAEL. FIG. 11 shows that the gate driver GDR is disposed at the edge of one side of the display panel 100 in the first direction DR1 for convenience of description, but a plurality of gate drivers GDR according to one or more embodiments, which are separately disposed to be spaced from each other between the sub-pixels RP, GP, and BP in the first direction DR1, may be provided.

The gate driver GDR may include a first scan signal driver SCDR1, a second scan signal driver SCDR2, a sweep signal driver SWDR, and a light emitting signal driver EMDR.

The first scan signal driver SCDR1 may output scan initialization signals to the scan initialization lines GIL according to a first scan drive control signal GDCS1 input from the timing controller 300, and output scan write signals to the scan write lines GWL. In other words, the first scan signal driver SCDR1 may output the scan initialization signals and the scan write signals.

The second scan signal driver SCDR2 may output scan control signals to the scan control lines GCL according to a second scan drive control signal GDCS2 input from the timing controller 300.

The sweep signal driver SWDR may receive a first light emitting control signal ECS1 and a sweep control signal SWCS from the timing controller 300.

The sweep signal driver SWDR may output PWM light emitting signals to the PWM light emitting lines PWEL according to the first light emitting control signal ECS1 and output sweep signals to the sweep signal lines SWPL according to the sweep control signal SWCS. In other words, the sweep signal driver SWDR may output the PWM light emitting signals and the sweep signals.

The light emitting signal driver EMDR may output PAM light emitting signals to the PAM light emitting lines PAEL according to a second light emitting control signal ECS2 input from the timing controller 300.

The timing controller 300 receives digital video data DATA and timing signals TS. The timing controller 300 may generate a scan timing control signal STCS for controlling an operation timing of the gate driver GDR according to the timing signals TS. The scan timing control signal STCS may generate the first scan drive control signal GDCS1, the second scan drive control signal GDCS2, the first light emitting control signal ECS1, the second light emitting control signal ECS2, and the sweep control signal SWCS. In addition, the timing controller 300 may generate a source control signal DCS for controlling the operation timing of the source driver 200.

The timing controller 300 outputs the first scan drive control signal GDCS1, the second scan drive control signal GDCS2, the first light emitting control signal ECS1, the second light emitting control signal ECS2, and the sweep control signal SWCS to the gate driver GDR. The timing controller 300 outputs the digital video data DATA and the source control signal DCS to the source driver 200.

The source driver 200 converts the digital video data DATA into analog PWM data voltages to output the analog PWM data voltages to the PWM data lines DL. Accordingly, the sub-pixels RP, GP, and BP are selected by the scan write signals of the gate driver GDR, and the PWM data voltages may be supplied to the selected sub-pixels RP, GP, and BP.

In addition, as described above with reference to FIG. 5, the source driver 200 may be implemented as an integrated circuit chip of the source drive circuit mounted on the flexible film FPCB disposed under the second surface of the substrate SUB.

The power supply unit 400 may commonly output a first PAM data voltage to the first PAM data lines RDL, commonly output a second PAM data voltage to the second PAM data lines GDL, and commonly output a third PAM data voltage to the third PAM data lines BDL. In addition, the power supply unit 400 may generate a plurality of voltages to output the voltages to the display panel 100.

The power supply unit 400 may output a first power supply voltage VDD1, a second power supply voltage VDD2, a third power supply voltage VSS, an initialization voltage VINT, and gate level voltages VGL and VGH to the display panel 100. The first power supply voltage VDD1 and the second power supply voltage VDD2 may be high potential drive voltages for driving the light emitting elements of each of the sub-pixels RP, GP, and BP. The third power supply voltage VSS may be a low potential drive voltage for driving the light emitting elements of each of the sub-pixels RP, GP, and BP. The initialization voltage VINT may be applied to each of the sub-pixels RP, GP, and BP, and the gate level voltages VGL and VGH may be applied to the gate driver GDR.

Each of the source driver 200, the timing controller 300, and the power supply unit 400 may be formed of an integrated circuit. In addition, the source driver 200 may be formed of a plurality of integrated circuits.

These integrated circuits may be mounted on the flexible film (FPCB in FIG. 5) disposed under the second surface of the substrate SUB.

Figure 12:
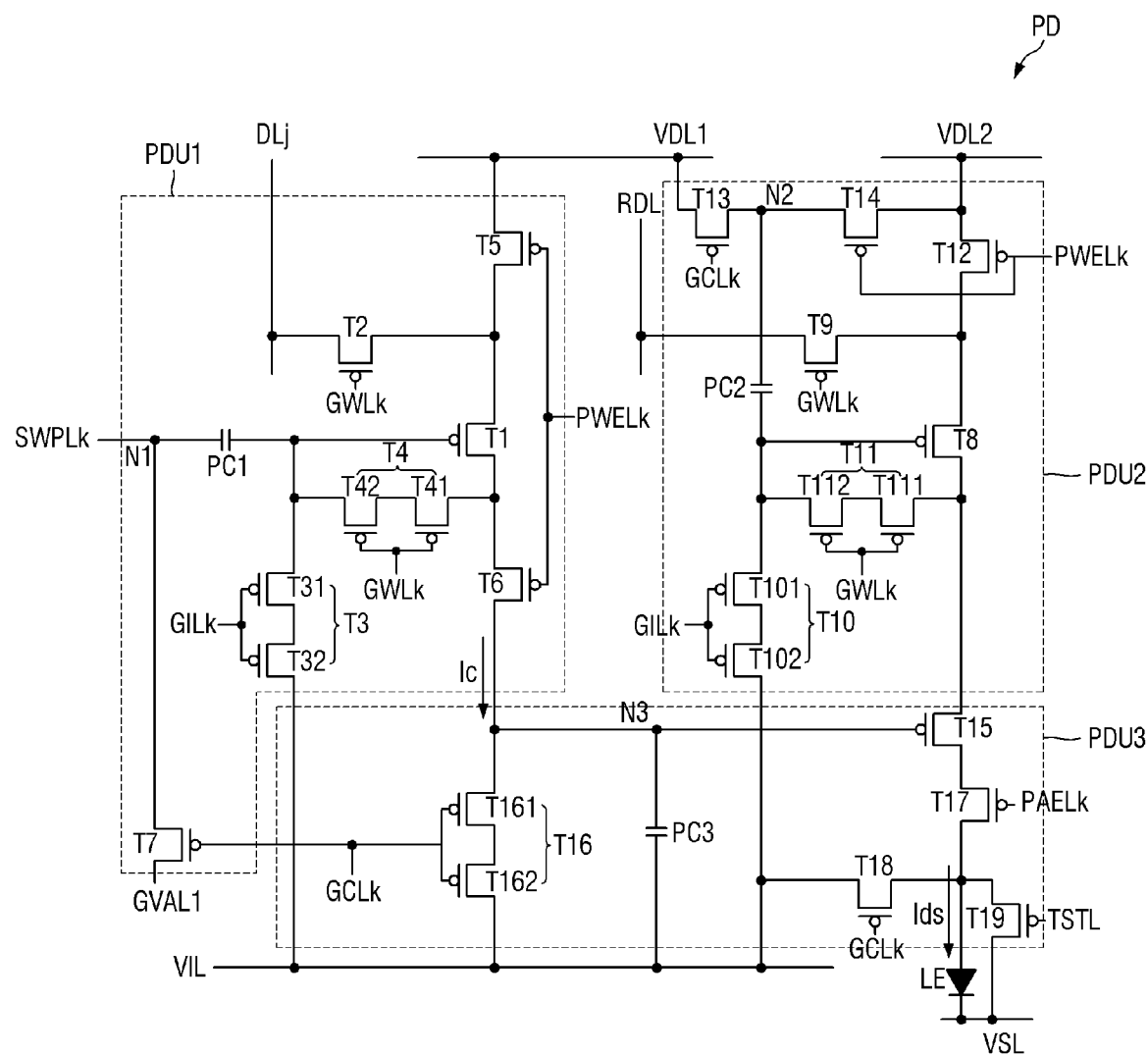
FIG. 12 is a circuit diagram showing one example of any one pixel driver from among a plurality of sub-pixels in FIG. 11.

FIG. 12 is a circuit diagram showing one example of any one pixel driver from among the plurality of sub-pixels in FIG. 11.

Referring to FIG. 12, a pixel driver PD of any one of the plurality of sub-pixels RP, GP, and BP provided in the display panel 100 according to one embodiment may be connected to a kth scan write line GWLk (k is a positive integer), a kth scan initialization line GILk, a kth scan control line GCLk, a kth sweep signal line SWPLk, a kth PWM light emitting line PWELk, and a kth PAM light emitting line PAELk. In addition, the pixel driver PD may be connected to a jth PWM data line DLj and the first PAM data line RDL. In addition, the pixel driver PD may be connected to a first power supply line VDL1 to which the first power supply voltage VDD1 is applied, a second power supply line VDL2 to which the second power supply voltage VDD2 is applied, a third power supply line VSL to which the third power supply voltage VSS is applied, an initialization voltage line VIL to which the initialization voltage VINT is applied, and a first gate voltage auxiliary line GVAL1 to which a first gate level voltage VGH is applied.

In one or more embodiments, for convenience of description, the jth PWM data line DLj may be referred to as a first data line, and the first PAM data line RDL may be referred to as a second data line.

The pixel driver PD may include a light emitting element EL, a first pixel drive circuit unit PDU1, a second pixel drive circuit unit PDU2, and a third pixel drive circuit unit PDU3.

The first pixel drive circuit unit PDU1, the second pixel drive circuit unit PDU2, and the third pixel drive circuit unit PDU3 may be interconnected, and the light emitting element LE may emit light based on a drive current Ids generated by the second pixel drive circuit unit PDU2.

The light emitting element LE may be disposed between a seventeenth transistor T17 and the third power supply line VSL.

A first electrode of the light emitting element LE may be connected to a second electrode of the seventeenth transistor T17, and a second electrode of the light emitting element LE may be connected to the third power supply line VSL.

The first electrode of the light emitting element LE may be an anode electrode (i.e., a pixel electrode), and the second electrode of the light emitting element LE may be a cathode electrode (i.e., a common electrode).

The light emitting element LE may be an inorganic light emitting element including the first electrode, the second electrode, and an inorganic semiconductor disposed between the first electrode and the second electrode. For example, the light emitting element LE may be a micro light emitting diode formed of an inorganic semiconductor but is not limited thereto.

The first pixel drive circuit unit PDU1 generates a control current Ic according to a jth PWM data voltage of the jth PWM data line DLj to control a voltage of a third node N3 of the third pixel drive circuit unit PDU3. Because a pulse width of the drive current Ids flowing through the light emitting element LE may be adjusted by the control current Ic of the first pixel drive circuit unit PDU1, the first pixel drive circuit unit PDU1 may be a pulse width modulation unit (PWM unit) configured to perform the pulse width modulation of the drive current Ids flowing through the light emitting element EL.

The first pixel drive circuit unit PDU1 may include first to seventh transistors T1 to T7 and a first capacitor C1.

The first transistor T1 controls the control current Ic flowing between a second electrode and a first electrode of the first transistor T1 according to the PWM data voltage applied to a gate electrode.

The second transistor T2 is turned on by a kth scan write signal of the kth scan write line GWLk to supply the PWM data voltage of the jth PWM data line DLj to the first electrode of the first transistor T1. A gate electrode of the second transistor T2 may be connected to the kth scan write line GWLk, a first electrode may be connected to the jth PWM data line DLj, and a second electrode may be connected to the first electrode of the first transistor T1.

The third transistor T3 is turned on by a kth scan initialization signal of the kth scan initialization line GILk to connect the initialization voltage line VIL to the gate electrode of the first transistor T1. Accordingly, during a period in which the third transistor T3 is turned on, the gate electrode of the first transistor T1 may be discharged to the initialization voltage VINT of the initialization voltage line VIL.

At this point, a second gate level voltage VGL of the kth scan initialization signal may be different from the initialization voltage VINT of the initialization voltage line VIL. In particular, because a difference voltage between the second gate level voltage VGL and the initialization voltage VINT is greater than a threshold voltage of the third transistor T3, the third transistor T3 may be stably turned on even after the initialization voltage VINT is applied to the gate electrode of the first transistor T1. Accordingly, when the third transistor T3 is turned on, the initialization voltage VINT may be stably applied to the gate electrode of the first transistor T1 regardless of the threshold voltage of the third transistor T3.

The third transistor T3 may include a plurality of transistors connected in series. For example, the third transistor T3 may include a first sub-transistor T31 and a second sub-transistor T32. Accordingly, a voltage of the gate electrode of the first transistor T1 may be prevented from leaking through the third transistor T3. A gate electrode of the first sub-transistor T31 may be connected to the kth scan initialization line GILk, a first electrode thereof may be connected to the gate electrode of the first transistor T1, and a second electrode thereof may be connected to a first electrode of the second sub-transistor T32. A gate electrode of the second sub-transistor T32 may be connected to the kth scan initialization line GILk, the first electrode thereof may be connected to the second electrode of the first sub-transistor T31, and a second electrode thereof may be connected to the initialization voltage line VIL.

The fourth transistor T4 is turned on by the kth scan write signal of the kth scan write line GWLk to connect the gate electrode and the second electrode of the first transistor T1. Accordingly, during a period in which the fourth transistor T4 is turned on, the first transistor T1 may operate as a diode (e.g., the first transistor T1 may be diode-connected).

The fourth transistor T4 may include a plurality of transistors connected in series. For example, the fourth transistor T4 may include a third sub-transistor T41 and a fourth sub-transistor T42. Accordingly, the voltage of the gate electrode of the first transistor T1 may be prevented from leaking through the fourth transistor T4. A gate electrode of the third sub-transistor T41 may be connected to the kth scan write line GWLk, a first electrode thereof may be connected to the second electrode of the first transistor T1, and a second electrode thereof may be connected to a first electrode of the fourth sub-transistor T42. A gate electrode of the fourth sub-transistor T42 may be connected to the kth scan write line GWLk, the first electrode thereof may be connected to the second electrode of the third sub-transistor T41, and a second electrode thereof may be connected to the gate electrode of the first transistor T1.

The fifth transistor T5 is turned on by a kth PWM light emitting signal of the kth PWM light emitting line PWELk to connect the first electrode of the first transistor T1 to the first power supply line VDL1. A gate electrode of the fifth transistor T5 may be connected to the kth PWM light emitting line PWELk, a first electrode thereof may be connected to the first power supply line VDL1, and a second electrode thereof may be connected to the first electrode of the first transistor T1.

The sixth transistor T6 is turned on by the kth PWM light emitting signal of the kth PWM light emitting line PWELk to connect the second electrode of the first transistor T1 to the third node N3 of the third pixel drive circuit unit PDU3. A gate electrode of the sixth transistor T6 may be connected to the kth PWM light emitting line PWELk, a first electrode thereof may be connected to the second electrode of the first transistor T1, and a second electrode thereof may be connected to the third node N3 of the third pixel drive circuit unit PDU3.

The seventh transistor T7 may be turned on by a kth scan control signal of the kth scan control line GCLk to supply the first gate level voltage VGH of the first gate voltage auxiliary line GVAL1 to a first node N1 connected to the kth sweep signal line SWPLk. Accordingly, during a period in which the initialization voltage VINT is applied to the gate electrode of the first transistor T1 and a period in which the PWM data voltage of the jth PWM data line DLj and a threshold voltage Vth1 of the first transistor T1 are programmed, it is possible to prevent the voltage change of the gate electrode of the first transistor T1 from being reflected to the kth sweep signal of the kth sweep signal line SWPLk by the first capacitor PC1. A gate electrode of the seventh transistor T7 may be connected to the kth scan control line GCLk, a first electrode thereof may be connected to the first gate voltage auxiliary line GVAL1, and a second electrode thereof may be connected to the first node N1.

The first capacitor PC1 may be disposed between the gate electrode of the first transistor T1 and the first node N1. One electrode of the first capacitor C1 may be connected to the gate electrode of the first transistor T1, and the other electrode thereof may be connected to the first node N1.

The first node N1 may be a contact point between the kth sweep signal line SWPLk, the second electrode of the seventh transistor T7, and the other electrode of the first capacitor C1.

The second pixel drive circuit unit PDU2 generates the drive current Ids applied to the light emitting element LE according to the first PAM data voltage of the first PAM data line RDL. The second pixel drive circuit unit PDU2 may be a pulse amplitude modulation unit (PAM unit) configured to perform pulse amplitude modulation. The second pixel drive circuit unit PDU2 may be a constant current generation unit configured to generate a constant drive current Ids according to the first PAM data voltage.

In addition, the second pixel drive circuit unit PDU2 of each of the first sub-pixels RP may receive the same first PAM data voltage regardless of the luminance of the first sub-pixel RP to generate the same drive current Ids. Likewise, the second pixel drive circuit unit PDU2 of each of the second sub-pixels GP may receive the same second PAM data voltage regardless of the luminance of the second sub-pixel GP to generate the same drive current Ids. The third pixel drive circuit unit PDU3 of each of the third sub-pixels BP may receive the same third PAM data voltage regardless of the luminance of the third sub-pixel BP to generate the same drive current Ids.

The second pixel drive circuit unit PDU2 may include eighth to fourteenth transistors T8 to T14 and a second capacitor PC2.

The eighth transistor T8 controls the drive current Ids flowing to the light emitting element LE according to a voltage applied to a gate electrode.

The ninth transistor T9 is turned on by the kth scan write signal of the kth scan write line GWLk to supply the first PAM data voltage of the first PAM data line RDL to a first electrode of the eighth transistor T8. The gate electrode of the ninth transistor T9 may be connected to the kth scan write line GWLk, the first electrode thereof may be connected to the first PAM data line RDL, and a second electrode thereof may be connected to the first electrode of the eighth transistor T8.

The tenth transistor T10 is turned on by the kth scan initialization signal of the kth scan initialization line GILk to connect the initialization voltage line VIL to the gate electrode of the eighth transistor T8. Accordingly, during a period in which the transistor T10 is turned on, the gate electrode of the eighth transistor T8 may be discharged to the initialization voltage VINT of the initialization voltage line VIL. At this time, the second gate level voltage VGL of the kth scan initialization signal may be different from the initialization voltage VINT of the initialization voltage line VIL. In particular, because a difference voltage between the second gate level voltage VGL and the initialization voltage VINT is greater than a threshold voltage of the tenth transistor T10, the tenth transistor T10 may be stably turned on even after the initialization voltage VINT is applied to the gate electrode of the eighth transistor T8. Accordingly, when the tenth transistor T10 is turned on, the initialization voltage VINT may be stably applied to the gate electrode of the eighth transistor T8 regardless of the threshold voltage of the tenth transistor T10.

The tenth transistor T10 may include a plurality of transistors connected in series. For example, the tenth transistor T10 may include a fifth sub-transistor T101 and a sixth sub-transistor T102. Accordingly, a voltage of the gate electrode of the eighth transistor T8 may be prevented from leaking through the tenth transistor T10. A gate electrode of the fifth sub-transistor T101 may be connected to the kth scan initialization line GILk, a first electrode thereof may be connected to the gate electrode of the eighth transistor T8, and a second electrode thereof may be connected to a first electrode of the sixth sub-transistor T102. A gate electrode of the sixth sub-transistor T102 may be connected to the kth scan initialization line GILk, the first electrode thereof may be connected to the second electrode of the fifth sub-transistor T101, and a second electrode thereof may be connected to the initialization voltage line VIL.

The eleventh transistor T11 is turned on by the kth scan write signal of the kth scan write line GWLk to connect the gate electrode and the second electrode of the eighth transistor T8. Accordingly, during a period in which the eleventh transistor T11 is turned on, the eighth transistor T8 may operate as a diode (e.g., eighth transistor may be diode-connected).

The eleventh transistor T11 may include a plurality of transistors connected in series. For example, the eleventh transistor T11 may include a seventh sub-transistor T111 and an eighth sub-transistor T112. Accordingly, the voltage of the gate electrode of the eighth transistor T8 may be prevented from leaking through the eleventh transistor T11. A gate electrode of the seventh sub-transistor T111 may be connected to the kth scan write line GWLk, a first electrode thereof may be connected to the second electrode of the eighth transistor T8, and a second electrode thereof may be connected to a first electrode of the eighth sub-transistor T112. A gate electrode of the eighth sub-transistor T112 may be connected to the kth scan write line GWLk, the first electrode thereof may be connected to the second electrode of the seventh sub-transistor T111, and the second electrode thereof may be connected to the gate electrode of the eighth transistor T8.

The twelfth transistor T12 is turned on by the kth PWM light emitting signal of the kth PWM light emitting line PWELk to connect the first electrode of the eighth transistor T8 to the second power supply line VDL2. A gate electrode of the twelfth transistor T12 may be connected to the kth PWM light emitting line PWELk, a first electrode thereof may be connected to the second power supply line VDL2, and a second electrode thereof may be connected to the first electrode of the eighth transistor T8.

The thirteenth transistor T13 is turned on by the kth scan control signal of the kth scan control line GCLk to connect the first power supply line VDL1 to a second node N2. A gate electrode of the thirteenth transistor T13 may be connected to the kth scan control line GCLk, a first electrode thereof may be connected to the first power supply line VDL1, and a second electrode thereof may be connected to the second node N2.

The fourteenth transistor T14 is turned on by the kth PWM light emitting signal of the kth PWM light emitting line PWELk to connect the second power supply line VDL2 to the second node N2. Accordingly, when the fourteenth transistor T14 is turned on, the second power supply voltage VDD2 of the second power supply line VDL2 may be supplied to the second node N2. A gate electrode of the fourteenth transistor T14 may be connected to the kth PWM light emitting line PWELk, a first electrode thereof may be connected to the second power supply line VDL2, and a second electrode thereof may be connected to the second node N2.

The second capacitor PC2 may be disposed between the gate electrode of the eighth transistor T8 and the second node N2. One electrode of the second capacitor PC2 may be connected to the gate electrode of the eighth transistor T8, and the other electrode thereof may be connected to the second node N2.

The second node N2 may be a contact point between the second electrode of the thirteenth transistor T13, the second electrode of the fourteenth transistor T14, and the other electrode of the second capacitor C2.

The third pixel drive circuit unit PDU3 adjusts a period during which the drive current Ids is applied to the light emitting element LE according to a voltage of the third node N3.

The third pixel drive circuit unit PDU3 may include fifteenth to nineteenth transistors T15 to T19 and a third capacitor PC3.

The fifteenth transistor T15 is turned on or turned off according to the voltage of the third node N3. When the fifteenth transistor T15 is turned on, the drive current Ids of the eighth transistor T8 may be supplied to the light emitting element LE, and when the fifteenth transistor T15 is turned off, the drive current Ids of the eighth transistor T8 may not be supplied to the light emitting element LE. Accordingly, the turn-on period of the fifteenth transistor T15 may be substantially the same as the light emission period of the light emitting element LE. A gate electrode of the fifteenth transistor T15 may be connected to the third node N3, a first electrode thereof may be connected to the second electrode of the eighth transistor T8, and a second electrode thereof may be connected to a first electrode of the seventeenth transistor T17.

The sixteenth transistor T16 is turned on by the kth scan control signal of the kth scan control line GCLk to connect the initialization voltage line VIL to the third node N3. Accordingly, during a period in which the sixteenth transistor T16 is turned on, the third node N3 may be discharged to the initialization voltage of the initialization voltage line VIL.

The sixteenth transistor T16 may include a plurality of transistors connected in series. For example, the sixteenth transistor T16 may include a ninth sub-transistor T161 and a tenth sub-transistor T162. Accordingly, the voltage of the third node N3 may be prevented from leaking through the sixteenth transistor T16. A gate electrode of the ninth sub-transistor T161 may be connected to the kth scan control line GCLk, a first electrode thereof may be connected to the third node N3, and a second electrode thereof may be connected to a first electrode of the tenth sub-transistor T162. A gate electrode of the tenth sub-transistor T162 may be connected to the kth scan control line GCLk, the first electrode thereof may be connected to the second electrode of the ninth sub-transistor T161, and a second electrode thereof may be connected to the initialization voltage line VIL.

The seventeenth transistor T17 is turned on by the kth PAM light emitting signal of the kth PAM light emitting line PAELk to connect the second electrode of the fifteenth transistor T15 to the first electrode of the light emitting element LE. A gate electrode of the seventeenth transistor T17 may be connected to the kth PAM light emitting line PAELk, a first electrode thereof may be connected to the second electrode of the fifteenth transistor T15, and a second electrode thereof may be connected to the first electrode of the light emitting element LE.

The eighteenth transistor T18 is turned on by the kth scan control signal of the kth scan control line GCLk to connect the initialization voltage line VIL to the first electrode of the light emitting element LE. Accordingly, during a period in which the eighteenth transistor T18 is turned on, the first electrode of the light emitting element LE may be discharged to the initialization voltage of the initialization voltage line VIL. A gate electrode of the eighteenth transistor T18 may be connected to the kth scan control line GCLk, a first electrode thereof may be connected to the first electrode of the light emitting element LE, and a second electrode thereof may be connected to the initialization voltage line VIL.

The nineteenth transistor T19 is turned on by a test signal of a test signal line TSTL to connect the first electrode of the light emitting element LE to the third power supply line VSL. A gate electrode of the nineteenth transistor T19 may be connected to the test signal line TSTL, a first electrode thereof may be connected to the first electrode of the light emitting element LE, and a second electrode thereof may be connected to the third power supply line VSL.

The third capacitor PC3 may be disposed between the third node N3 and the initialization voltage line VIL. One electrode of the third capacitor PC3 may be connected to the third node N3, and the other electrode thereof may be connected to the initialization voltage line VIL.

The third node N3 may be a contact point between the second electrode of the sixth transistor T6, the gate electrode of the fifteenth transistor T15, the first electrode of the ninth sub-transistor T161, and one electrode of the third capacitor C3.

One of the first and second electrodes of each of the first to nineteenth transistors T1 to T19 may be a source electrode, and the other thereof may be a drain electrode. A channel of each of the first to nineteenth transistors T1 to T19 may be formed of any one of polysilicon, amorphous silicon, and oxide semiconductor. When the channel of each of the first to nineteenth transistors T1 to T19 is polysilicon, it may be formed by a low temperature polysilicon (LTPS) process.

In FIG. 12, it has been mainly described that each of the first to nineteenth transistors T1 to T19 is formed of a P-type metal-oxide-semiconductor field-effect transistor (MOSFET), but embodiments are not limited thereto. For example, at least one of the first to nineteenth transistors T1 to T19 may be formed of an N-type MOSFET.

For example, in order to block leakage current and increase the black expression ability of the light emitting element EL, in the first sub-pixel RP, the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 may be formed of an N-type MOSFET.

In this case, the gate electrode of the third sub-transistor T41 and the gate electrode of the fourth sub-transistor T42 of the fourth transistor T4, and the gate electrode of the seventh sub-transistor T111 and the gate electrode of the eighth sub-transistor T112 of the eleventh transistor T11 may be connected to the kth control signal GNLk. The kth scan initialization signal GILk and the kth control signal GNLk may have a pulse generated by the first gate level voltage VGH.

In addition, channels of the first sub-transistor T31 and the second sub-transistor T32 of the third transistor T3, the third sub-transistor T41 and the fourth sub-transistor T42 of the fourth transistor T4, the fifth sub-transistor T101 and the sixth sub-transistor T102 of the tenth transistor T10, and the seventh sub-transistor T111 and the eighth sub-transistor T112 of the eleventh transistor T11 are made of an oxide semiconductor, and channels of the remaining transistors may be made of polysilicon.

Alternatively, any one of the first sub-transistor T31 and the second sub-transistor T32 of the third transistor T3 may be formed of an N-type MOSFET, and the other thereof may be formed of a P-type MOSFET. In this case, from among the first sub-transistor T31 and the second sub-transistor T32 of the third transistor T3, the channel of the transistor formed of the N-type MOSFET may be made of an oxide semiconductor, and the channel of the transistor formed of the P-type MOSFET may be made of polysilicon.

Alternatively, any one of the third sub-transistor T41 and the fourth sub-transistor T42 of the fourth transistor T4 may be formed of an N-type MOSFET, and the other thereof may be formed of a P-type MOSFET. In this case, from among the third sub-transistor T41 and the fourth sub-transistor T42 of the fourth transistor T4, the channel of the transistor formed of the N-type MOSFET may be made of an oxide semiconductor, and the channel of the transistor formed of the P-type MOSFET may be made of polysilicon.

Alternatively, any one of the fifth sub-transistor T101 and the sixth sub-transistor T102 of the tenth transistor T10 may be formed of an N-type MOSFET, and the other thereof may be formed of a P-type MOSFET. In this case, from among the fifth sub-transistor T101 and the sixth sub-transistor T102 of the tenth transistor T10, the channel of the transistor formed of the N-type MOSFET may be made of an oxide semiconductor, and the channel of the transistor formed of the P-type MOSFET may be made of polysilicon.

Alternatively, any one of the seventh sub-transistor T111 and the eighth sub-transistor T112 of the eleventh transistor T11 may be formed of an N-type MOSFET, and the other thereof may be formed of a P-type MOSFET. In this case, from among the seventh sub-transistor T111 and the eighth sub-transistor T112 of the eleventh transistor T11, the channel of the transistor formed of the N-type MOSFET may be made of an oxide semiconductor, and the channel of the transistor formed of the P-type MOSFET may be made of polysilicon.

Figure 13:
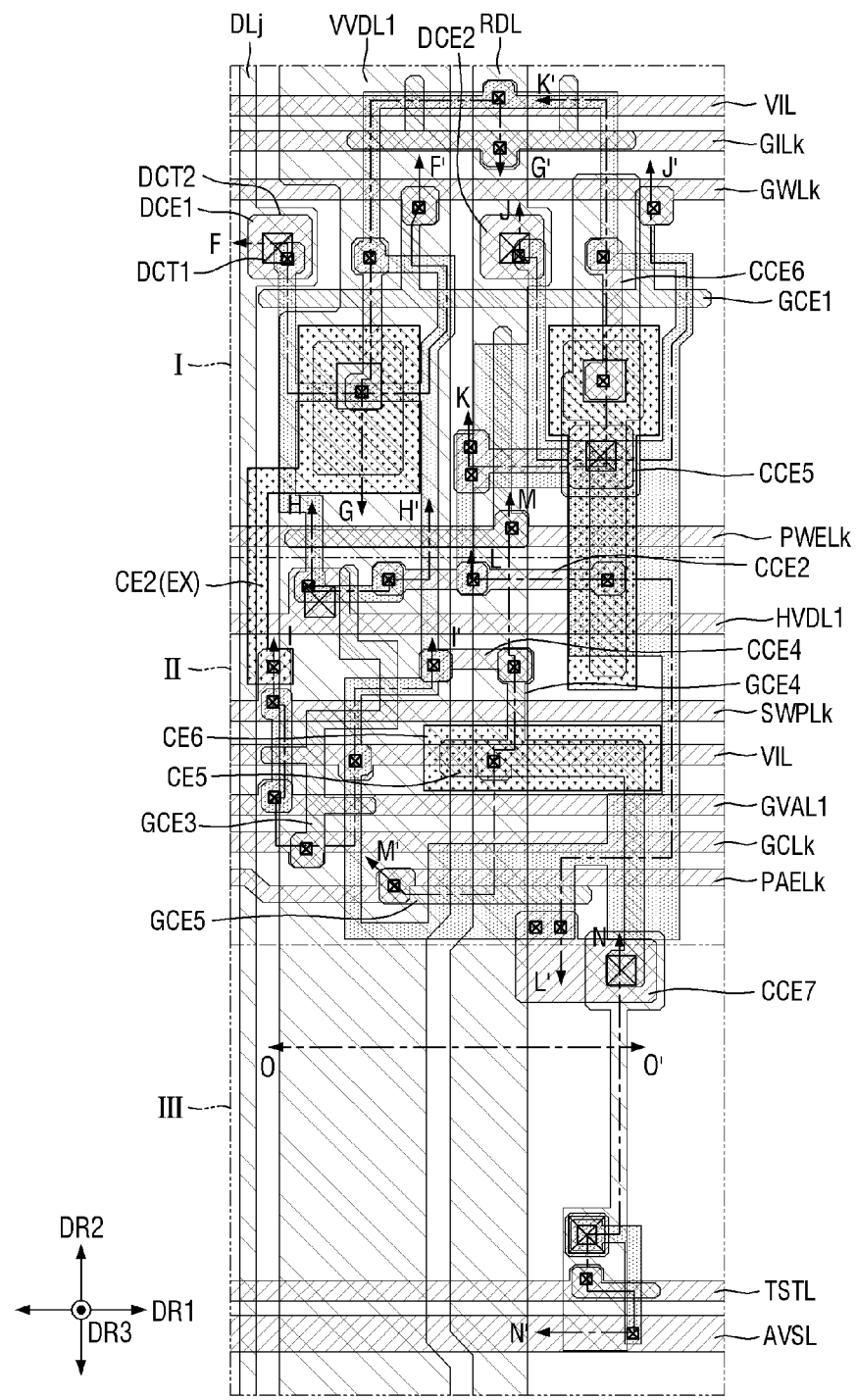
FIG. 13 is a layout view showing a semiconductor layer, a first conductive layer, a second conductive layer, a third conductive layer, and a fourth conductive layer of a first sub-pixel according to one or more embodiments.
Figure 14:
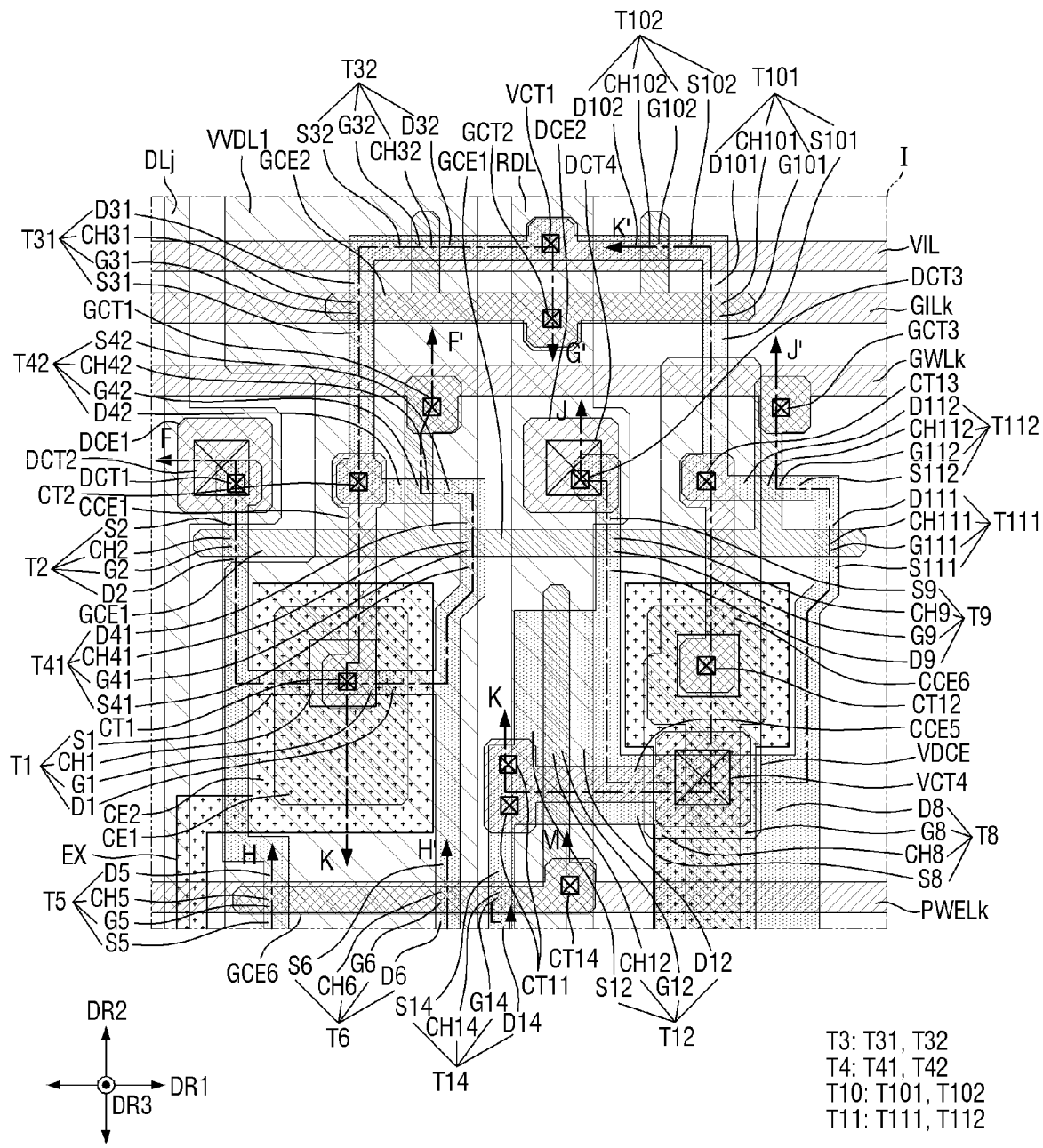
FIG. 14 is an enlarged layout view specifically showing an area I in FIG. 13.
Figure 15:
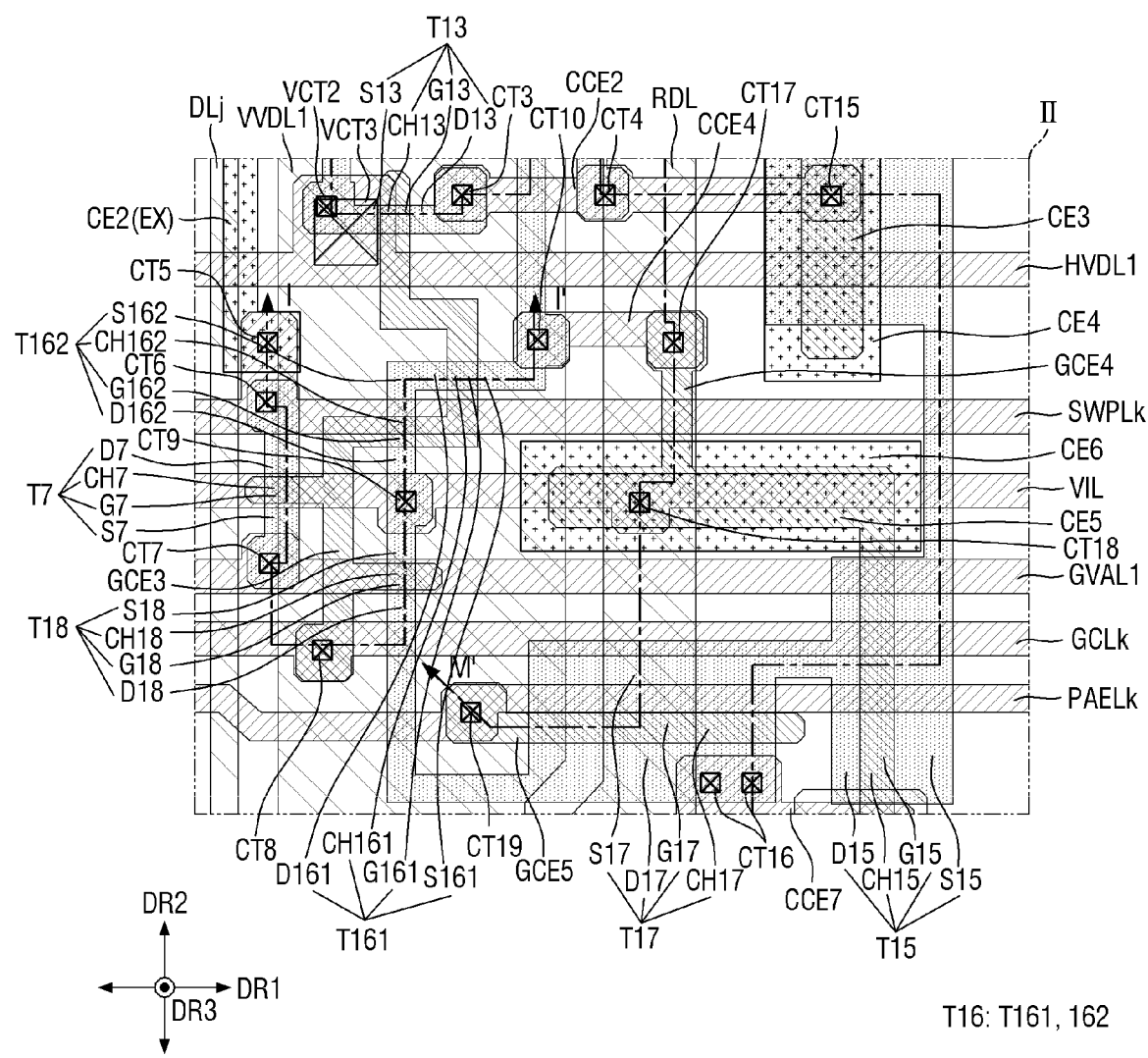
FIG. 15 is an enlarged layout view specifically showing an area II in FIG. 13.
Figure 16:
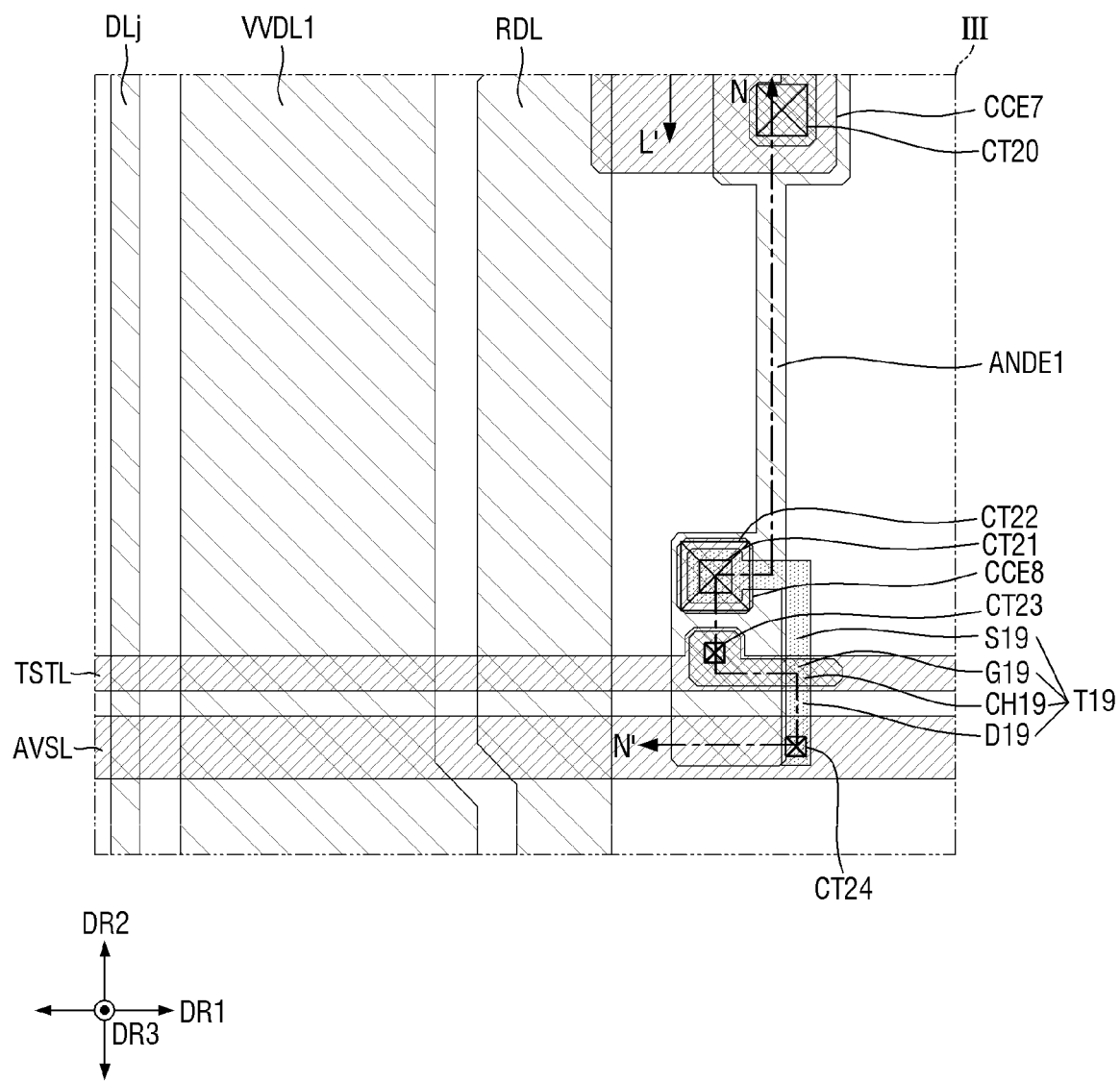
FIG. 16 is an enlarged layout view specifically showing an area III in FIG. 13.
Figure 17:
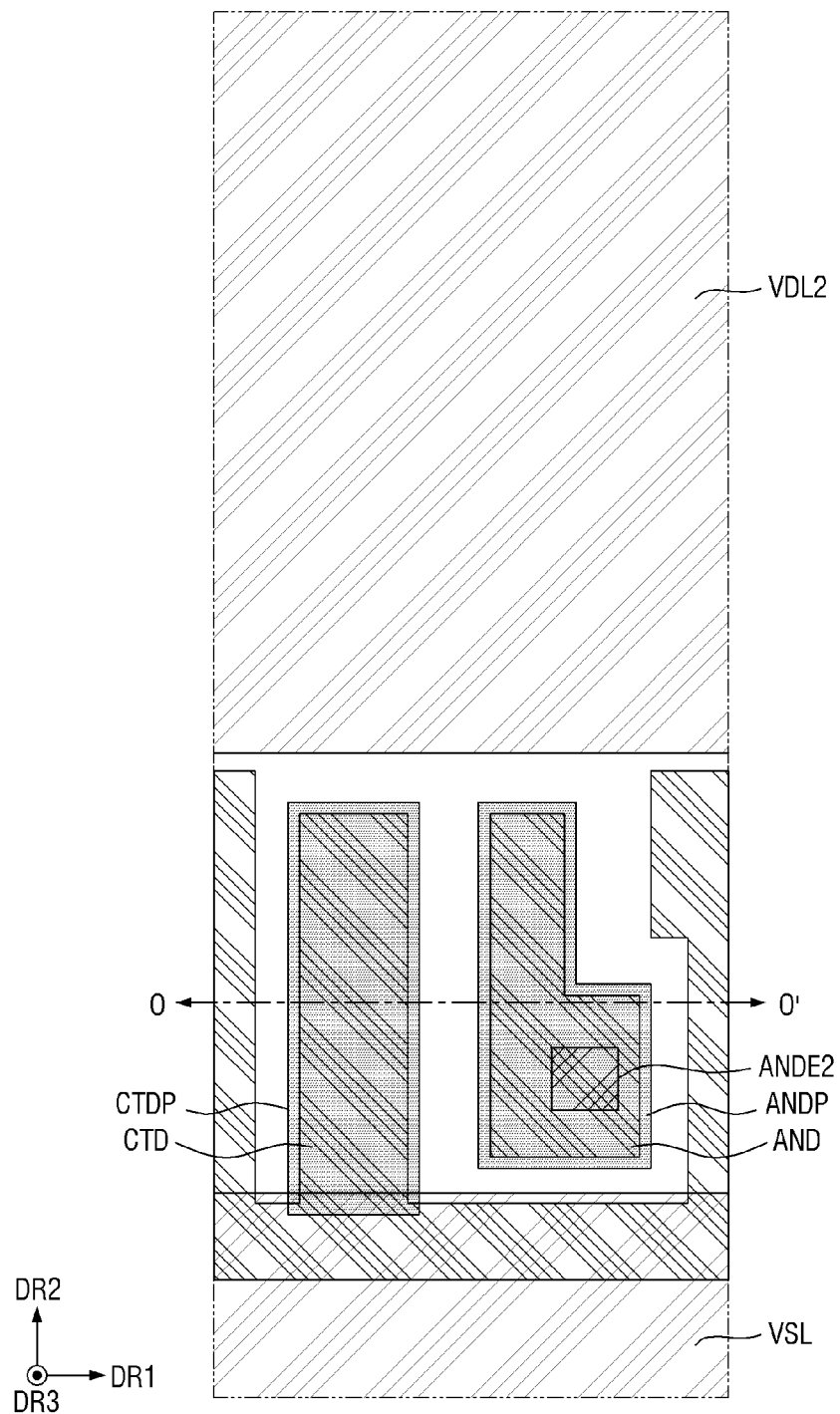
FIG. 17 is a layout view showing an example of a fifth conductive layer, a sixth conductive layer, and a seventh conductive layer of the first sub-pixel shown in FIG. 13.

FIG. 13 is a layout view showing a semiconductor layer, a first conductive layer, a second conductive layer, a third conductive layer, and a fourth conductive layer of a first sub-pixel according to one or more embodiments. FIG. 14 is an enlarged layout view specifically showing an area I in FIG. 13. FIG. 15 is an enlarged layout view specifically showing an area II in FIG. 13. FIG. 16 is an enlarged layout view specifically showing an area III in FIG. 13. FIG. 17 is a layout view showing an example of a fifth conductive layer, a sixth conductive layer, and a seventh conductive layer of the first sub-pixel shown in FIG. 13.

Referring to FIGS. 13, 14, 15, and 16, the initialization voltage line VIL, the kth scan initialization line GILk, the kth scan write line GWLk, the kth PWM light emitting line PWELk, a first power supply horizontal line HVDL1, the first gate voltage auxiliary line GVAL1, the kth sweep signal line SWPLk, the kth scan control line GCLk, the kth PAM light emitting line PAELk, the test signal line TSTL, and a third power supply auxiliary line AVSL may each extend in the first direction DR1, and may be spaced from each other in the second direction DR2.

The jth data line DLj, a first power supply vertical line VVDL1, and the first PAM data line RDL may extend in the second direction DR2.

In addition, the second PAM data line GDL and the third PAM data line BDL shown in FIG. 11 may also extend in the second direction DR2.

The jth data line DLj, the first power supply vertical line VVDL1, the first PAM data line RDL, the second PAM data line GDL, and the third PAM data line BDL may be spaced from each other in the first direction DR1.

As shown in FIG. 13, the first sub-pixel RP may include first to nineteenth transistors T1 to T19, first to sixth capacitor electrodes CE1 to CE6, first to sixth gate connection electrodes GCE1 to GCE6, first and second data connection electrodes DCE1 and DCE2, first to eighth connection electrodes CCE1 to CCE8, and a first anode connection electrode ANDE1.

Referring to FIG. 14, the first transistor T1 may include a first channel CH1, a first gate electrode G1, a first source electrode S1, and a first drain electrode D1.

The first channel CH1 may extend in the first direction DR1.

The first gate electrode G1 may overlap the first channel CH1 in the third direction DR3. The first gate electrode G1 may be connected to the first connection electrode CCE1 through a first contact hole CT1.

The first capacitor electrode CE1 may be provided integrally with the first gate electrode G1.

The first source electrode S1 may be disposed at one side of the first channel CH1, and connected to a second drain electrode D2 and a fifth drain electrode D5.

The first drain electrode D1 may be disposed at the other side of the first channel CH1, and connected to a third sub-source electrode S41 and a sixth source electrode S6.

The first gate electrode G1 may overlap only the first channel CH1 in the third direction DR3, and may not overlap the first source electrode S1 and the first drain electrode D1.

The first source electrode S1 and the first drain electrode D1 may overlap the second capacitor electrode CE2 in the third direction DR3.

The second transistor T2 includes a second channel CH2, a second gate electrode G2, a second source electrode S2, and a second drain electrode D2.

The second gate electrode G2 may overlap the second channel CH2 in the third direction DR3.

The second gate electrode G2 may be integrally formed with the first gate connection electrode GCE1.

The second source electrode S2 may be disposed at one side of the second channel CH2 and connected to the first data connection electrode DCE1 through a first data contact hole DCT1.

The second drain electrode D2 may be disposed at the other side of the second channel CH2 and connected to the first source electrode S1. The second drain electrode D2 may extend in the second direction DR2.

The third transistor T3 may be composed of a first sub-transistor T31 and a second sub-transistor T32.

The first sub-transistor T31 of the third transistor T3 includes a first sub-channel CH31, a first sub-gate electrode G31, a first sub-source electrode S31, and a first sub-drain electrode D31.

The first sub-gate electrode G31 may be integrally formed with the second gate connection electrode GCE2.

The first sub-channel CH31 may overlap the first sub-gate electrode G31 in the third direction DR3.

The first sub-source electrode S31 may be disposed at one side of the first sub-channel CH31 and connected to a fourth sub-drain electrode D42.

The first sub-drain electrode D31 may be disposed at the other side of the first sub-channel CH31 and connected to a second sub-source electrode S32.

The first sub-source electrode S31 may overlap the kth scan write line GWLk in the third direction DR3. The first sub-drain electrode D31 may overlap the initialization voltage line VIL in the third direction DR3.

The second sub-transistor T32 of the third transistor T3 includes a second sub-channel CH32, a second sub-gate electrode G32, the second sub-source electrode S32, and a second sub-drain electrode D32.

The second sub-gate electrode G32 may be integrally formed with the second gate connection electrode GCE2.

The second sub-channel CH32 may overlap the second sub-gate electrode G32 in the third direction DR3.

The second sub-source electrode S32 may be disposed at one side of the second sub-channel CH32 and connected to the first sub-drain electrode D31.

The second sub-drain electrode D32 may be disposed at the other side of the second sub-channel CH32 and connected to the initialization voltage line VIL through a first power supply contact hole VCT1.

The second sub-source electrode S32 and the second sub-drain electrode D32 may overlap the initialization voltage line VIL in the third direction DR3.

The fourth transistor T4 may be composed of a third sub-transistor T41 and a fourth sub-transistor T42.

The third sub-transistor T41 of the fourth transistor T4 includes a third sub-channel CH41, a third sub-gate electrode G41, a third sub-source electrode S41, and a third sub-drain electrode D41.

The third sub-gate electrode G41 may be integrally formed with the first gate connection electrode GCE1.

The third sub-channel CH41 may overlap the third sub-gate electrode G41 in the third direction DR3.

The third sub-source electrode S41 may be disposed at one side of the third sub-channel CH41 and connected to the first drain electrode D1.

The third sub-drain electrode D41 may be disposed at the other side of the third sub-channel CH41 and connected to a fourth sub-source electrode S42.

The fourth sub-transistor T42 of the fourth transistor T4 includes a fourth sub-channel CH42, a fourth sub-gate electrode G42, the fourth sub-source electrode S42, and the fourth sub-drain electrode D42.

The fourth sub-gate electrode G42 may be integrally formed with the first gate connection electrode GCE1.

The fourth sub-channel CH42 may overlap the fourth sub-gate electrode G42 in the third direction DR3.

The fourth sub-source electrode S42 may be disposed at one side of the fourth sub-channel CH42 and connected to the third sub-drain electrode D41.

The fourth sub-drain electrode D42 may be disposed at the other side of the fourth sub-channel CH42 and connected to the first sub-source electrode S31.

The fifth transistor T5 includes a fifth channel CH5, a fifth gate electrode G5, a fifth source electrode S5, and a fifth drain electrode D5.

The fifth gate electrode G5 may be integrally formed with the sixth gate connection electrode GCE6.

The fifth channel CH5 may overlap the fifth gate electrode G5 in the third direction DR3.

The fifth source electrode S5 may be disposed at one side of the fifth channel CH5 and connected to the first power supply horizontal line HVDL1 through a second power supply contact hole VCT2.

The fifth drain electrode D5 may be disposed at the other side of the fifth channel CH5 and connected to the first source electrode S1. The fifth drain electrode D5 may overlap an extension EX of the second capacitor electrode CE2 in the third direction DR3.

The sixth transistor T6 includes a sixth channel CH6, a sixth gate electrode G6, a sixth source electrode S6, and a sixth drain electrode D6.

The sixth gate electrode G6 may be integrally formed with the sixth gate connection electrode GCE6.

The sixth channel CH6 may overlap the sixth gate electrode G6 in the third direction DR3.

The sixth source electrode S6 may be disposed at one side of the sixth channel CH6 and connected to the first drain electrode D1.

The sixth drain electrode D6 may be disposed at the other side of the sixth channel CH6 and connected to the fourth connection electrode CCE4 through a tenth contact hole CT10. The sixth drain electrode D6 may overlap the second connection electrode CCE2 and the first power supply horizontal line HVDL1 in the third direction DR3.

The seventh transistor T7 includes a seventh channel CH7, a seventh gate electrode G7, a seventh source electrode S7, and a seventh drain electrode D7.

The seventh gate electrode G7 may be integrally formed with the third gate connection electrode GCE3. The seventh gate electrode G7 may overlap the initialization voltage line VIL in the third direction DR3.

The seventh channel CH7 may overlap the seventh gate electrode G7 in the third direction DR3.

The seventh source electrode S7 may be disposed at one side of the seventh channel CH7 and connected to the first gate voltage auxiliary line GVAL1 through a seventh contact hole CT7.

The seventh drain electrode D7 may be disposed at the other side of the seventh channel CH7 and connected to the kth sweep signal line SWPLk through a sixth contact hole CT6.

The eighth transistor T8 includes an eighth channel CH8, an eighth gate electrode G8, an eighth source electrode S8, and an eighth drain electrode D8.

The eighth gate electrode G8 may extend in the second direction DR2. The eighth gate electrode G8 may be integrally formed with the third capacitor electrode CE3.

The eighth channel CH8 may overlap the eighth gate electrode G8 in the third direction DR3.

The eighth source electrode S8 may be disposed at one side of the eighth channel CH8, and connected to a ninth drain electrode D9 and a twelfth drain electrode D12.

The eighth drain electrode D8 may be disposed at the other side of the eighth channel CH8 and connected to a seventh sub-source electrode S111.

The ninth transistor T9 includes a ninth channel CH9, a ninth gate electrode G9, a ninth source electrode S9, and the ninth drain electrode D9.

The ninth gate electrode G9 may extend in the second direction DR2. The ninth gate electrode G9 may be integrally formed with the first gate connection electrode GCE1.

The ninth channel CH9 may overlap the ninth gate electrode G9 in the third direction DR3.

The ninth source electrode S9 may be disposed at one side of the ninth channel CH9 and connected to the second data connection electrode DCE2 through a third data contact hole DCT3.

The ninth drain electrode D9 may be disposed at the other side of the ninth channel CH9 and connected to the eighth source electrode S8.

The tenth transistor T10 may include a fifth sub-transistor T101 and a sixth sub-transistor T102.

The fifth sub-transistor T101 of the tenth transistor T10 includes a fifth sub-channel CH101, a fifth sub-gate electrode G101, a fifth sub-source electrode S101, and a fifth sub-drain electrode D101.

The fifth sub-gate electrode G101 may be integrally formed with the second gate connection electrode GCE2.

The fifth sub-channel CH101 may overlap the fifth sub-gate electrode G101 in the third direction DR3.

The fifth sub-source electrode S101 may be disposed at one side of the fifth sub-channel CH101 and connected to an eighth sub-drain electrode D112.

The fifth sub-drain electrode D101 may be disposed at the other side of the fifth sub-channel CH101 and connected to a sixth sub-source electrode S102.

The fifth sub-source electrode S101 may overlap the kth scan write line GWLk in the third direction DR3. The fifth sub-drain electrode D101 may overlap the initialization voltage line VIL in the third direction DR3.

The sixth sub-transistor T102 of the tenth transistor T10 includes a sixth sub-channel CH102, a sixth sub-gate electrode G102, the sixth sub-source electrode S102, and a sixth sub-drain electrode D102.

The sixth sub-gate electrode G102 may be integrally formed with the second gate connection electrode GCE2.

The sixth sub-channel CH102 may overlap the sixth sub-gate electrode G102 in the third direction DR3.

The sixth sub-source electrode S102 may be disposed at one side of the sixth sub-channel CH102 and connected to the fifth sub-drain electrode D101.

The sixth sub-drain electrode D102 may be disposed at the other side of the sixth sub-channel CH102 and connected to the initialization voltage line VIL through the first power supply contact hole VCT1.

The sixth sub-source electrode S102 and the sixth sub-drain electrode D102 may overlap the initialization voltage line VIL in the third direction DR3.

The eleventh transistor T11 may be compose of a seventh sub-transistor T111 and an eighth sub-transistor T112.

The seventh sub-transistor T111 of the eleventh transistor T11 includes a seventh sub-channel CH111, a seventh sub-gate electrode G111, a seventh sub-source electrode S111, and a seventh sub-drain electrode D111.

The seventh sub-gate electrode G111 may be integrally formed with the first gate connection electrode GCE1.

The seventh sub-channel CH111 may overlap the seventh sub-gate electrode G111 in the third direction DR3.

The seventh sub-source electrode S111 may be disposed at one side of the seventh sub-channel CH111 and connected to the eighth drain electrode D8.

The seventh sub-drain electrode D111 may be disposed at the other side of the seventh sub-channel CH111 and connected to an eighth sub-source electrode S112.

The eighth sub-transistor T112 of the eleventh transistor T11 includes an eighth sub-channel CH112, an eighth sub-gate electrode G112, the eighth sub-source electrode S112, and the eighth sub-drain electrode D112.

The eighth sub-gate electrode G112 may be integrally formed with the first gate connection electrode GCE1.

The eighth sub-channel CH112 may overlap the eighth sub-gate electrode G112 in the third direction DR3.

The eighth sub-source electrode S112 may be disposed at one side of the eighth sub-channel CH112 and connected to the seventh sub-drain electrode D111.

The eighth sub-drain electrode D112 may be disposed at the other side of the eighth sub-channel CH112 and connected to the fifth sub-source electrode S101.

The twelfth transistor T12 includes a twelfth channel CH12, a twelfth gate electrode G12, a twelfth source electrode S12, and the twelfth drain electrode D12.

The twelfth gate electrode G12 may be integrally formed with the sixth gate connection electrode GCE6.

The twelfth channel CH12 may overlap the twelfth gate electrode G12 in the third direction DR3.

The twelfth source electrode S12 may be disposed at one side of the twelfth channel CH12 and connected to the fifth connection electrode CCE5 through eleventh contact holes CT11.

The twelfth drain electrode D12 may be disposed at the other side of the twelfth channel CH12.

The thirteenth transistor T13 includes a thirteenth channel CH13, a thirteenth gate electrode G13, a thirteenth source electrode S13, and a thirteenth drain electrode D13.

The thirteenth gate electrode G13 may be integrally formed with the third gate connection electrode GCE3.

The thirteenth channel CH13 may overlap the thirteenth gate electrode G13 in the third direction DR3.

The thirteenth source electrode S13 may be disposed at one side of the thirteenth channel CH13 and connected to the first power supply horizontal line HVDL1 through the second power supply contact hole VCT2.

The thirteenth drain electrode D13 may be disposed at the other side of the thirteenth channel CH13 and connected to the second connection electrode CCE2 through the third contact hole CT3.

The fourteenth transistor T14 includes a fourteenth channel CH14, a fourteenth gate electrode G14, a fourteenth source electrode S14, and a fourteenth drain electrode D14.

The fourteenth gate electrode G14 may be integrally formed with the sixth gate connection electrode GCE6.

The fourteenth channel CH14 may overlap the fourteenth gate electrode G14 in the third direction DR3.

The fourteenth source electrode S14 may be disposed at one side of the fourteenth channel CH14 and connected to the fifth connection electrode CCE5 through the eleventh contact holes CT11.

The fourteenth drain electrode D14 may be disposed at the other side of the fourteenth channel CH14 and connected to the second connection electrode CCE2 through a fourth contact hole CT4.

The fifteenth transistor T15 includes a fifteenth channel CH15, a fifteenth gate electrode G15, a fifteenth source electrode S15, and a fifteenth drain electrode D15.

The fifteenth gate electrode G15 may be integrally formed with the fifth capacitor electrode CE5.

The fifteenth channel CH15 may overlap the fifteenth gate electrode G15 in the third direction DR3.

The fifteenth source electrode S15 may be disposed at one side of the fifteenth channel CH15 and connected to the eighth drain electrode D8.

The fifteenth drain electrode D15 may be disposed at the other side of the fifteenth channel CH15 and connected to the seventeenth source electrode S17.

The sixteenth transistor T16 may include a ninth sub-transistor T161 and a tenth sub-transistor T162.

The ninth sub-transistor T161 of the sixteenth transistor T16 includes a ninth sub-channel CH161, a ninth sub-gate electrode G161, a ninth sub-source electrode S161, and a ninth sub-drain electrode D161.

The ninth sub-gate electrode G161 may be integrally formed with the third gate connection electrode GCE3.

The ninth sub-channel CH161 may overlap the ninth sub-gate electrode G161 in the third direction DR3.

The ninth sub-source electrode S161 may be disposed at one side of the ninth sub-channel CH161 and connected to the fourth connection electrode CCE4 through the tenth contact hole CT10.

The ninth sub-drain electrode D161 may be disposed at the other side of the ninth sub-channel CH161 and connected to the tenth sub-source electrode S162.

The tenth sub-transistor T162 of the sixteenth transistor T16 includes a tenth sub-channel CH162, a tenth sub-gate electrode G162, a tenth sub-source electrode S162, and a tenth sub-drain electrode D162.

The tenth sub-gate electrode G162 may be integrally formed with the third gate connection electrode GCE3.

The tenth sub-channel CH162 may overlap the tenth sub-gate electrode G162 in the third direction DR3.

The tenth sub-source electrode S162 may be disposed at one side of the tenth sub-channel CH162 and connected to the ninth sub-drain electrode D161.

The tenth sub-drain electrode D162 may be disposed at the other side of the tenth sub-channel CH162 and connected to the initialization voltage line VIL through a ninth contact hole CT9.

The seventeenth transistor T17 includes a seventeenth channel CH17, a seventeenth gate electrode G17, a seventeenth source electrode S17, and a seventeenth drain electrode D17.

The seventeenth gate electrode G17 may be integrally formed with the fifth gate connection electrode GCE5.

The seventeenth channel CH17 may overlap the seventeenth gate electrode G17 in the third direction DR3.

The seventeenth source electrode S17 may be disposed at one side of the seventeenth channel CH17 and connected to the fifteenth drain electrode D15.

The seventeenth drain electrode D17 may be disposed at the other side of the seventeenth channel CH17 and connected to the seventh connection electrode CCE7 through sixteenth contact holes CT16.

The eighteenth transistor T18 includes an eighteenth channel CH18, an eighteenth gate electrode G18, an eighteenth source electrode S18, and an eighteenth drain electrode D18.

The eighteenth gate electrode G18 may be integrally formed with the third gate connection electrode GCE3.

The eighteenth channel CH18 may overlap the eighteenth gate electrode G18 in the third direction DR3.

The eighteenth source electrode S18 may be disposed at one side of the eighteenth channel CH18 and connected to the initialization voltage line VIL through the ninth contact hole CT9.

The eighteenth drain electrode D18 may be disposed at the other side of the eighteenth channel CH18 and connected to the seventh connection electrode CCE7 through the sixteenth contact holes CT16.

The nineteenth transistor T19 includes a nineteenth channel CH19, a nineteenth gate electrode G19, a nineteenth source electrode S19, and a nineteenth drain electrode D19.

The nineteenth gate electrode G19 may be connected to the test signal line TSTL through a twenty-third contact hole CT23.

The nineteenth channel CH19 may overlap the nineteenth gate electrode G19 in the third direction DR3.

The nineteenth source electrode S19 may be disposed at one side of the nineteenth channel CH19 and connected to the eighth connection electrode CCE8 through a twenty-first contact hole CT21.

The nineteenth drain electrode D19 may be disposed at the other side of the nineteenth channel CH19 and connected to the third power supply auxiliary line AVSL through a twenty-fourth contact hole CT24.

The first capacitor electrode CE1 may be integrally formed with the first gate electrode G1.

The first connection electrode CCE1 may be connected to the first gate electrode G1 through the first contact hole CT1.

The second capacitor electrode CE2 may overlap the first gate electrode G1 or the first capacitor electrode CE1 in the third direction DR3.

The second capacitor electrode CE2 may include the extension EX extending in the second direction DR2. The extension EX of the second capacitor electrode CE2 may cross the kth PWM light emitting line PWELk and the first power supply horizontal line HVDL1.

The extension EX of the second capacitor electrode CE2 may be connected to the kth sweep signal line SWPLk through a fifth contact hole CT5.

A first capacitor (PC1 in FIG. 12) may be provided by an overlapping area between the first capacitor electrode CE1 and the second capacitor electrode CE2.

The third capacitor electrode CE3 may be integrally formed with the eighth gate electrode G8.

The sixth connection electrode CCE6 may be connected to the eighth gate electrode G8 through a twelfth contact hole CT12.

The fourth capacitor electrode CE4 may overlap the third capacitor electrode CE3 in the third direction DR3.

A second capacitor (PC2 in FIG. 12) may be provided by an overlapping area between the third capacitor electrode CE3 and the fourth capacitor electrode CE4.

The fifth capacitor electrode CE5 may be integrally formed with the fourth gate connection electrode GCE4 and the fifteenth gate electrode G15.

The sixth capacitor electrode CE6 may overlap the fifth capacitor electrode CE5 in the third direction DR3. The sixth capacitor electrode CE6 may be connected to the initialization voltage line VIL through an eighteenth contact hole CT18.

A third capacitor (PC3 in FIG. 12) may be provided by an overlapping area between the fifth capacitor electrode CE5 and the sixth capacitor electrode CE6.

The first gate connection electrode GCE1 may be integrally formed with the second gate electrode G2, the third sub-gate electrode G41, the fourth sub-gate electrode G42, the ninth gate electrode G9, the seventh sub-gate electrode G111, and the eighth sub-gate electrode G112, and connected to the kth scan write line GWLk through a first gate contact hole GCT1 and a third gate contact hole GCT3.

The second gate connection electrode GCE2 may be integrally formed with the first sub-gate electrode G31, the second sub-gate electrode G32, the fifth sub-gate electrode G101, and the sixth sub-gate electrode G102, and connected to the kth scan initialization line GILk through a second gate contact hole GCT2.

The third gate connection electrode GCE3 may be integrally formed with the seventh gate electrode G7, the thirteenth gate electrode G13, the ninth sub-gate electrode G161, the tenth sub-gate electrode G162, and the eighteenth gate electrode G18, and connected to the kth scan control line GCLk through an eighth contact hole CT8.

The fourth gate connection electrode GCE4 may be integrally formed with the fifth capacitor electrode CE5 and the fifteenth gate electrode G15, and connected to the fourth connection electrode CCE4 through a seventeenth contact hole CT17.

The fifth gate connection electrode GCE5 may be integrally formed with the seventeenth gate electrode G17 and connected to the kth PAM light emitting line PAELk through a nineteenth contact hole CT19.

The sixth gate connection electrode GCE6 may be integrally formed with the fifth gate electrode G5, the sixth gate electrode G6, the twelfth gate electrode G12, and the fourteenth gate electrode G14, and connected to the kth PWM light emitting line PWELk through a fourteenth contact hole CT14.

The first data connection electrode DCE1 may be connected to the second source electrode S2 through the first data contact hole DCT1 and connected to the jth data line DLj through a second data contact hole DCT2.

The second data connection electrode DCE2 may be connected to the ninth source electrode S9 through the third data contact hole DCT3 and connected to the first PAM data line RDL through a fourth data contact hole DCT4.

The first connection electrode CCE1 may extend in the second direction DR2. The first connection electrode CCE1 may be connected to the first gate electrode G1 through the first contact hole CT1, and connected to the first sub-source electrode S31 and the fourth sub-drain electrode D42 through a second contact hole CT2.

The second connection electrode CCE2 may extend in the first direction DR1. The second connection electrode CCE2 may be connected to the thirteenth drain electrode D13 through the third contact hole CT3, connected to the fourteenth drain electrode D14 through the fourth contact hole CT4, and connected to the fourth capacitor electrode CE4 through a fifteenth contact hole CT15.

The fourth connection electrode CCE4 may extend in the first direction DR1. The fourth connection electrode CCE4 may be connected to the sixth drain electrode D6 and the ninth sub-source electrode S161 through the tenth contact hole CT10, and connected to the fourth gate connection electrode CCE4 integrally formed with the fifteenth gate electrode G15 through the seventeenth contact hole CT17.

The fifth connection electrode CCE5 may extend in the first direction DR1. The fifth connection electrode CCE5 may be connected to the twelfth source electrode S12 and the fourteenth source electrode S14 through the eleventh contact holes CT11.

The sixth connection electrode CCE6 may extend in the second direction DR2. The sixth connection electrode CCE6 may be connected to the third capacitor electrode CE3 through the twelfth contact hole CT12, and connected to the fifth sub-source electrode S101 and the eighth sub-drain electrode D112 through a thirteenth contact hole CT13.

The seventh connection electrode CCE7 may be connected to the seventeenth drain electrode D17 and the eighteenth drain electrode D18 through the sixteenth contact holes CT16. The seventh connection electrode CCE7 may be connected to the first anode connection electrode ANDE1 through a twentieth contact hole CT20.

The eighth connection electrode CCE8 may be connected to the nineteenth source electrode S19 through the twenty-first contact hole CT21 and connected to the first anode connection electrode ANDE1 through a twenty-second contact hole CT22.

The first anode connection electrode ANDE1 may extend in the second direction DR2. The first anode connection electrode ANDE1 may be connected to the seventh connection electrode CCE7 through the twentieth contact hole CT20 and connected to the eighth connection electrode CCE8 through the twenty-second contact hole CT22.

A second power supply connection electrode VDCE may extend in the second direction DR2 and may be connected to the fifth connection electrode CCE5 through a fourth power supply contact hole VCT4.

Referring to FIG. 17, the first sub-pixel RP may further include a second anode connection electrode ANDE2, an anode electrode AND, a cathode electrode CTD, an anode pad ANDP, and a cathode pad CTDP.

The second anode connection electrode ANDE2 overlaps a part of the first anode connection electrode (ANDE1 in FIG. 16).

The anode electrode AND overlaps the second anode connection electrode ANDE2 and is covered with the anode pad ANDP.

The cathode electrode CTD is spaced from the anode electrode AND in the first direction DR1 and is covered with the cathode pad CTDP.

In addition, the second power supply line VDL2 may extend in the first direction DR1 or the second direction DR2, and overlap the first to eighteenth transistors T1 to T18 in the third direction DR3. Alternatively, the second power supply line VDL2 may overlap at least a part of the second power supply connection electrode VDCE in the third direction DR3.

The third power supply line VSL may be spaced from the second power supply line VDL2, may extend in the first direction DR1 or the second direction DR2, and may partially overlap the cathode electrode CTD in the third direction DR3. Alternatively, the third power supply line VSL may overlap at least a part of the third power supply auxiliary line AVSL in the third direction DR3.

For example, the second power supply line VDL2 and the third power supply line VSL may extend in the first direction DR1, and may be spaced from each other in the second direction DR2.

Figure 18:
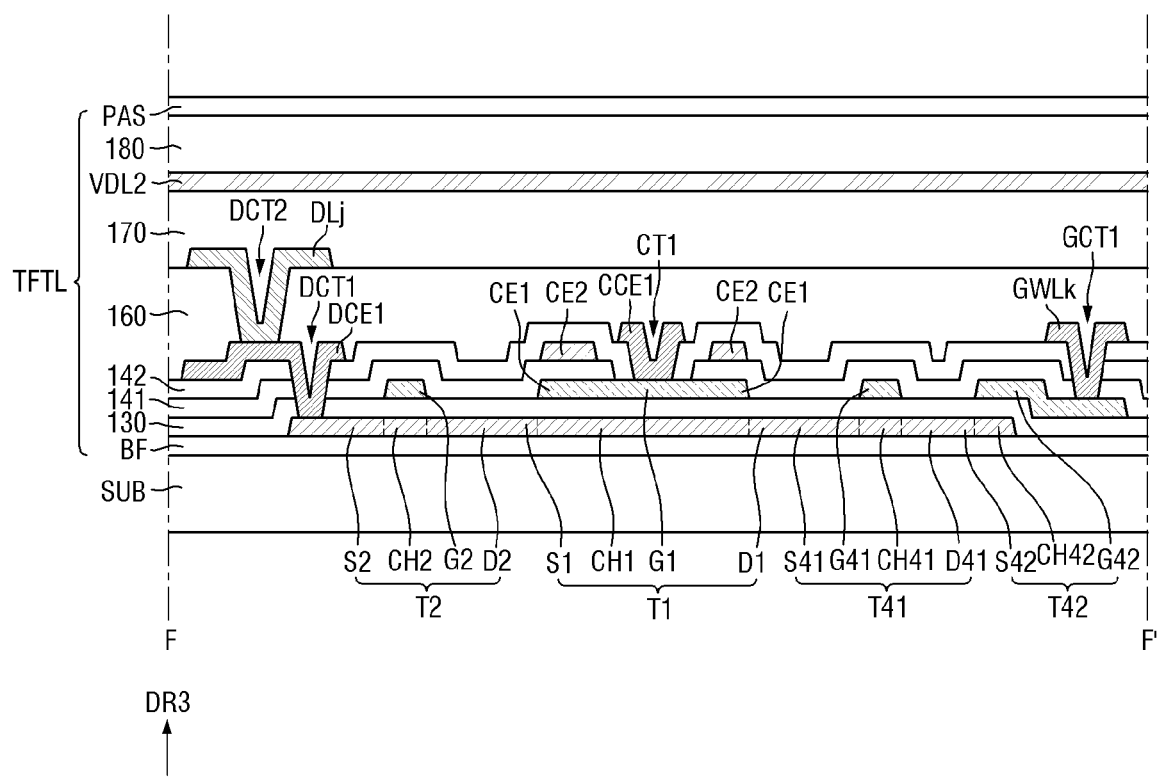
FIG. 18 is a cross-sectional view showing one example of a surface taken along the line F-F' in FIGS. 13 and 14.
Figure 19:
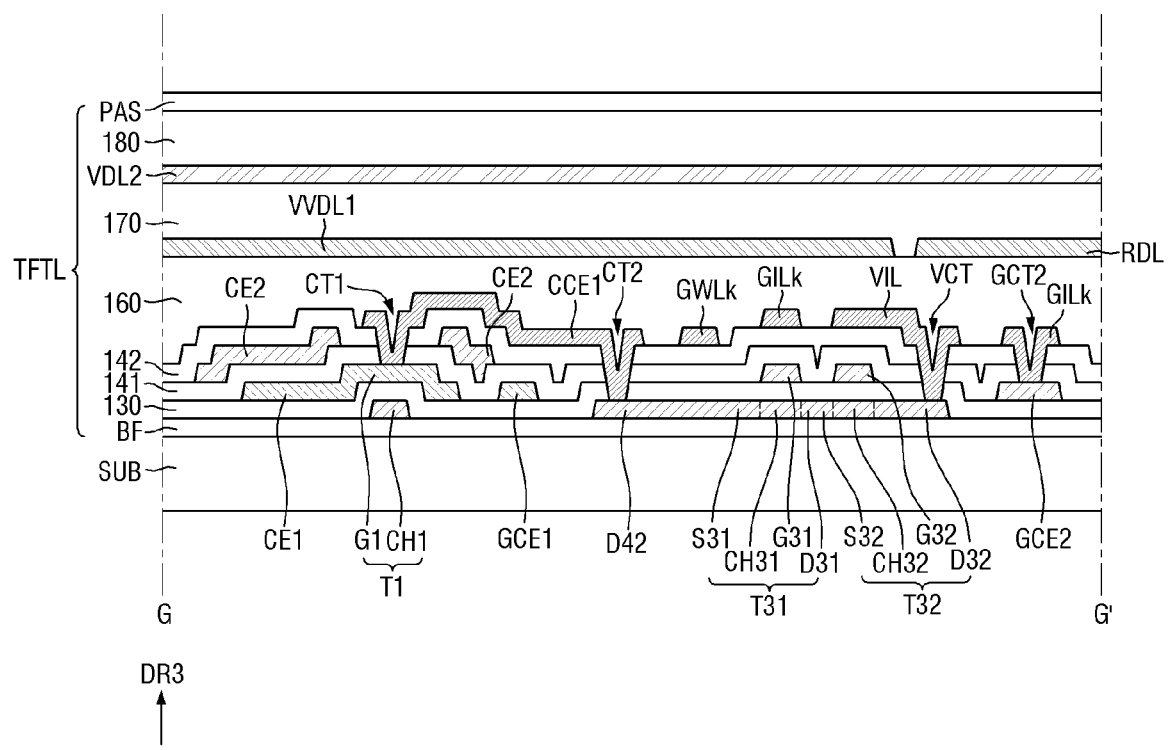
FIG. 19 is a cross-sectional view showing one example of a surface taken along the line G-G' in FIGS. 13 and 14.
Figure 20:
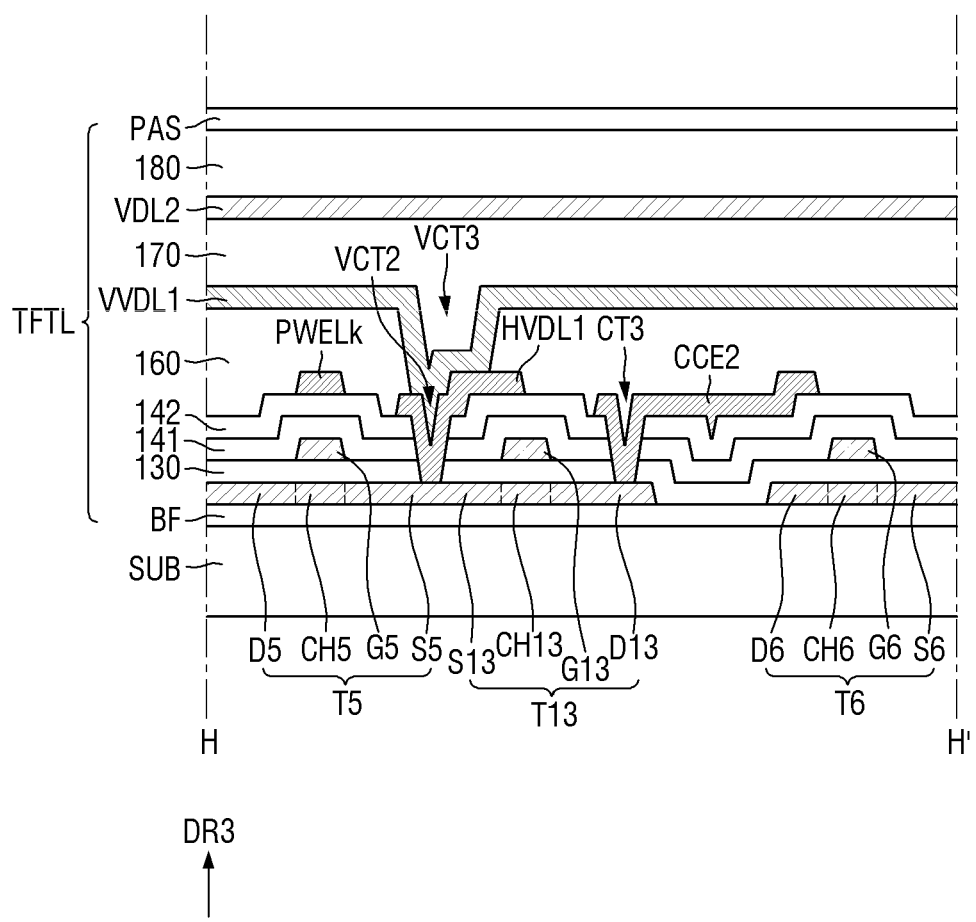
FIG. 20 is a cross-sectional view showing one example of a surface taken along the line H-H' in FIGS. 13 and 14.
Figure 21:
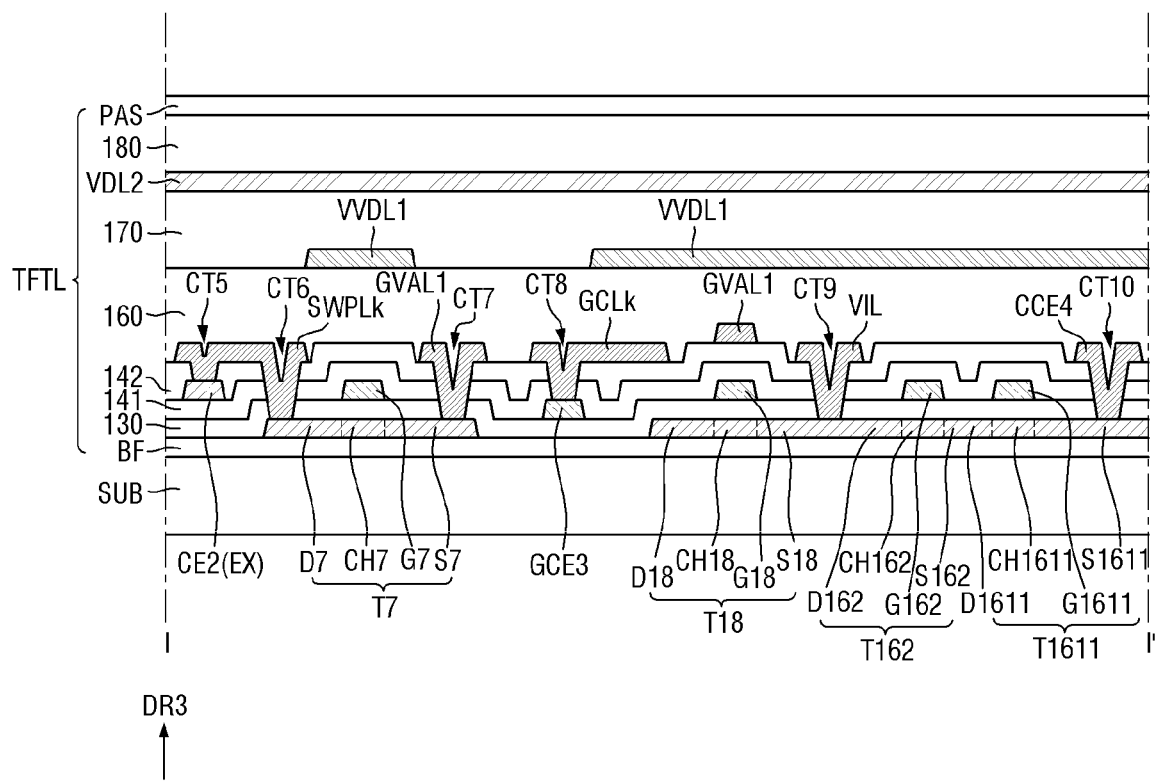
FIG. 21 is a cross-sectional view showing one example of a surface taken along the line I-I' in FIGS. 13 and 14.
Figure 22:
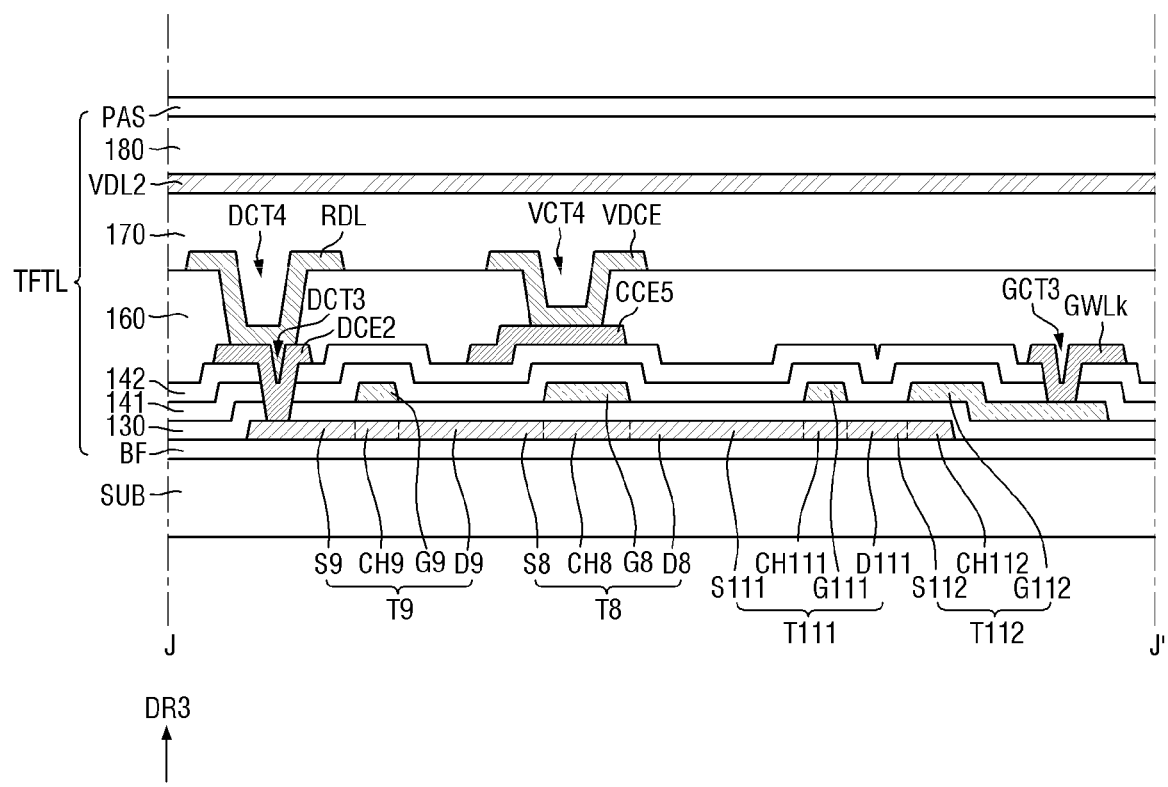
FIG. 22 is a cross-sectional view showing one example of a surface taken along the line J-J' in FIGS. 13 and 14.
Figure 23:
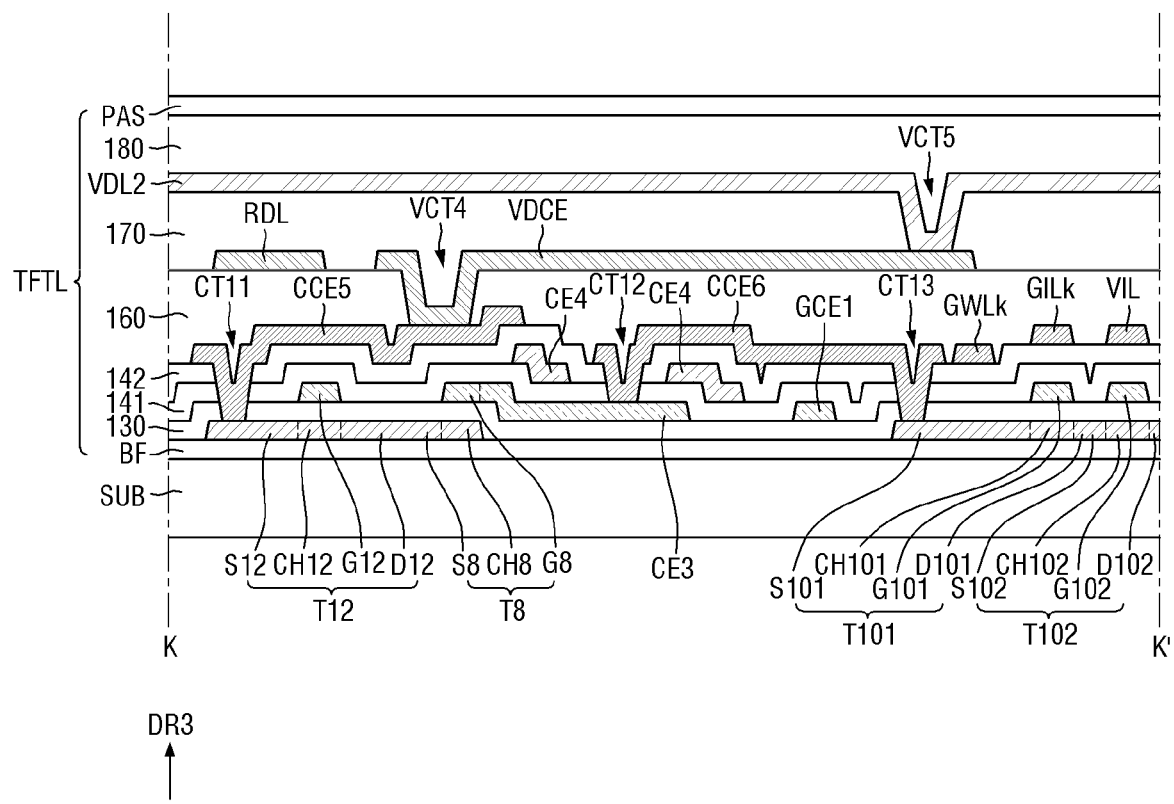
FIG. 23 is a cross-sectional view showing one example of a surface taken along the line K-K' in FIGS. 13 and 14.
Figure 24:
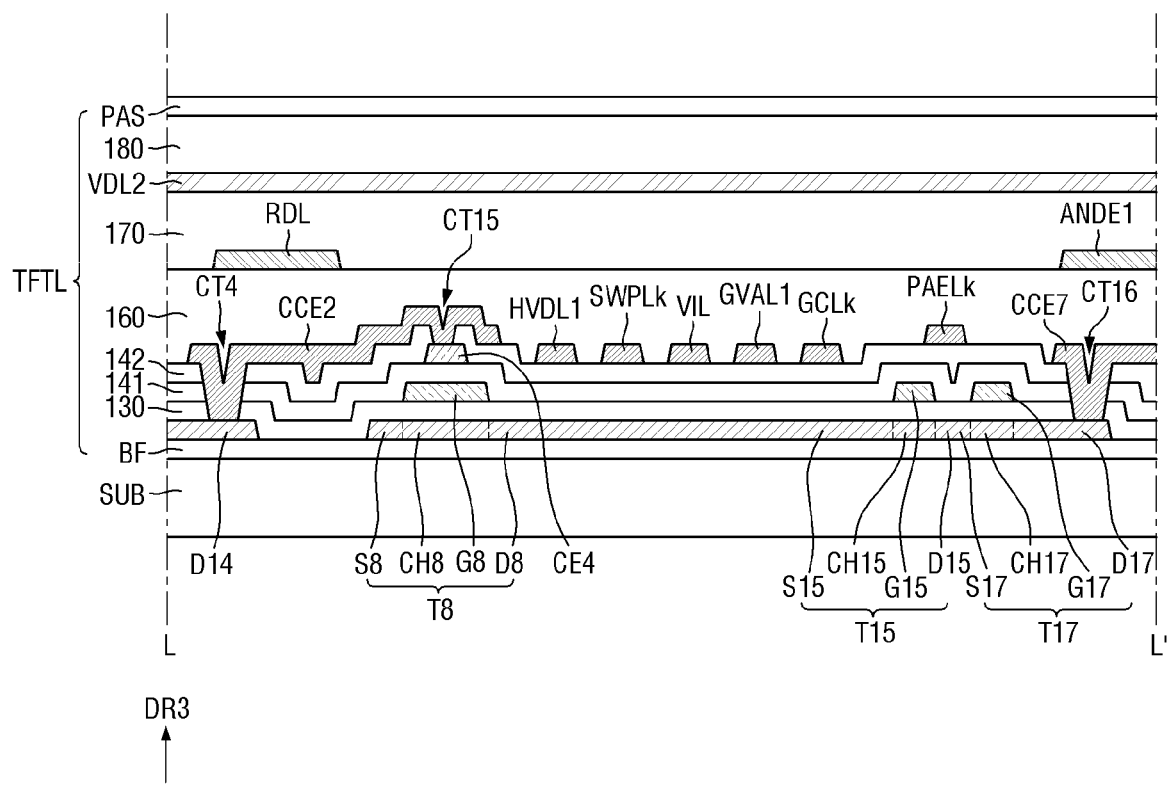
FIG. 24 is a cross-sectional view showing one example of a surface taken along the line L-L' in FIGS. 13, 14, 15, and 16.
Figure 25:
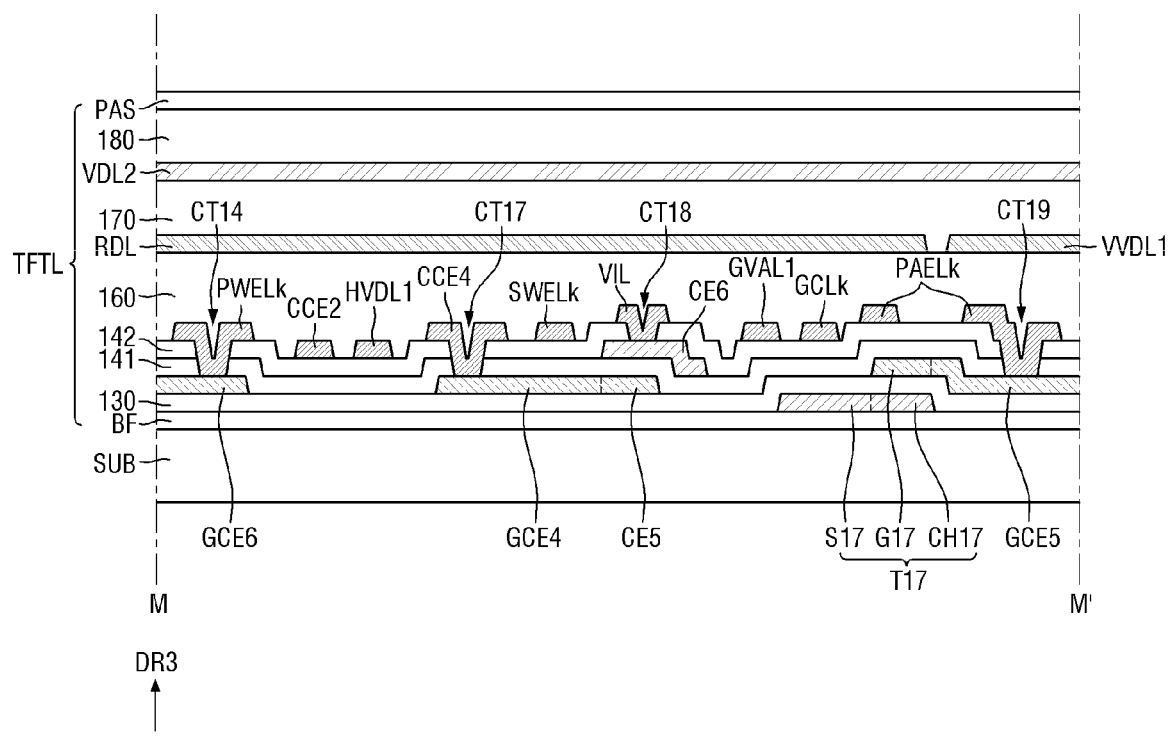
FIG. 25 is a cross-sectional view showing one example of a surface taken along the line M-M' in FIGS. 13, 14, and 15.
Figure 26:
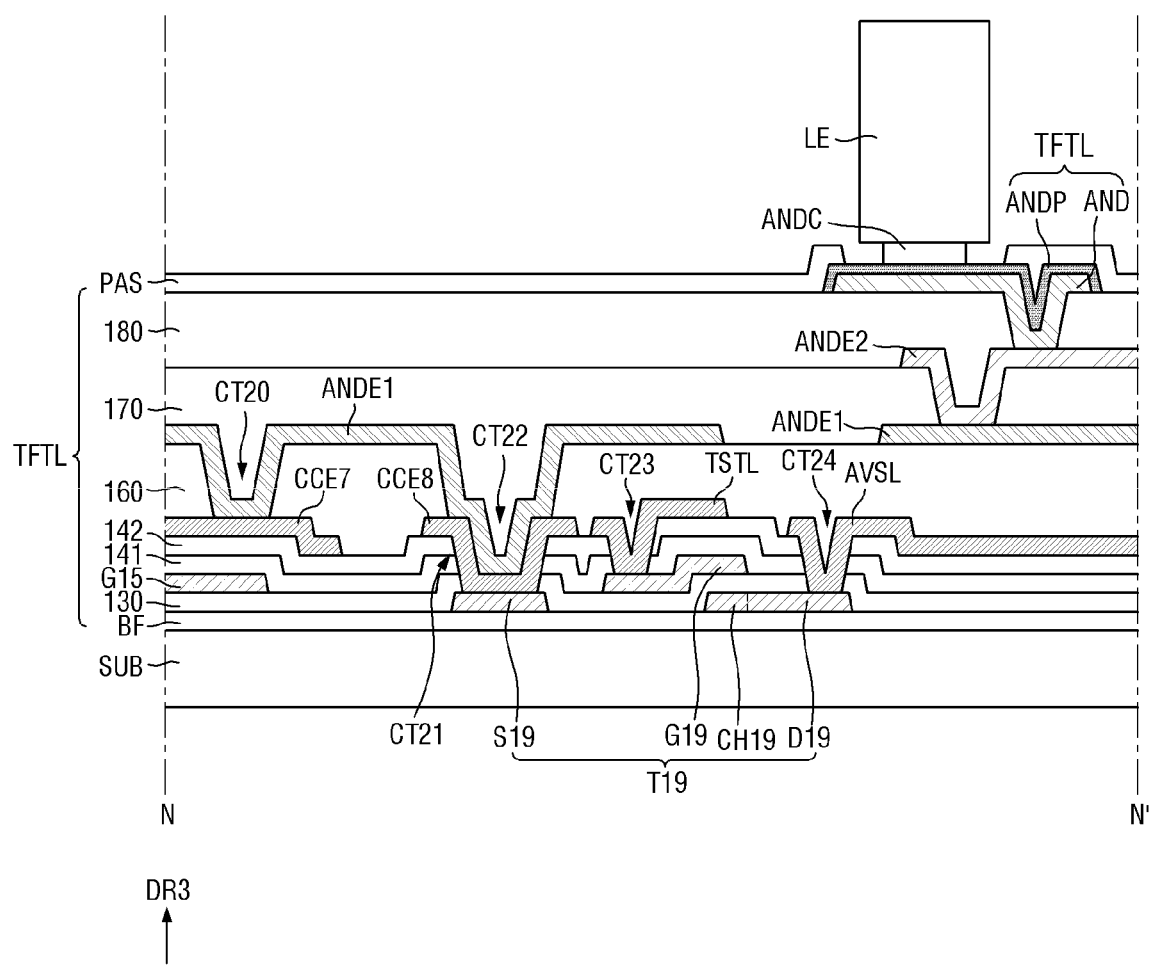
FIG. 26 is a cross-sectional view showing one example of a surface taken along the line N-N' in FIGS. 13 and 16.
Figure 27:
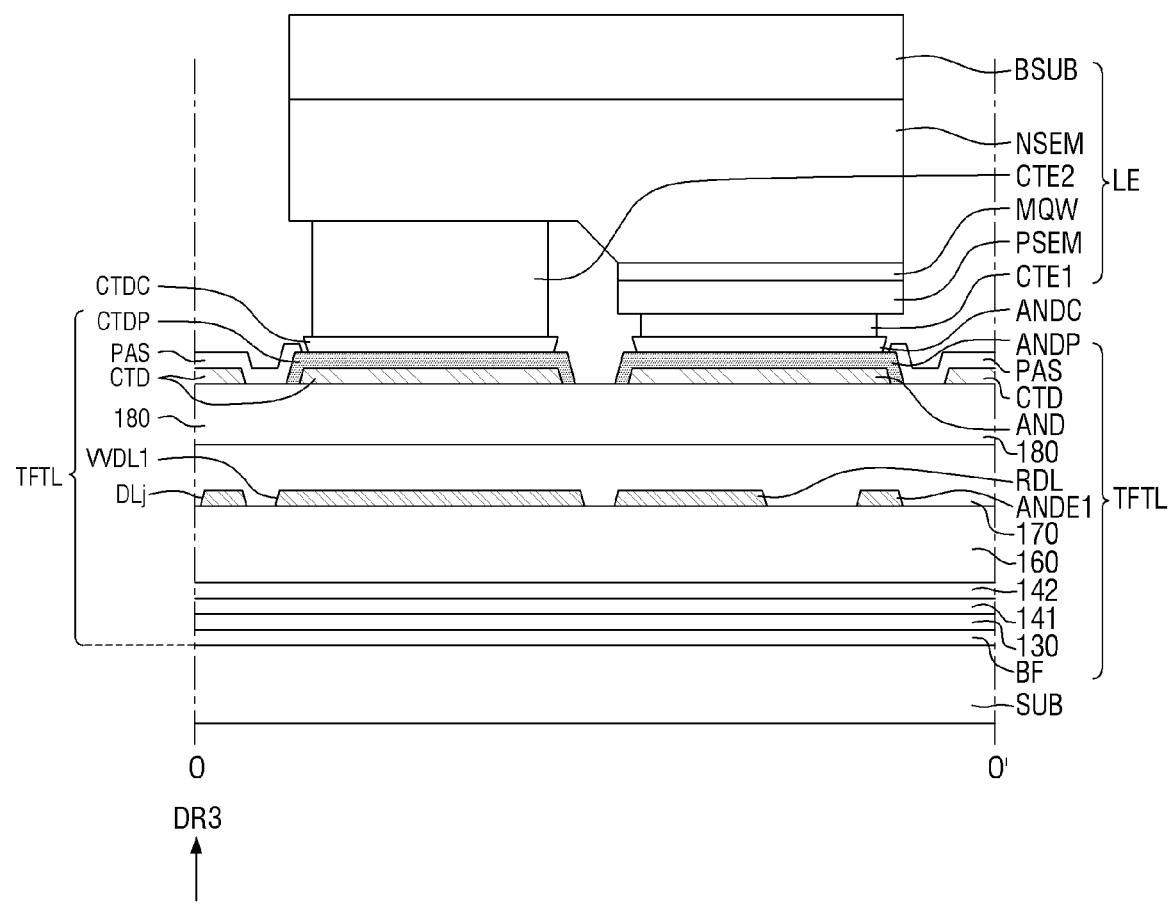
FIG. 27 is a cross-sectional view showing one example of a surface taken along the line O-O' in FIGS. 13, 16, and 17.

FIG. 18 is a cross-sectional view showing one example of a surface taken along the line F-F' in FIGS. 13 and 14. FIG. 19 is a cross-sectional view showing one example of a surface taken along the line G-G' in FIGS. 13 and 14. FIG. 20 is a cross-sectional view showing one example of a surface taken along the line H-H' in FIGS. 13 and 14. FIG. 21 is a cross-sectional view showing one example of a surface taken along the line I-I' in FIGS. 13 and 14. FIG. 22 is a cross-sectional view showing one example of a surface taken along the line J-J' in FIGS. 13 and 14. FIG. 23 is a cross-sectional view showing one example of a surface taken along the line K-K' in FIGS. 13 and 14. FIG. 24 is a cross-sectional view showing one example of a surface taken along the line L-L' in FIGS. 13, 14, 15, and 16. FIG. 25 is a cross-sectional view showing one example of a surface taken along the line M-M' in FIGS. 13, 14, and 15. FIG. 26 is a cross-sectional view showing one example of a surface taken along the line N-N' in FIGS. 13 and 16. FIG. 27 is a cross-sectional view showing one example of a surface taken along the line O-O' in FIGS. 13, 16, and 17.

Referring to FIGS. 18 to 25, the display panel 100 of the display device 10 according to one or more embodiments includes the substrate SUB and the transistor array layer TFTL disposed on the substrate.

In addition, referring to FIGS. 26 and 27, the display panel 100 further includes the light emitting element LE disposed on the transistor array layer TFTL.

The display panel 100 may further include the anode contact electrode ANDC and the cathode contact electrode CTDC disposed between the transistor array layer TFTL and the light emitting element LE.

The substrate SUB may be made of a polymer resin of polyimide. The substrate SUB may be a flexible substrate capable of bending, folding, rolling, etc.

As shown in FIGS. 18 to 27, the transistor array layer TFTL may include the gate insulating layer 130 covering the semiconductor layers CH1, CH2, CH31, CH32, CH41, CH42, CH5 to CH9, CH101, CH102, CH111, CH112, CH12 to CH15, CH161, CH162, CH17 to CH19, S1, S2, S31, S32, S41, S42, S5 to S9, S101, S102, S111, S112, S12 to S15, S161, S162, S17 to S19, D1, D2, D31, D32, D41, D42, D5 to D9, D101, D102, D111, D112, D12 to D15, D161, D162, and D17 to D19 on the first surface of the substrate SUB, the first interlayer insulating layer 141 covering the first conductive layers G1, G2, G31, G32, G41, G42, G5 to G9, G101, G102, G111, G112, G12 to G15, G161, G162, G17 to G19, CE1, CE3, CE5, and GCE1 to CGE5 on the gate insulating layer 130, the second interlayer insulating layer 142 covering the second conductive layers CE2, CE4, CE6 on the first interlayer insulating layer 141, the first planarization layer 160 covering the third conductive layers VIL, GILk, GWLk, PWELk, HVDL1, GVAL1, SWPLk, GCLk, PAELk, TSTL, AVSL, DCE1, DCE2, and CCE1 to CCE8 on the second interlayer insulating layer 142, the second planarization layer 170 covering the fourth conductive layers DLj, VVDL, RDL, ANDE1, and VDCE on the first planarization layer 160, and a third planarization layer 180 covering fifth conductive layers VDL2, VSL, and ANDE2 on the second planarization layer 170.

In addition, the transistor array layer TFTL may further include sixth conductive layers AND and CTD disposed on the third planarization layer 180, and seventh conductive layers ANDP and CTDP disposed on parts of the sixth conductive layers AND and CTD.

In addition, the transistor array layer TFTL may further include the buffer layer BF covering the first surface of the substrate SUB. In this case, the semiconductor layers CH1, CH2, CH31, CH32, CH41, CH42, CH5-CH9, CH101, CH102, CH111, CH112, CH12 to CH15, CH161, CH162, CH17 to CH19, S1, S2, S31, S32, S41, S42, S5 to S9, S101, S102, S111, S112, S12 to S15, S161, S162, S17 to S19, D1, D2, D31, D32, D41, D42, D5 to D9, D101, D102, D111, D112, D12 to D15, D161, D162, and D17 to D19 and the gate insulating layer 130 covering the semiconductor layers are disposed on the buffer layer BF.

The buffer layer BF may be formed of a plurality of inorganic layers that are alternately stacked. For example, the buffer layer BF may be formed as a multilayer in which one or more inorganic films from among a silicon nitride layer, a silicon oxynitride layer, a silicon oxide layer, a titanium oxide layer, and an aluminum oxide layer are alternately stacked.

The semiconductor layers CH1, CH2, CH31, CH32, CH41, CH42, CH5 to CH9, CH101, CH102, CH111, CH112, CH12 to CH15, CH161, CH162, CH17 to CH19, S1, S2, S31, S32, S41, S42, S5 to S9, S101, S102, S111, S112, S12 to S15, S161, S162, S17 to S19, D1, D2, D31, D32, D41, D42, D5 to D9, D101, D102, D111, D112, D12 to D15, D161, D162, and D17 to D19 on the buffer layer BF may include channels CH1, CH2, CH31, CH32, CH41, CH42, CH5 to CH9, CH101, CH102, CH111, CH112, CH12 to CH15, CH161, CH162, and CH17 to CH19 of each of the transistors T1 to T19 provided in the pixel driver PD of each sub-pixel, source electrode S1, S2, S31, S32, S41, S42, S5 to S9, S101, S102, S111, S112, S12 to S15, S161, S162, and S17 to S19 of each of the transistors T1 to T19, and drain electrodes D1, D2, D31, D32, D41, D42, D5 to D9, D101, D102, D111, D112, D12 to D15, D161, D162, and D17 to D19 of each of the transistors T1 to T19.

The semiconductor layers CH1, CH2, CH31, CH32, CH41, CH42, CH5 to CH9, CH101, CH102, CH111, CH112, CH12 to CH15, CH161, CH162, CH17 to CH19, S1, S2, S31, S32, S41, S42, S5 to S9, S101, S102, S111, S112, S12 to S15, S161, S162, S17 to S19, D1, D2, D31, D32, D41, D42, D5 to D9, D101, D102, D111, D112, D12 to D15, D161, D162, and D17 to D19 may include a polycrystalline silicon, a single crystal silicon, a low temperature polycrystalline silicon, an amorphous silicon, or an oxide semiconductor.

The rest other than the channels CH1, CH2, CH31, CH32, CH41, CH42, CH5 to CH9, CH101, CH102, CH111, CH112, CH12 to CH15, CH161, CH162, and CH17 to CH19 of each of the transistors T1 to T19 from among the semiconductor layers CH1, CH2, CH31, CH32, CH41, CH42, CH5 to CH9, CH101, CH102, CH111, CH112, CH12 to CH15, CH161, CH162, CH17 to CH19, S1, S2, S31, S32, S41, S42, S5 to S9, S101, S102, S111, S112, S12 to S15, S161, S162, S17 to S19, D1, D2, D31, D32, D41, D42, D5 to D9, D101, D102, D111, D112, D12 to D15, D161, D162, and D17 to D19 may be areas having conductivity by doping a silicon semiconductor or an oxide semiconductor with ions or impurities.

The gate insulating layer 130 covering the semiconductor layers CH1, CH2, CH31, CH32, CH41, CH42, CH5 to CH9, CH101, CH102, CH111, CH112, CH12 to CH15, CH161, CH162, CH17 to CH19, S1, S2, S31, S32, S41, S42, S5 to S9, S101, S102, S111, S112, S12 to S15, S161, S162, S17 to S19, D1, D2, D31, D32, D41, D42, D5 to D9, D101, D102, D111, D112, D12 to D15, D161, D162, and D17 to D19 on the buffer layer BF may be made of an inorganic film, for example, a silicon nitride layer, a silicon oxynitride layer, a silicon oxide layer, a titanium oxide layer, or an aluminum oxide layer. The gate insulating layer 130 may be referred to as a first insulating film.

The first conductive layers G1, G2, G31, G32, G41, G42, G5 to G9, G101, G102, G111, G112, G12 to G15, G161, G162, G17 to G19, CE1, CE3, CE5, and GCE1 to CGE5 on the gate insulating layer 130 may include the gate electrodes G1, G2, G31, G32, G41, G42, G5 to G9, G101, G102, G111, G112, G12 to G15, G161, G162, and G17 to G19, of each of the transistors T1 to T19 provided in the pixel driver PD of each sub-pixel, first to fifth gate connection electrodes GCE1 to CGE5, the first capacitor electrode CE1, the third capacitor electrode CE3, and the fifth capacitor electrode CE5.

The first conductive layers G1, G2, G31, G32, G41, G42, G5 to G9, G101, G102, G111, G112, G12 to G15, G161, G162, G17 to G19, CE1, CE3, CE5, and GCE1 to CGE5 on the gate insulating layer 130 may be formed of a single layer or a multi-layer made of any one of molybdenum (Mo), aluminum (Al), chromium (Cr), gold (Au), titanium (Ti), nickel (Ni), neodymium (Nd), and copper (Cu), or an alloy thereof.

The first interlayer insulating layer 141 covering the first conductive layers G1, G2, G31, G32, G41, G42, G5 to G9, G101, G102, G111, G112, G12 to G15, G161, G162, G17 to G19, CE1, CE3, CE5, and GCE1 to CGE5 on the gate insulating layer 130 may be formed of an inorganic film, for example, a silicon nitride layer, a silicon oxynitride layer, a silicon oxide layer, a titanium oxide layer, or an aluminum oxide layer. The first interlayer insulating layer 141 may be referred to as a second insulating film.

The second conductive layers CE2, CE4, and CE6 on the first interlayer insulating layer 141 may include the second capacitor electrode CE2, the fourth capacitor electrode CE4, and the sixth capacitor electrode CE6.

The second capacitor electrode CE2 overlaps the first capacitor electrode CE1 in the third direction DR3 with the first interlayer insulating layer 141 interposed therebetween, so that the first capacitor PC1 may be provided.

The fourth capacitor electrode CE4 overlaps the third capacitor electrode CE3 in the third direction DR3 with the first interlayer insulating layer 141 interposed therebetween, so that the second capacitor PC2 may be provided.

The sixth capacitor electrode CE6 overlaps the fifth capacitor electrode CE5 in the third direction DR3 with the first interlayer insulating layer 141 interposed therebetween, so that the third capacitor PC3 may be provided.

The second conductive layers CE2, CE4, and CE6 on the first interlayer insulating layer 141 may be formed of a single layer or a multi-layer made of any one of molybdenum (Mo), aluminum (Al), chromium (Cr), gold (Au), titanium (Ti), nickel (Ni), neodymium (Nd), and copper (Cu), or an alloy thereof.

The second interlayer insulating layer 142 covering the second conductive layers CE2, CE4, and CE6 on the first interlayer insulating layer 141 may be formed of an inorganic film, for example, a silicon nitride layer, a silicon oxynitride layer, a silicon oxide layer, a titanium oxide layer, or an aluminum oxide layer. The second interlayer insulating layer 142 may be referred to as a third insulating film.

The third conductive layers VIL, GILk, GWLk, PWELk, HVDL1, GVAL1, SWPLk, GCLk, PAELk, TSTL, AVSL, DCE1, DCE2, and CCE1 to CCE8 on the second interlayer insulating layer 142 may include the gate lines extending in the first direction DR1, that is, the initialization voltage line VIL, the kth scan initialization line GILk, the kth scan write line GWLk, the kth light emitting line PWELk, the kth sweep signal line SWPLk, the kth scan control line GCLk, and the kth PAM light emitting line PAELk.

In addition, the third conductive layers VIL, GILk, GWLk, PWELk, HVDL1, GVAL1, SWPLk, GCLk, PAELk, TSTL, AVSL, DCE1, DCE2, and CCE1 to CCE8 on the second interlayer insulating layer 142 may further include the first gate voltage auxiliary line GVAL1 extending in the first direction DR1, the first power supply horizontal line HVDL1, the test signal line TSTL, and the third power supply auxiliary line AVSL.

In addition, the third conductive layers VIL, GILk, GWLk, PWELk, HVDL1, GVAL1, SWPLk, GCLk, PAELk, TSTL, AVSL, DCE1, DCE2, and CCE1 to CCE8 on the second interlayer insulating layer 142 may further include the first and second data connection electrodes DCE1 and DCE2, and first to eighth connection electrodes CCE1 to CCE8.

The third conductive layers VIL, GILk, GWLk, PWELk, HVDL1, GVAL1, SWPLk, GCLk, PAELk, TSTL, AVSL, DCE1, DCE2, and CCE1 to CCE8 on the second interlayer insulating layer 142 may be formed of a single layer or a multi-layer made of any one of molybdenum (Mo), aluminum (Al), chromium (Cr), gold (Au), titanium (Ti), nickel (Ni), neodymium (Nd), and copper (Cu), or an alloy thereof.

As shown in FIG. 18, the kth scan write line GWLk may be connected to the fourth sub-gate electrode G42 integrally formed with the first gate connection electrode GCE1 through the first gate contact hole GCT1 passing through the first interlayer insulating layer 141 and the second interlayer insulating layer 142.

As shown in FIG. 22, the kth scan write line GWLk may be connected to the eighth sub-gate electrode G112 integrally formed with the first gate connection electrode GCE1 through the third gate contact hole GCT3 passing through the first interlayer insulating layer 141 and the second interlayer insulating layer 142.

As described above, the first gate connection electrode GCE1 is integrally formed with the second gate electrode G2, the third sub-gate electrode G41, the fourth sub-gate electrode G42, the ninth gate electrode G9, the seventh sub-gate electrode G111, and the eighth sub-gate electrode G112. Accordingly, as shown in FIG. 12, the second transistor T2, the third and fourth sub-transistors T41 and T42 of the fourth transistor T4, the ninth transistor T9, and the seventh and eighth sub-transistors T111 and T112 of the eleventh transistor T11 may be turned on based on the scan write signal of the kth scan write line GWLk.

As shown in FIG. 19, the kth scan initialization line GILk may be connected to the second gate connection electrode GCE2 through the second gate contact hole GCT2 passing through the first interlayer insulating layer 141 and the second interlayer insulating layer 142. Here, the second gate connection electrode GCE2 is integrally formed with the first sub-gate electrode G31, the second sub-gate electrode G32, the fifth sub-gate electrode G101, and the sixth sub-gate electrode G102. Accordingly, as shown in FIG. 12, the first and second sub-transistors T31 and T32 of the third transistor T3, and the fifth and sixth sub-transistors T101 and T102 of the tenth transistor T10 may be turned on based on the scan initialization signal of the kth scan initialization line GILk.

As shown in FIG. 25, the kth PWM light emitting line PWELk may be connected to the sixth gate connection electrode GCE6 through the fourteenth contact hole CT14 passing through the first interlayer insulating layer 141 and the second interlayer insulating layer 142. Here, the sixth gate connection electrode GCE6 is integrally formed with the fifth gate electrode G5, the sixth gate electrode G6, the twelfth gate electrode G12, and the fourteenth gate electrode G14. Accordingly, as shown in FIG. 12, the fifth transistor T5, the sixth transistor T6, the twelfth transistor T12, and the fourteenth transistor T14 may be turned on based on the PWM light emitting signal of the kth PWM light emitting line PWELk.

As shown in FIG. 21, the kth scan control line GCLk may be connected to the third gate connection electrode GCE3 through the eighth contact hole CT8 passing through the first interlayer insulating layer 141 and the second interlayer insulating layer 142. Here, the third gate connection electrode GCE3 is integrally formed with the seventh gate electrode G7, the thirteenth gate electrode G13, the ninth sub-gate electrode G161, the tenth sub-gate electrode G162, and the eighteenth gate electrode G18. Accordingly, as shown in FIG. 12, the seventh transistor T7, the thirteenth transistor T13, the ninth and tenth sub-transistors T161 and T162 of the sixteenth transistor T16, and the eighteenth transistor T18 may be turned on based on the scan control signal of the kth scan control line GCLk.

As shown in FIG. 25, the kth PAM light emitting line PAELk may be connected to the fifth gate connection electrode GCE5 through the nineteenth contact hole CT19 passing through the first interlayer insulating layer 141 and the second interlayer insulating layer 142. The fifth gate connection electrode GCE5 is integrally formed with the seventeenth gate electrode G17. Accordingly, as shown in FIG. 12, the seventeenth transistor T17 may be turned on based on the PAM light emitting signal of the kth PAM light emitting line PAELk.

As shown in FIG. 19, the initialization voltage line VIL may be connected to the second sub-drain electrode D32 through the first power supply contact hole VCT1 passing through the gate insulating layer 130, the first interlayer insulating layer 141, and the second interlayer insulating layer 142. Here, the second sub-drain electrode D32 is integrally formed with the sixth sub-drain electrode D102.

As shown in FIG. 21, the initialization voltage line VIL may be connected to the tenth sub-drain electrode D162 and the eighteenth source electrode S18 through the ninth contact hole CT9 passing through the gate insulating layer 130, the first interlayer insulating layer 141, and the second interlayer insulating layer 142.

As shown in FIG. 25, the initialization voltage line VIL may be connected to the sixth capacitor electrode CE6 through the eighteenth contact hole CT18 passing through the second interlayer insulating layer 142.

Accordingly, as shown in FIG. 12, the third transistor T3, the sixteenth transistor T16, the third capacitor PC3, and the eighteenth transistor T18 may be connected to the initialization voltage line VIL through which the initialization voltage is supplied.

As shown in FIG. 20, the first power supply horizontal wiring HVDL1 may be connected to the fifth source electrode S5 and the thirteenth source electrode S13 through the second power supply contact hole VCT2 passing through the gate insulating layer 130, the first interlayer insulating layer 141, and the second interlayer insulating layer 142. Accordingly, as shown in FIG. 12, the fifth transistor T5 and the thirteenth transistor T13 may be connected to the first power supply line VDL1 through which the first power supply voltage VDD1 is supplied through the first power supply horizontal line HVDL1.

As shown in FIG. 21, the first gate voltage auxiliary line GVAL1 may be connected to the seventh source electrode S7 through the seventh contact hole CT7 passing through the gate insulating layer 130, the first interlayer insulating layer 141, and the second interlayer insulating layer 142. Accordingly, as shown in FIG. 12, the seventh transistor T7 may receive the first gate level voltage through the first gate voltage auxiliary line GVAL1.

As shown in FIG. 26, the test signal line TSTL may be connected to the nineteenth gate electrode G19 through the twenty-third contact hole CT23 passing through the first interlayer insulating layer 141 and the second interlayer insulating layer 142. Accordingly, as shown in FIG. 12, the nineteenth transistor T19 may be turned on based on the test signal of the test signal line TSTL.

In addition, the third power supply auxiliary line AVSL may be connected to the nineteenth drain electrode D19 through the twenty-fourth contact hole CT24 passing through the gate insulating layer 130, the first interlayer insulating layer 141, and the second interlayer insulating layer 142. Accordingly, the nineteenth transistor T19 may receive the third power supply voltage VSS through the third power supply auxiliary line AVSL.

As shown in FIG. 18, the first data connection electrode DCE1 may be connected to the second source electrode S2 through the first data contact hole DCT1 passing through the gate insulating layer 130, the first interlayer insulating layer 141, and the second interlayer insulating layer 142.

As shown in FIG. 22, the second data connection electrode DCE2 may be connected to the ninth source electrode S9 through the third data contact hole DCT3 passing through the gate insulating layer 130, the first interlayer insulating layer 141, and the second interlayer insulating layer 142.

As shown in FIG. 19, the first connection electrode CCE1 may be connected to the first gate electrode G1 through the first contact hole CT1 passing through the first interlayer insulating layer 141 and the second interlayer insulating layer 142. In addition, the first connection electrode CCE1 may be connected to the first sub-source electrode S31 and the fourth sub-drain electrode D42 through the second contact hole CT2 passing through the gate insulating layer 130, the first interlayer insulating layer 141, and the second interlayer insulating layer 142. Accordingly, as shown in FIG. 12, the gate electrode G1 of the first transistor T1 may be connected to the third transistor T3 and the fourth transistor T4.

As shown in FIG. 20, one side of the second connection electrode CCE2 may be connected to the thirteenth drain electrode D13 through the third contact hole CT3 passing through the gate insulating layer 130, the first interlayer insulating layer 141, and the second interlayer insulating layer 142.

As shown in FIG. 24, a part of the second connection electrode CCE2 may be connected to the fourteenth drain electrode D14 through the fourth contact hole CT4 passing through the gate insulating layer 130, the first interlayer insulating layer 141, and the second interlayer insulating layer 142. In addition, the other side of the second connection electrode CCE2 may be connected to the fourth capacitor electrode CE4 through the fifteenth contact hole CT15 passing through the second interlayer insulating layer 142.

Accordingly, as shown in FIG. 12, the second node N2 to which the thirteenth transistor T13, the fourteenth transistor T14, and the second capacitor PC2 are interconnected may be provided.

As shown in FIG. 21, the fourth connection electrode CCE4 may be connected to the ninth sub-source electrode S161 through the tenth contact hole CT10 passing through the gate insulating layer 130, the first interlayer insulating layer 141, and the second interlayer insulating layer 142.

In addition, as shown in FIG. 25, the fourth connection electrode CCE4 may be connected to the fourth gate connection electrode CCE4 through the seventeenth contact hole CT17 passing through the first interlayer insulating layer 141 and the second interlayer insulating layer 142. Here, the fourth gate connection electrode GCE4 is integrally formed with the fifth capacitor electrode CE5 and the fifteenth gate electrode G15.

Accordingly, as shown in FIG. 12, the third node N3 to which the sixteenth transistor T16, the third capacitor PC3, and the fifteenth transistor T15 are interconnected, may be provided.

As shown in FIGS. 14 and 23, the fifth connection electrode CCE5 may be connected to the twelfth source electrode S12 through the eleventh contact holes CT11 passing through the gate insulating layer 130, the first interlayer insulating layer 141, and the second interlayer insulating layer 142. Here, the twelfth source electrode S12 is provided in a pattern connected to the fourteenth source electrode S14.

As shown in FIG. 23, the sixth connection electrode CCE6 may be connected to the third capacitor electrode CE3 through the twelfth contact hole CT12 passing through the first interlayer insulating layer 141 and the second interlayer insulating layer 142. Here, the third capacitor electrode CE3 is integrally formed with the eighth gate electrode G8.

In addition, the sixth connection electrode CCE6 may be connected to the fifth sub-source electrode S101 and the eighth sub-drain electrode D112 through the thirteenth contact hole CT13 passing through the gate insulating layer 130, the first interlayer insulating layer 141, and the second interlayer insulating layer 142. Here, the fifth sub-source electrode S101 and the eighth sub-drain electrode D112 are provided in an interconnected pattern.

Accordingly, as shown in FIG. 12, the second capacitor PC2, the gate electrode G8 of the eighth transistor T8, the tenth transistor T10, and the eleventh transistor T11 may be interconnected.

As shown in FIGS. 15 and 24, the seventh connection electrode CCE7 may be connected to the seventeenth drain electrode D17 and the eighteenth drain electrode D18 through the sixteenth contact holes CT16 passing through the gate insulating layer 130, the first interlayer insulating layer 141, and the second interlayer insulating layer 142. Here, the seventeenth drain electrode D17 and the eighteenth drain electrode D18 are provided in an interconnected pattern.

Accordingly, as shown in FIG. 12, the seventeenth transistor T17 and the eighteenth transistor T18 may be interconnected.

As shown in FIG. 26, the eighth connection electrode CCE8 may be connected to the nineteenth source electrode S19 through the twenty-first contact hole CT21 passing through the gate insulating layer 130, the first interlayer insulating layer 141, and the second interlayer insulating layer 142.

The first planarization layer 160 covering the third conductive layers VIL, GILk, GWLk, PWELk, HVDL, GVAL1, SWPLk, GCLk, PAELk, TSTL, AVSL, DCE1, DCE2, and CCE1 to CCE8 on the second interlayer insulating layer 142 may be made of an organic layer such as an acrylic resin, an epoxy resin, a phenolic resin, a polyamide resin, or a polyimide resin. The first planarization layer 160 may be referred to as a fourth insulating film.

The fourth conductive layers DLj, VVDL, RDL, ANDE1, and VDCE on the first planarization layer 160 may include the jth data line DLj, the first power supply vertical line VVDL1, and the first PAM data line RDL.

In addition, the fourth conductive layers DLj, VVDL, RDL, ANDE1, and VDCE on the first planarization layer 160 may further include the first anode connection electrode ANDE1 and the second power connection electrode VDCE.

The fourth conductive layers DLj, VVDL, RDL, ANDE1, and VDCE on the first planarization layer 160 may be formed of a single layer or a multi-layer made of any one of molybdenum (Mo), aluminum (Al), chromium (Cr), gold (Au), titanium (Ti), nickel (Ni), neodymium (Nd), and copper (Cu), or an alloy thereof.

As shown in FIG. 18, the jth data line DLj may be connected to the first data connection electrode DCE1 through the second data contact hole DCT2 passing through the first planarization layer 160. The first data connection electrode DCE1 may be connected to the second source electrode S2 through the first data contact hole DCT1. Accordingly, as shown in FIG. 12, the second transistor T2 may be connected to the jth data line DLj.

As shown in FIG. 22, the first PAM data line RDL may be connected to the second data connection electrode DCE2 through the fourth data contact hole DCT4 passing through the first planarization layer 160. The second data connection electrode DCE2 may be connected to the ninth source electrode S9 through the third data contact hole DCT3.

Accordingly, as shown in FIG. 12, the ninth transistor T9 may be connected to the first PAM data line RDL.

As shown in FIG. 20, the first power supply vertical line VVDL1 may be connected to the first power supply horizontal line HVDL1 through the third power supply contact hole VCT3 passing through the first planarization layer 160. The first power supply horizontal line HVDL1 may be connected to the fifth source electrode S5 and the thirteenth source electrode S13 through the second power supply contact hole VCT2. Accordingly, as shown in FIG. 12, the fifth transistor T5 and the thirteenth transistor T13 may be connected to the first power supply line VDL1.

Here, the third power supply contact hole VCT3 may overlap the second power supply contact hole VCT2 in the third direction DR3. For example, an area of the third power supply contact hole VCT3 may be larger than an area of the second power supply contact hole VCT2.

As shown in FIG. 26, the first anode connection electrode ANDE1 may be connected to the seventh connection electrode CCE7 through the twentieth contact hole CT20 passing through the first planarization layer 160. The seventh connection electrode CCE7 may be connected to the seventeenth drain electrode D17 through the sixteenth contact hole (CT16 in FIG. 24). As shown in FIG. 15, the seventeenth drain electrode D17 may be provided in a pattern connected to the eighteenth drain electrode D18.

In addition, the first anode connection electrode ANDE1 may be connected to the eighth connection electrode CCE8 through the twenty-second contact hole CT22 passing through the first planarization layer 160. The eighth connection electrode CCE8 may be connected to the nineteenth source electrode S19 through the nineteenth contact hole CT21.

Accordingly, as shown in FIG. 12, the seventeenth transistor T17, the eighteenth transistor T18, and the nineteenth transistor T19 may be interconnected.

As shown in FIG. 22, the second power connection electrode VDCE may be connected to the fifth connection electrode CCE5 through the fourth power supply contact hole VCT4 passing through the first planarization layer 160. As shown in FIG. 14, the fifth connection electrode CCE5 may be connected to the twelfth source electrode S12 and the fourteenth source electrode S14 through the eleventh contact holes CT11.

Accordingly, as shown in FIG. 12, the twelfth transistor T12 and the fourteenth transistor T14 may be interconnected.

The second planarization layer 170 covering the fourth conductive layers DLj, VVDL1, RDL, ANDE1, and VDCE on the first planarization layer 160 may be formed of an organic film such as an acrylic resin, an epoxy resin, a phenol resin, a phenolic resin, a polyamide resin, or polyimide resin. The second planarization layer 170 may be referred to as a fifth insulating film.

The fifth conductive layers VDL2, VSL, and ANDE2 on the second planarization layer 170 may include the second power supply line VDL2, the third power supply line VSL, and the second anode connection electrode ANDE2.

As shown in FIG. 23, the second power supply line VDL2 may be connected to the second power supply connection electrode VDCE through a fifth power supply contact hole VCT5 passing through the second planarization layer 170. The second power supply connection electrode VDCE may be connected to the fifth connection electrode CCE5 through the fourth power supply contact hole VCT4, and the fifth connection electrode CCE5 may be connected to the twelfth source electrode S12 and the fourteenth source electrode S14 through the eleventh contact holes CT11.

Accordingly, as shown in FIG. 12, the twelfth transistor T12 and the fourteenth transistor T14 may be connected to the second power supply line VDL2.

In one or more embodiments, the third power supply line VSL may be formed of the fifth conductive layer on the second planarization layer 170, which is the same layer as the second power supply line VDL2. In this case, the third power supply line VSL may extend in the same direction as the second power supply line VDL2 and may be spaced from the second power supply line VDL2.

In one or more embodiments, the third power supply line VSL may be connected to the third power supply auxiliary line AVSL through a hole passing through the second planarization layer 170. The third power supply auxiliary line AVSL may be connected to the nineteenth drain electrode D19 through the twenty-fourth contact hole CT24. Accordingly, as shown in FIG. 12, the nineteenth transistor T19 may be connected to the third power supply line VSL.

In one or more embodiments, the third power supply line VSL may also be formed of the sixth conductive layer on the third planarization layer 180 other than the fifth conductive layer on the second planarization layer 170 in consideration of a layout for easily implementing the insulation between the second power supply line VDL2 and the third power supply line VSL.

As shown in FIG. 26, the second anode connection electrode ANDE2 may be connected to the first anode connection electrode ANDE1 through the hole passing through the second planarization layer 170.

The fifth conductive layers VDL2, VSL, and ANDE2 on the second planarization layer 170 may be formed of a single layer or a multi-layer made of any one of molybdenum (Mo), aluminum (Al), chromium (Cr), gold (Au), titanium (Ti), nickel (Ni), neodymium (Nd), and copper (Cu), or an alloy thereof.

The third planarization layer 180 covering the fifth conductive layers VDL2, VSL, and ANDE2 on the second planarization layer 170 may be formed of an organic film such as an acrylic resin, an epoxy resin, a phenolic resin, a polyamide resin, or polyimide resin. The third planarization layer 180 may be referred to as a fifth insulating film.

The sixth conductive layers AND and CTD on the third planarization layer 180 may include the anode electrode AND and the cathode electrode CTD of each of the plurality of sub-pixels RP, GP, and BP.

The anode electrode AND and the cathode electrode CTD in each of the plurality of sub-pixels RP, GP, and BP may be spaced from each other.

As shown in FIG. 26, the anode electrode AND may be connected to the second anode connection electrode ANDE2 through the hole passing through the third planarization layer 180. The second anode connection electrode ANDE2 may be connected to the first anode connection electrode ANDE1 through the hole passing through the second planarization layer 170, and the first anode connection electrode ANDE1 may be connected to the seventh connection electrode CCE7 through the twentieth contact hole CT20. As shown in FIG. 24, the seventh connection electrode CCE7 may be connected to the seventeenth drain electrode D17 and the eighteenth drain electrode D18 through the sixteenth contact holes CT16. Accordingly, as shown in FIG. 12, the light emitting element LE may be connected to the seventeenth transistor T17 and the eighteenth transistor T18.

In one or more embodiments, the cathode electrodes CTD of the sub-pixels adjacent in the first direction DR1 may be interconnected. For example, the cathode electrodes CTD of the sub-pixels RP, GP, and BP that configure any one pixel PX and are arranged in parallel in one direction may be formed in an interconnected pattern.

In addition, when the third power supply line VSL is formed of the fifth conductive layer on the second planarization layer 170, the cathode electrode CTD may be connected to the third power supply line VSL through the hole passing through the third planarization layer 180. Alternatively, when the third power supply line VSL is formed of the sixth conductive layer on the third planarization layer 180, the cathode electrode CTD may be provided in a pattern connected to the third power supply line VSL.

The sixth conductive layers AND and CTD on the third planarization layer 180 may be formed as a single layer or a multi-layer made of any one of molybdenum (Mo), aluminum (Al), chromium (Cr), gold (Au), titanium (Ti), nickel (Ni), neodymium (Nd), and copper (Cu), or an alloy thereof. For example, the sixth conductive layer may include a metallic material having a high reflectance such as a stacked structure of aluminum and titanium (Ti/Al/Ti), a stacked structure of aluminum and ITO (ITO/Al/ITO), an APC alloy, and a stacked structure of an APC alloy and ITO (ITO/APC/ITO). As another example, the sixth conductive layer may be formed in a double layer structure of Al/Ti.

The seventh conductive layers ANDP and CTDP on parts of the sixth conductive layers AND and CTD may include the anode pad ANDP covering the anode electrode AND and the cathode pad CTDP covering the cathode electrode CTD.

The seventh conductive layer may be made of a transparent conductive material (TCO) such as ITO and IZO.

As described above, by the anode pad ANDP and the cathode pad CTDP formed of the seventh conductive layer, the light emitting element LE may be fixed more firmly, and corrosion or damage to the anode AND and the cathode electrode CTD may be prevented.

In addition, the transistor array layer TFTL may further include the passivation layer PAS disposed on the third planarization layer 180 and covering at least a part of the edge of the anode pad ANDP and at least a part of the edge of the cathode pad CTDP.

For example, the passivation layer PAS may cover the rest of the edge of the anode pad ANDP other than a part facing the cathode pad CTDP. In addition, the passivation layer PAS may cover the rest of the edge of the cathode pad CTDP other than a part facing the anode pad ANDP. In other words, the passivation layer PAS may correspond to the periphery of the light emitting element LE.

The passivation layer PAS may be formed of a silicon nitride layer, a silicon oxynitride layer, a silicon oxide layer, a titanium oxide layer, or an aluminum oxide layer.

The anode pad ANDP may be connected to the first contact electrode CTE1 of the light emitting element LE through the anode contact electrode ANDC.

The cathode pad CTDP may be connected to the second contact electrode CTE2 of the light emitting element LE through the cathode contact electrode CTDC.

The anode contact electrode ANDC and the cathode contact electrode CTDC may be made of a conductive adhesive material.

Because the light emitting element LE has been described above with reference to FIG. 10, an overlapping description thereof will be omitted.

As described above, the display device 10 according to one or more embodiments may include the pixels PX disposed adjacent to the edge of the substrate SUB in order to reduce the visibility of the seaming part (SM in FIG. 1).

At this point, the pixels PX disposed adjacent to the edge of the substrate SUB may be relatively strongly exposed to external static electricity (ESD) and thus easily damaged. In order to prevent the above, the display device 10 according to one or more embodiments may further include an anti-ESD pattern layer.

Figure 28:
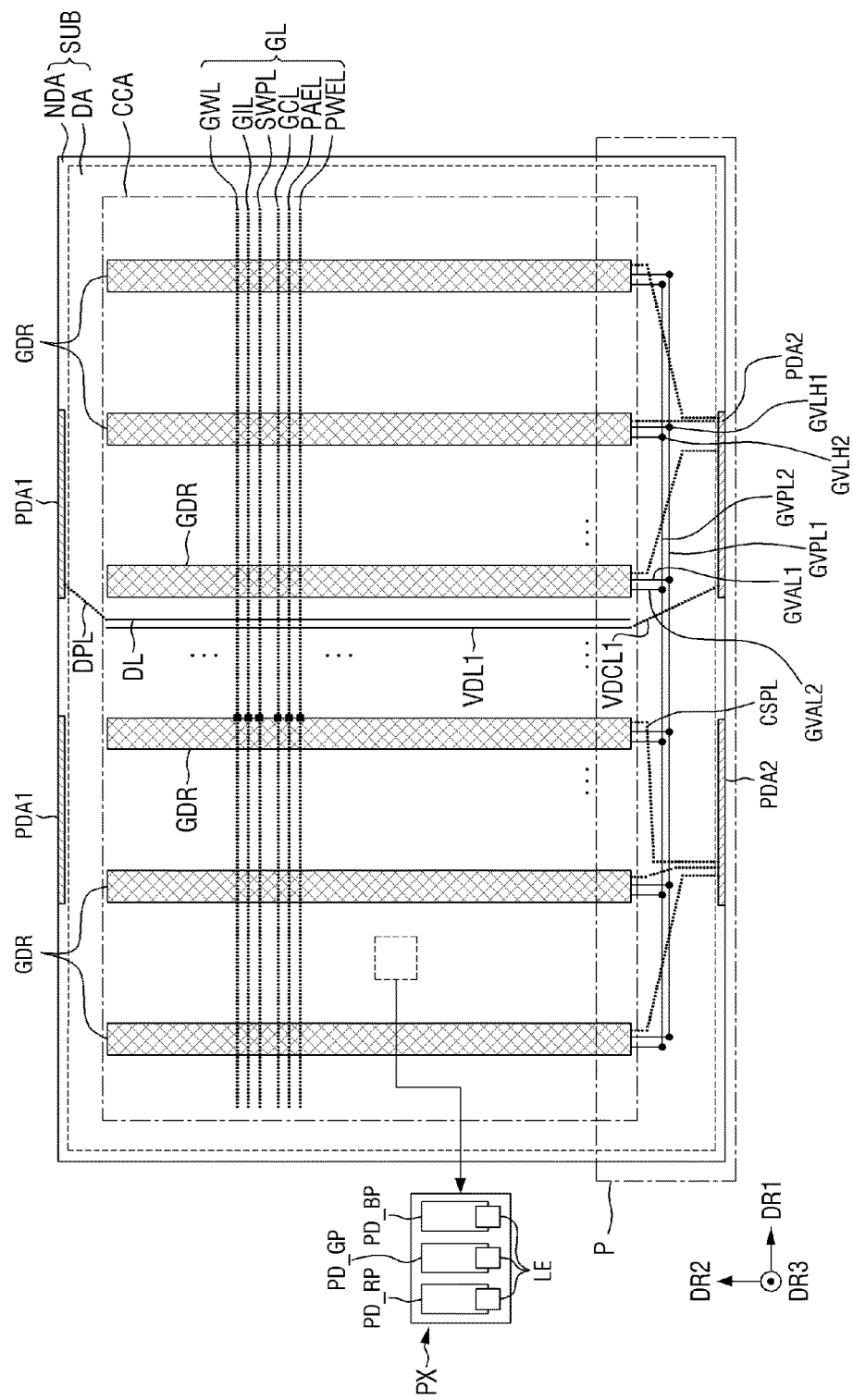
FIG. 28 is a layout view showing the display panel of the display device according to one or more embodiments.
Figure 29:
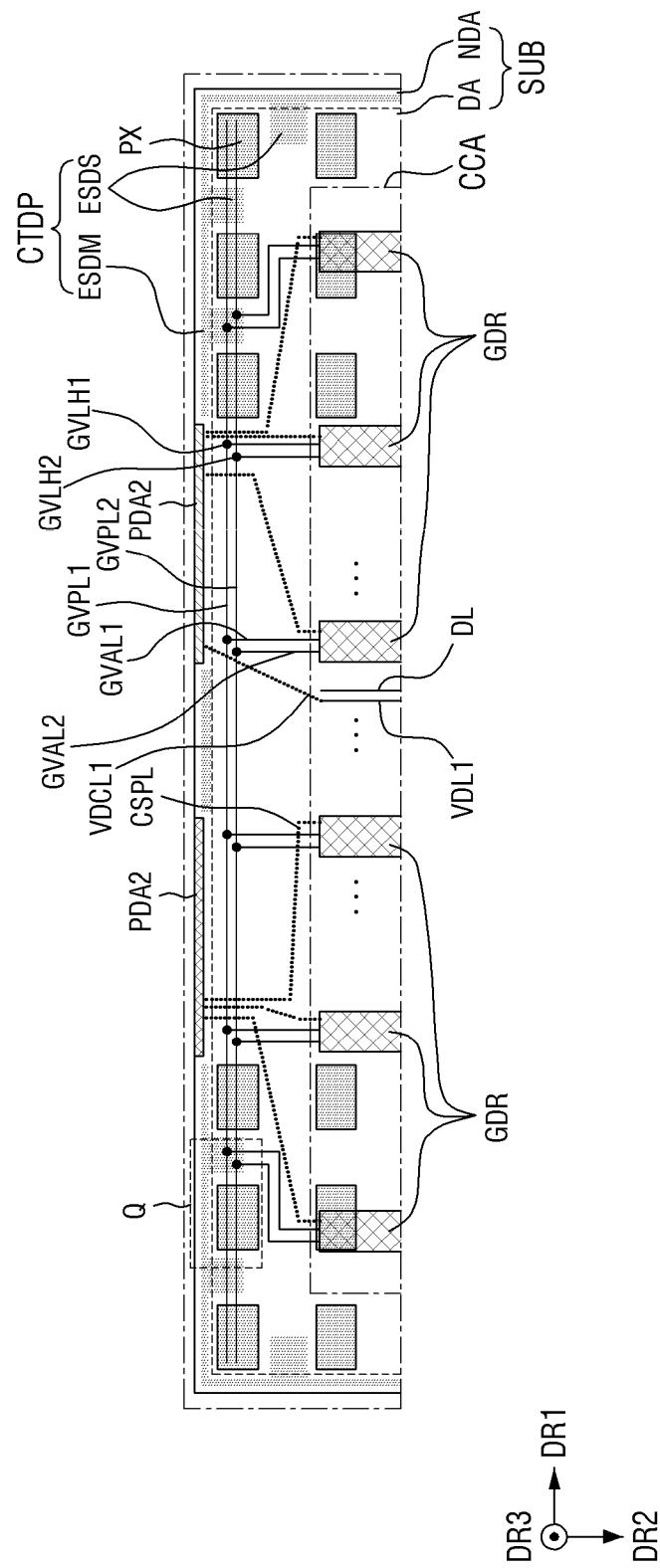
FIG. 29 is a layout view showing one example of an area Q in FIG. 28.

FIG. 28 is a layout view showing the display panel of the display device according to one or more embodiments. FIG. 29 is a layout view showing one example of an area Q in FIG. 28.

Figure 30:
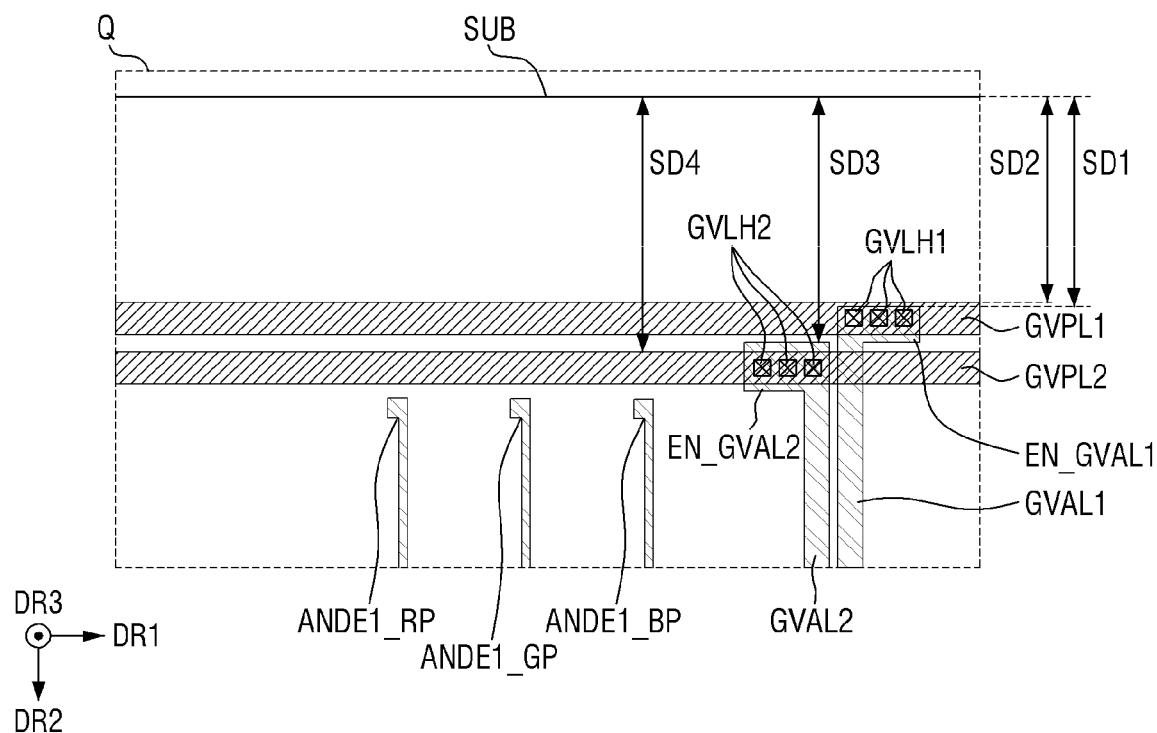
FIG. 30 is a layout view showing one example of the third conductive layer and the fourth conductive layer disposed in the area Q in FIG. 29.
Figure 31:
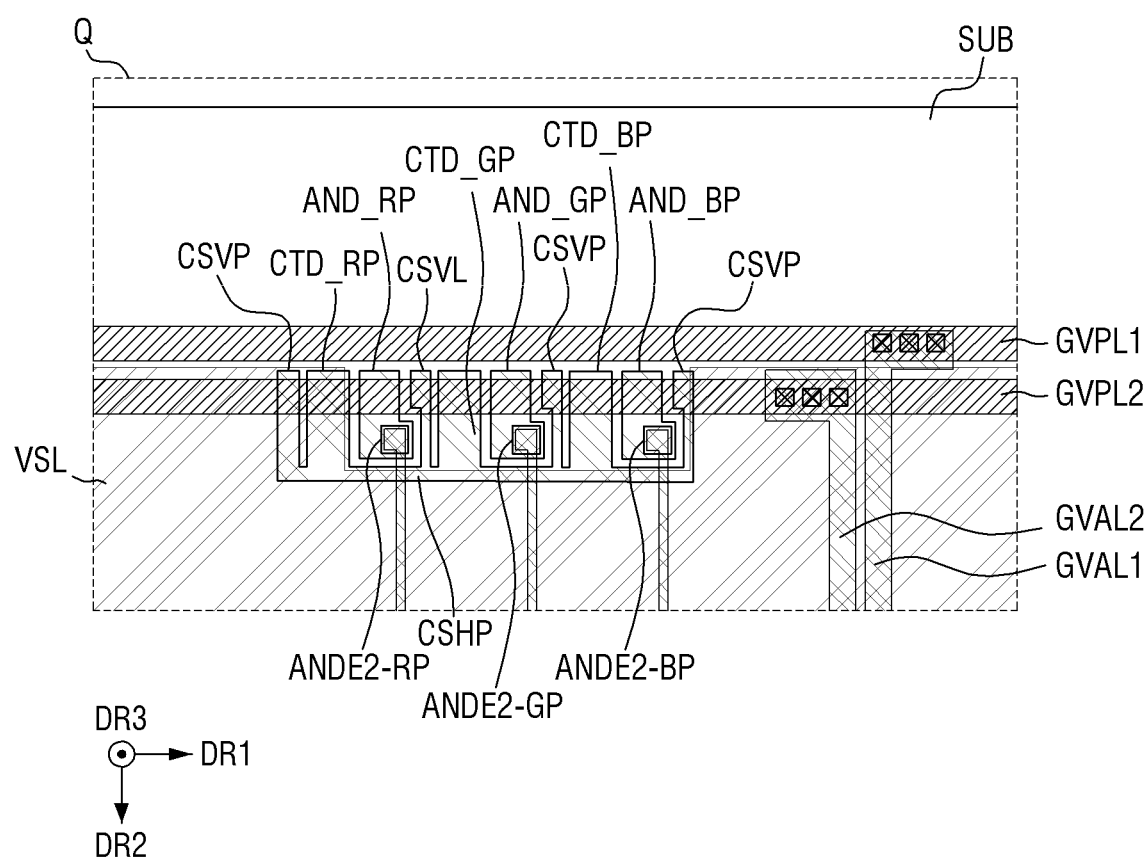
FIG. 31 is a layout view showing one example of the third conductive layer, the fourth conductive layer, the fifth conductive layer, and the sixth conductive layer disposed in the area Q in FIG. 29.
Figure 32:
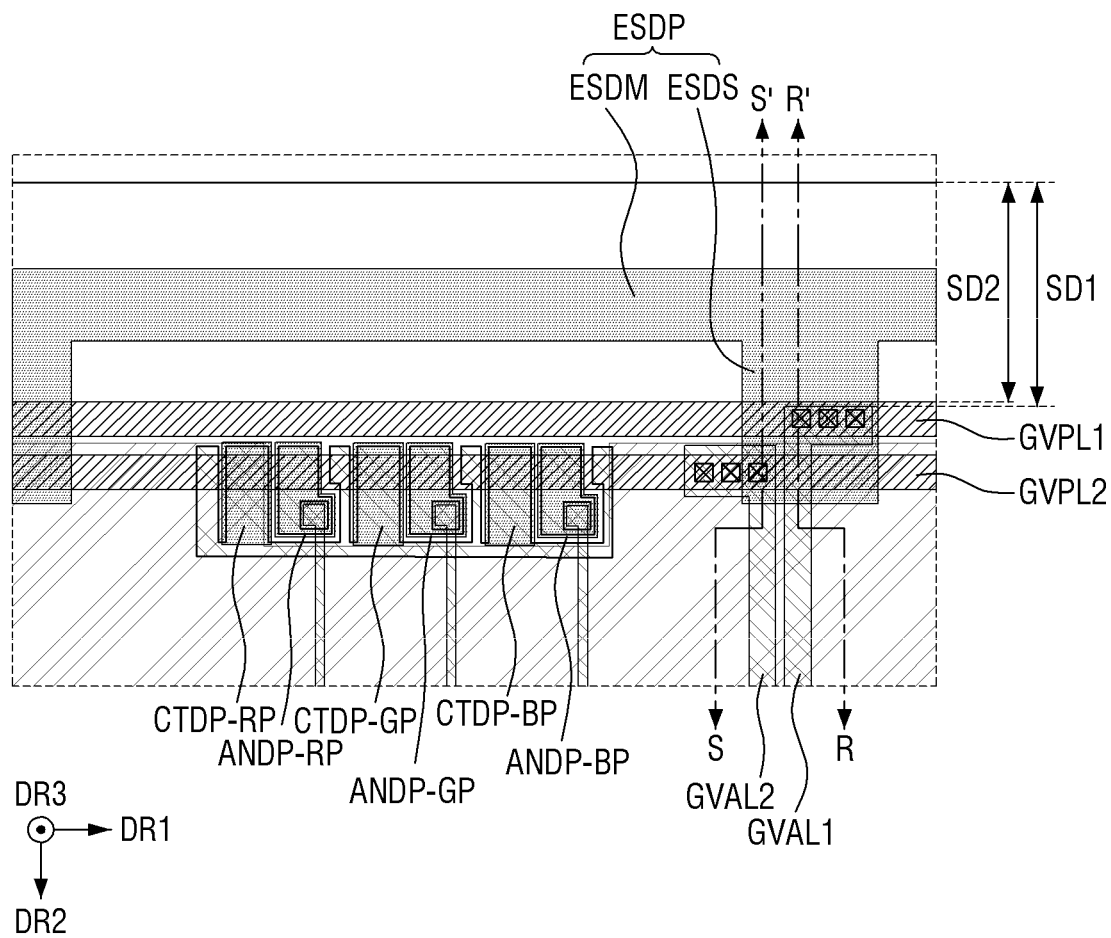
FIG. 32 is a layout view showing one example of the third conductive layer, the fourth conductive layer, the fifth conductive layer, the sixth conductive layer, and the seventh conductive layer disposed in the area Q in FIG. 29.

FIG. 30 is a layout view showing one example of the third conductive layer and the fourth conductive layer disposed in the area Q in FIG. 29. FIG. 31 is a layout view showing one example of the third conductive layer, the fourth conductive layer, the fifth conductive layer, and the sixth conductive layer disposed in the area Q in FIG. 29. FIG. 32 is a layout view showing one example of the third conductive layer, the fourth conductive layer, the fifth conductive layer, the sixth conductive layer, and the seventh conductive layer disposed in the area Q in FIG. 29.

For convenience of illustration and description, FIGS. 28 and 29 show that some components of the display panel 100 are selected, and the arrangement form, size, and number of the selected components are modified, and the display panel 100 according to one or more embodiments is not limited to that shown in FIGS. 28 and 29.

Referring to FIG. 28, the display panel 100 of the display device 10 according to one or more embodiments includes a substrate SUB including a display area DA in which a plurality of sub-pixels RP, GP, and BP are arranged and a non-display area NDA that is a periphery of the display area DA, a transistor array layer TFTL disposed on a first surface of the substrate SUB, and a plurality of light emitting elements LE disposed in the display area DA on the transistor array layer TFTL and corresponding to the plurality of sub-pixels RP, GP, and BP, respectively.

The transistor array layer TFTL includes a plurality of pixel drivers PD_RP, PD_GP, and PD_BP disposed in a circuit area CCA formed as a part of the display area DA, respectively corresponding to the plurality of sub-pixels RP, GP, and BP, and each including at least one transistor, two or more gate drivers GDR disposed in the circuit area CCA, spaced from each other in one direction DR1, and supplying each signal to gate lines (GL: GWL, GIL, SWPL, GCL, PAEL, and PWEL) connected to the plurality of pixel drivers PD_RP, PD_GP, and PD_BP, a first gate voltage supply line GVPL1 disposed in a part of the periphery of the circuit area CCA of the display area DA and extending in one direction (e.g., the first direction DR1), and two or more first gate voltage auxiliary lines GVAL1 extending in the other direction (e.g., the second direction DR2) crossing the one direction DR1 and connected between each of the two or more gate drivers GDR and the first gate voltage supply line GVPL1.

Referring to FIGS. 29 and 30, one end EN_GVAL1 of each of the two or more first gate voltage auxiliary lines GVAL1 is connected to the first gate voltage supply line GVPL1 through at least one first gate voltage line contact hole GVLH1. In other words, the two or more first gate voltage auxiliary lines GVAL1 may be disposed on a layer different from the first gate voltage supply line GVPL1 and connected to the first gate voltage supply line GVPL1 through the at least one first gate voltage line contact hole GVLH1 passing through an insulating film between the two or more first gate voltage auxiliary lines GVAL1 and the first gate voltage supply line GVPL1.

Referring to FIG. 30, the one end EN_GVAL1 of each of the two or more first gate voltage auxiliary lines GVAL1 is further spaced from the edge of the substrate SUB adjacent to the first gate voltage supply line GVPL1 than the first gate voltage supply line GVPL1.

In other words, the one end EN_GVAL1 of each of the two or more first gate voltage auxiliary lines GVAL1 may be spaced from the edge of the substrate SUB by a suitable first interval SD1 (e.g., a predetermined first interval SD1), and the first gate voltage supply line GVPL1 may be spaced from the edge of the substrate SUB by a second interval SD2 smaller than the first interval SD1.

In other words, the one end EN_GVAL1 of each of the two or more first gate voltage auxiliary lines GVAL1 extends by a width that reaches at least one first gate voltage line contact hole CVLH1 for connection with the first gate voltage supply line GVPL1 and does not extend to be closer to the edge of the substrate SUB beyond the first gate voltage supply line GVPL1.

Accordingly, a short-circuit defect between the lines disposed at the edge of the substrate SUB may be prevented.

In addition, the one end EN_GVAL1 of each of the two or more first gate voltage auxiliary lines GVAL1 may extend in the first direction DR1 like the first gate voltage supply line GVPL1 and overlap the first gate voltage supply line GVPL1.

Accordingly, because an overlapping area between the one end EN_GVAL1 of each of the two or more first gate voltage auxiliary lines GVAL1 and the first gate voltage supply line GVPL1 may be increased, two or more first gate voltage line contact holes GVLH1 spaced from each other may be provided. As described above, by increasing the number of first gate voltage line contact holes GVLH1, it is possible to reduce the resistance to the electrical connection between the one end EN_GVAL1 of each of the two or more first gate voltage auxiliary lines GVAL1 and the first gate voltage supply line GVPL1.

As shown in FIGS. 28, 29, and 30, the transistor array layer TFTL of the display panel 100 of the display device 10 according to one or more embodiments may further include a second gate voltage supply line GVPL2 disposed around the circuit area CCA of the display area DA, and two or more second gate voltage auxiliary lines GVAL2 connected between each of the two or more gate drivers GDR and the second gate voltage supply line GVPL2.

The second gate voltage supply line GVPL2 is disposed around the circuit area CCA of the display area DA, and extends in one direction (e.g., the first direction DR1). In other words, the second gate voltage supply line GVPL2 may be disposed in parallel with the first gate voltage supply line GVPL1.

In addition, the second gate voltage supply line GVPL2 may be further spaced from the edge of the substrate SUB than the first gate voltage supply line GVPL1. In other words, the first gate voltage supply line GVPL1 of the first and second gate voltage supply lines GVPL1 and GVPL2 is disposed closer to the edge of the substrate SUB.

One end EN_GVAL2 of each of the two or more second gate voltage auxiliary lines GVAL2 is connected to the second gate voltage supply line GVPL2 through at least one second gate voltage line contact hole GVLH2.

Here, unlike the two or more first gate voltage auxiliary lines GVAL1, the one end EN_GVAL2 of each of the two or more second gate voltage auxiliary lines GVAL2 may be closer to the edge of the substrate SUB adjacent to the first gate voltage supply line GVPL1 than the second gate voltage supply line GVPL2.

In other words, the one end EN_GVAL2 of each of the two or more second gate voltage auxiliary lines GVAL2 may be spaced from the edge of the substrate SUB by a third interval SD3 greater than the first interval SD1. In addition, the second gate voltage supply line GVPL2 may be spaced from the edge of the substrate SUB by a fourth interval SD4 greater than the third interval SD3.

This is because as the second gate voltage supply line GVPL2 is farther spaced from the edge of the substrate SUB than the first gate voltage supply line GVPL1, the possibility in which the short-circuit defect of the two or more second gate voltage auxiliary lines GVAL2 occurs is relatively low. Accordingly, the two or more second gate voltage auxiliary lines GVAL2 may be disposed to have a width that completely covers the second gate voltage supply line GVPL2, thereby increasing an alignment error resulting in connection defect to facilitate the manufacturing process.

In addition, the one end EN_GVAL2 of each of the two or more second gate voltage auxiliary lines GVAL2 may extend in the first direction DR1 like the second gate voltage supply line GVPL2 and overlap the second gate voltage supply line GVPL2.

Accordingly, because an overlapping area between the one end EN_GVAL2 of each of the two or more second gate voltage auxiliary lines GVAL2 and the second gate voltage supply line GVPL2 may be increased, two or more second gate voltage line contact holes GVLH2 spaced from each other may be provided. As described above, by increasing the number of second gate voltage line contact holes GVLH2, it is possible to reduce the resistance to the electrical connection between the one end EN_GVAL2 of each of the two or more second gate voltage auxiliary lines GVAL2 and the second gate voltage supply line GVPL2.

As shown in FIGS. 28 and 29, the display panel 100 of the display device 10 according to one or more embodiments includes a plurality of pixels PX arranged in the display area DA. Each of the plurality of pixels PX may include the sub-pixels RP, GP, and BP adjacent to each other in the first direction DR1 or the second direction DR2.

Because the display area DA includes the circuit area CCA formed as a part of the central portion, some of the plurality of pixels PX may be disposed in the circuit area CCA of the display area DA, and the others may be disposed around the circuit area CCA adjacent to the edge of the substrate SUB. In other words, the anode electrodes AND and the cathode electrodes CTD of the plurality of sub-pixels RP, GP, and BP are arranged in the display area DA, whereas the pixel drivers PD_RP, PD_GP, and PD_BP of the plurality of sub-pixels RP, GP, BP may be limitedly disposed in the circuit area CCA.

In other words, the light emitting element LE of each of the sub-pixels RP, GP, and BP corresponding to the pixels PX disposed in the circuit area CCA may be disposed adjacent to each of the pixel drivers PD_RP, PD_GP, and PD_BP in the first direction DR1 or the second direction DR2.

In one or more embodiments, the light emitting elements LE of the sub-pixels RP, GP, and BP corresponding to the pixels PX disposed around the circuit area CCA may be connected to each of the pixel drivers PD_RP, PD_GP, and PD_BP disposed in the circuit area CCA. To this end, the first anode connection electrode ANDE1 or the second anode connection electrode ANDE2 of the sub-pixels RP, GP, and BP disposed around the circuit area CCA may extend to the periphery of the circuit area CCA in the circuit area CCA.

For example, as shown in FIG. 30, the first anode connection electrodes ANDE1 of the sub-pixels RP, GP, and BP disposed around the circuit area CCA may extend from the circuit area CCA to the edge of the display area DA in the second direction DR2.

Because the pixel drivers PD_RP, PD_GP, and PD_BP of the plurality of sub-pixels RP, GP, and BP shown in FIG. 27 have been described with reference to FIGS. 12 to 27, an overlapping description thereof will be omitted.

As shown in FIG. 28, the two or more gate drivers GDR may be disposed separately in some areas in which the pixel drivers PD_RP, PD_GP, and PD_BP of the plurality of sub-pixels RP, GP, and BP are not disposed in the circuit area CCA. Accordingly, it is possible to prevent the width of the non-display area NDA from increasing in order to dispose the gate driver GDR.

Each of the two or more gate drivers GDR may include at least one of the first scan signal driver (SCDR1 in FIG. 11), the second scan signal driver (SCDR2 in FIG. 11), the sweep signal driver (SWDR in FIG. 11), and the light emitting signal driver (EMDR in FIG. 11). For example, each of the two or more gate drivers GDR may include the first scan signal driver (SCDR1 in FIG. 11), the second scan signal driver (SCDR2 in FIG. 11), the sweep signal driver (SWDR in FIG. 11), and the light emitting signal driver (EMDR in FIG. 11).

Alternatively, each of the two or more gate drivers GDR may be composed of any one of the first scan signal driver (SCDR1 in FIG. 11), the second scan signal driver (SCDR2 in FIG. 11), the sweep signal driver (SWDR in FIG. 11), and the light emitting signal driver (EMDR in FIG. 11).

However, this is merely illustrative, and according to one or more embodiments, the two or more gate drivers GDR may be modified into any form except that the two or more gate drivers GDR are separately disposed in the circuit area CCA and each signal is supplied to the plurality of gate lines GL. Because the plurality of gate lines GL have already been described with reference to FIGS. 11 and 12, an overlapping description thereof will be omitted.

In order to reduce the visibility of the seaming part (SM in FIG. 1) of the tile-shaped display device (TD in FIG. 1), the non-display area NDA of each display device 10 may be formed to have a width smaller than a separation distance between the pixels PX.

As shown in FIG. 28, the non-display area NDA may include a first pad area PDA1 adjacent to one side of the display area DA in the second direction DR2, and a second pad area PDA2 adjacent to the other side of the display area DA in the second direction DR2.

The transistor array layer TFTL may further include pads disposed in the first pad area PDA1 and the second pad area PDA2.

For example, the pads of the first pad area PDA1 may be disposed under the second surface of the substrate SUB through the side surface line (SSL in FIG. 5) and the connection line CCL, and connected to the flexible film on which the integrated circuit chips of the source drivers (200 in FIG. 11) configured to supply each signal to the data lines DL are mounted. Here, the flexible film on which the integrated circuit chips of the source drivers (200 in FIG. 11) are mounted may be disposed adjacent to the first pad area PDA1.

The pads of the first pad area PDA1 may be connected to each of the data lines DL through the data pad lines DPL. The data pad line DPL may be disposed around the circuit area CCA of the display area DA.

In addition, the pads of the second pad area PDA2 may be disposed under the second surface of the substrate SUB through the side surface line (SSL in FIG. 5) and the connection line CCL, and connected to the flexible film on which the integrated circuit chip of the power supply unit (400 in FIG. 11) configured to supply various voltages is mounted.

The power supply unit 400 may output the first PAM data voltage corresponding to the first sub-pixel RP, the second PAM data voltage corresponding to the second sub-pixel GP, the third PAM data voltage corresponding to the third sub-pixel BP, the first power supply voltage VDD1, the second power supply voltage VDD2, the third power supply voltage VSS, the initialization voltage VINT, and the gate level voltages VGL and VGH.

Here, the flexible film on which the integrated circuit chip of the power supply unit 400 is mounted may be disposed adjacent to the second pad area PDA2.

The pads of the second pad area PDA2 may include a pad connected to the first power supply line VDL1 through the first power supply connection line VDCL1, a pad connected to the two or more gate drivers GDR through a control signal supply line CSPL, a pad connected to the first gate voltage supply line GVPL1, and a pad connected to the second gate voltage supply line GVPL2.

In addition, the pads of the second pad area PDA2 may further include a pad connected to the second power supply line VDL2.

The first power supply connection line VDCL1 and the control signal supply line CSPL may be disposed around the circuit area CCA of the display area DA.

The first gate voltage supply line GVPL1 may be connected to at least one pad disposed in the second pad area PDA2.

Accordingly, the first gate voltage supply line GVPL1 and the two or more first gate voltage auxiliary lines GVAL1 connected thereto may transmit a suitable first gate level voltage (e.g., a predetermined first gate level voltage, e.g., VGH)) supplied from the power supply unit 400 to the two or more gate drivers GDR.

In addition, the first gate voltage auxiliary lines GVAL1 may be further connected to the pixel drivers PD_RP, PD_GP, and PD_BP of the plurality of sub-pixels RP, GP, and BP arranged in the circuit area CCA.

The first gate voltage supply line GVPL1 and the two or more first gate voltage auxiliary lines GVAL1 connected thereto may transmit the suitable first gate level voltage (e.g., a predetermined first gate level voltage, e.g., VGH in FIG. 11) supplied from the power supply unit (400 in FIG. 11) to the two or more gate drivers GDR. In addition, the two or more first gate voltage auxiliary lines GVAL1 may also be connected to the pixel drivers PD_RP, PD_GP, and PD_BP of the plurality of sub-pixels RP, GP, and BP to transmit the suitable first gate level voltage (e.g., a predetermined first gate level voltage, e.g., VGH in FIG. 11).

In addition, the second gate voltage supply line GVPL2 and the two or more second gate voltage auxiliary lines GVAL2 connected thereto may transmit a second gate level voltage (e.g., VGL in FIG. 11) supplied from the power supply unit (400 in FIG. 11) and having a voltage level different from the first gate level voltage to the two or more gate drivers GDR. For example, the second gate level voltage may be a voltage level lower than the first gate level voltage.

Referring to FIG. 31, the transistor array layer TFTL of the display panel 100 of the display device 10 according to one or more embodiments may further include the fifth conductive layer on the second planarization layer 170 covering the fourth conductive layer including the first gate voltage supply line GVPL1, the second gate voltage supply line GVPL2, etc.

The fifth conductive layer on the second planarization layer 170 may include the third power supply line VSL and the second anode connection electrodes ANDE2_RP, ANDE2_GP, and ANDE2_BP of each of the plurality of sub-pixels RP, GP, and BP.

The third power supply line VSL is spaced from the second anode connection electrodes ANDE2_RP, ANDE2_GP, and ANDE2_BP of each of the plurality of sub-pixels RP, GP, and BP.

In addition, the fifth conductive layer may further include the third power supply line VSL and the second power supply line (VDL2 in FIG. 17) spaced from the second anode connection electrodes ANDE2_RP, ANDE2_GP, and ANDE2_BP.

The transistor array layer TFTL of the display panel 100 of the display device 10 according to one or more embodiments may further include the sixth conductive layer disposed on the third planarization layer 180 covering the fifth conductive layer including the third power supply line VSL and the second anode connection electrodes ANDE2_RP, ANDE2_GP, and ANDE2_BP of each of the plurality of sub-pixels, and the like.

The sixth conductive layer on the third planarization layer 180 may include the anode electrodes AND_RP, AND_GP, and AND_BP and the cathode electrodes CTD_RP, CTD_GP, and CTD_BP of each of the plurality of sub-pixels RP, GP, and BP.

In addition, the sixth conductive layer may further include a cathode vertical pattern CSVP and a cathode horizontal pattern CSHP.

The cathode vertical pattern CSVP is disposed between the sub-pixels RP, GP, and BP configuring each pixel PX and at both sides of each pixel PX in the first direction, and extends in the second direction DR2.

The cathode horizontal pattern CSHP is connected to the cathode electrodes CTD_RP, CTD_GP, and CTD_BP of the sub-pixels RP, GP, and BP configuring each pixel PX and the cathode vertical pattern CSVP, and extends in the first direction DR1.

As shown in FIG. 32, the transistor array layer TFTL of the display panel 100 of the display device 10 according to one or more embodiments may further include the seventh conductive layer disposed on a part of the sixth conductive layer including the anode electrodes AND_RP, AND_GP, and AND_BP and the cathode electrodes CTD_RP, CTD_GP, and CTD_BP and the third planarization layer 180.

The seventh conductive layer may include anode pads ANDP_RP, ANDP_GP, and ANDP_BP and cathode pads CTDP_RP, CTDP_GP, and CTDP_BP of each of the plurality of sub-pixels RP, GP, and BP.

The display panel 100 of the display device 10 according to one or more embodiments may further include an anti-ESD pattern layer ESDP disposed in a part of the non-display area NDA of the first surface of the substrate SUB and formed of the seventh conductive layer.

The anti-ESD pattern layer ESDP may include a main pattern ESDM disposed in parallel with the edge of the display area DA, and a plurality of sub-patterns ESDS protruding from the main pattern ESDM toward the display area DA.

The plurality of sub-patterns ESDS may each be disposed between the pixels adjacent to the main pattern ESDM among the plurality of pixels PX.

It is possible to prevent external static electricity from being introduced due to the anti-ESD pattern layer ESDP, thereby preventing the light emitting elements LE or the pixel drivers PD_RP, PD_GP, and PD_BP of the sub-pixels RP, GP, and BP that are disposed adjacent to the edge of the substrate SUB and relatively largely affected by the static electricity (ESD) from being damaged.

The plurality of sub-patterns ESDS each disposed between the pixels adjacent to the main pattern ESDM from among the plurality of pixels PX, may overlap a part of the first gate voltage supply line GVPL1 and a part of the second gate voltage supply line GVPL2.

In particular, at least one of the plurality of sub-patterns ESDS may overlap the first gate voltage line contact hole GVLH1 between the first gate voltage supply line GVPL1 and the first gate voltage auxiliary line GVAL1.

In addition, at least one of the plurality of sub-patterns ESDS may overlap the second gate voltage line contact hole GVLH2 between the second gate voltage supply line GVPL2 and the second gate voltage auxiliary line GVAL2.

Accordingly, it is possible to prevent the conductive layer or the insulating film from being damaged by the introduction of the static electricity (ESD) through the first gate voltage line contact hole GVLH1 and the second gate voltage line contact hole GVLH2.

The anti-ESD pattern layer ESDP may be formed of the seventh conductive layer that is the same layer as the anode pad (ANDP in FIG. 27) and the cathode pad (CTDP in FIG. 27).

In addition, the pads (PADs in FIG. 5) disposed in the first and second pad areas (PDA1 and PDA2 in FIGS. 28 and 29) of the non-display area NDA may include a second pad layer PAD2 formed of the seventh conductive layer.

Accordingly, in order to insulate the pads (PAD in FIG. 5) disposed in the first and second pad areas PDA1 and PDA2 and the anti-ESD pattern layer ESDP, the anti-ESD pattern layer ESDP may be spaced from the first and second pad areas PDA1 and PDA2.

In one or more embodiments, as shown in FIGS. 5 and 18 to 27, the transistor array layer TFTL of the display panel 100 may include the first planarization layer 160 covering the third conductive layers VIL, GILk, GWLk, PWELk, HVDL1, GVAL1, SWPLk, GCLk, PAELk, TSTL, AVSL, DCE1, DCE2, and CCE1 to CCE8, the second planarization layer 170 covering the fourth conductive layers DLj, VVDL, RDL, ANDE1, and VDCE on the first planarization layer 160, and the third planarization layer 180 covering the fifth conductive layers VDL2, VSL, and ANDE2 on the second planarization layer 170.

Here, each of the first, second, and third planarization layers 160, 170, and 180 may be formed of an organic film such as an acrylic resin, an epoxy resin, a phenolic resin, a polyamide resin, or a polyimide resin.

The first, second, and third planarization layers 160, 170, and 180 each formed of an organic layer, are disposed to have a thickness relatively greater than those of the buffer layer BF, the gate insulating layer 130, the first interlayer insulating layer 141, and the second interlayer insulating layer 142 each formed of an inorganic layer.

Accordingly, as shown in FIG. 5, in order to prevent the side surface line (SSL in FIG. 5) from being disconnected by a stepped portion corresponding to the thicknesses of the first, second, and third planarization layers 160, 170, and 180, the edges of the first, second, and third planarization layers 160, 170, and 180 may be formed in a step shape.

In other words, the edge of the third planarization layer 180 is further spaced from the edge of the substrate SUB than the edge of the second planarization layer 170 at the edge of the non-display area NDA corresponding to the edge of the substrate SUB or the edge of the display area DA adjacent to the non-display area NDA, so that the edge of the second planarization layer 170 may be exposed without being covered by the third planarization layer 180. Likewise, the edge of the first planarization layer 160 may be closer to the edge of the substrate SUB than the edge of the second planarization layer 170 and exposed without being covered with the second planarization layer 170.

As described above, the edges of the first, second, and third planarization layers 160, 170, and 180 are formed in a step shape at the edge of the non-display area NDA corresponding to the edge of the substrate SUB or the edge of the display area DA adjacent to the non-display area NDA, so that the short-circuit defect between the lines can be induced.

For example, because the first gate voltage supply line GVPL1 is disposed at the edge of the display area DA, the edge of the second planarization layer 170 may be disposed between the first gate voltage supply line GVPL1 and the edge of the substrate SUB.

Figure 33:
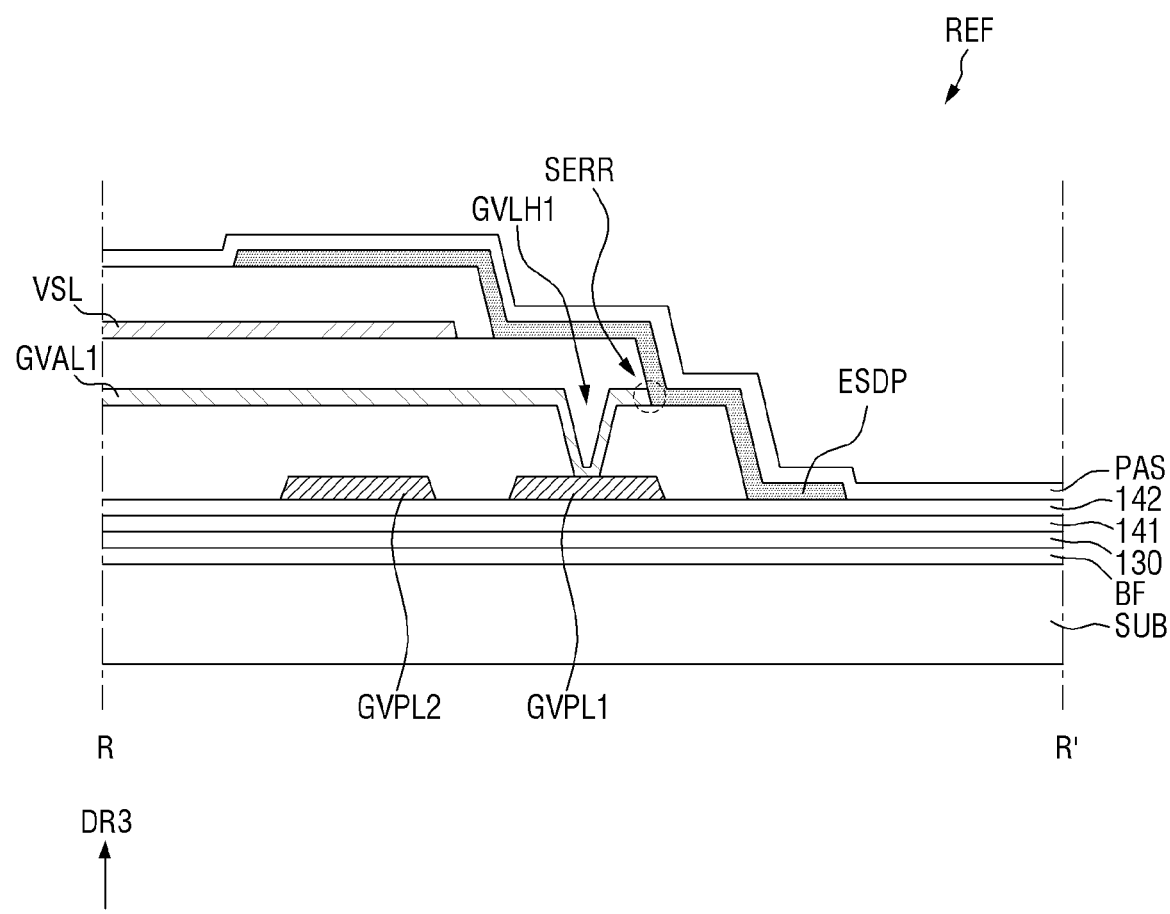
FIG. 33 is a cross-sectional view taken along the line R-R' in FIG. 32 and showing a comparative example of a short-circuit defect.
Figure 34:
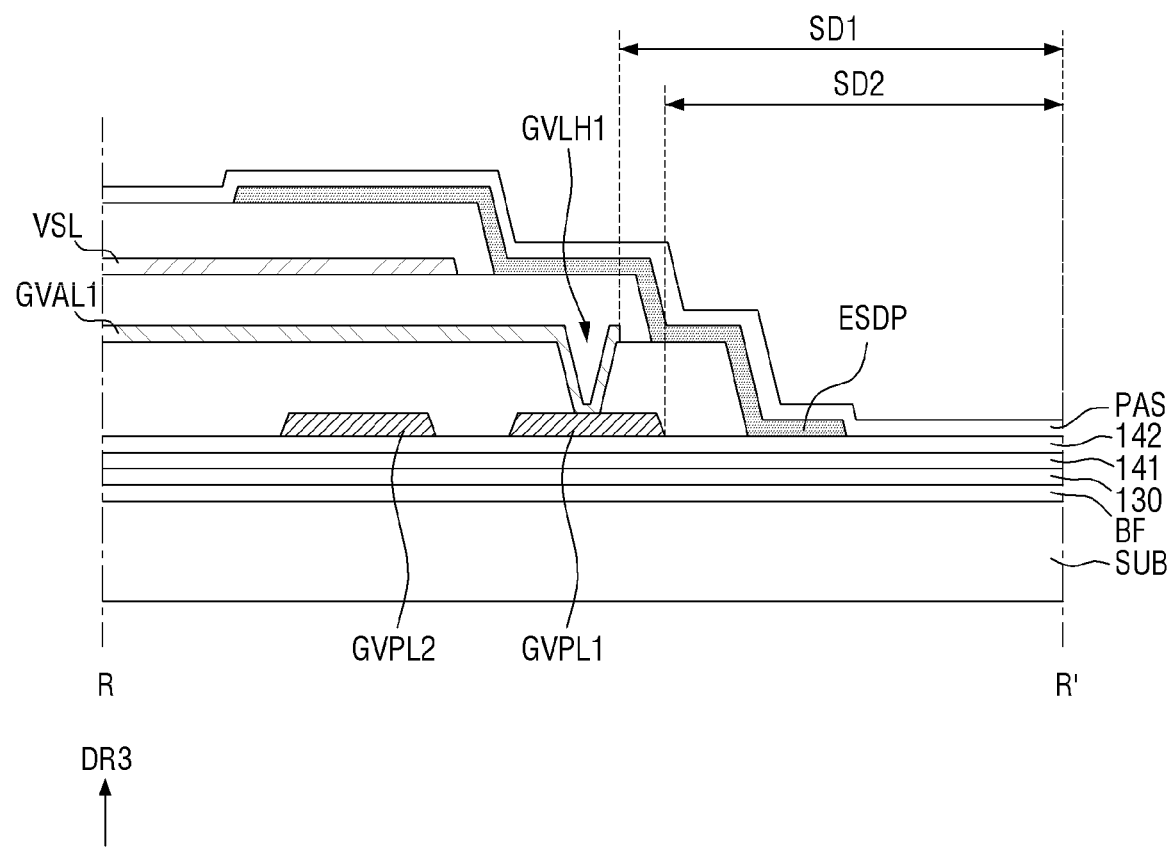
FIG. 34 is a cross-sectional view showing one example of a surface taken along the line R-R' in FIG. 32.
Figure 35:
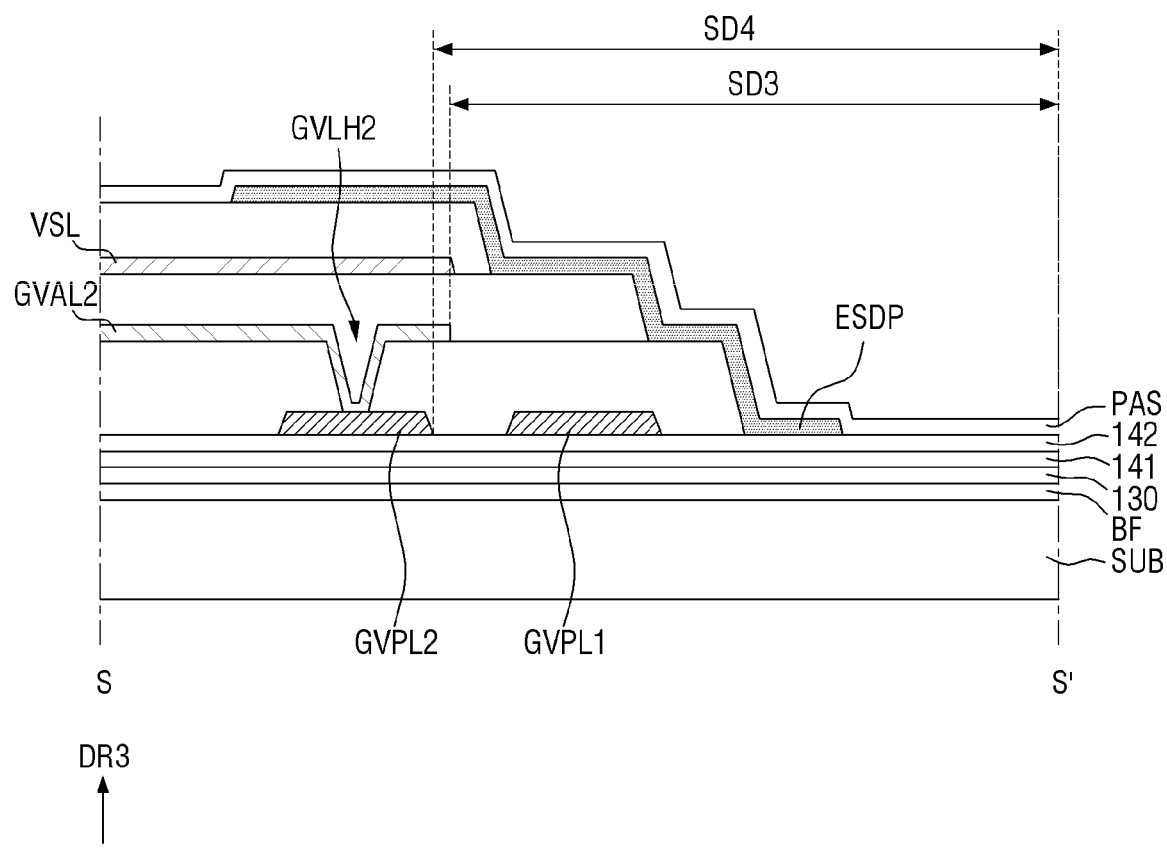
FIG. 35 is a cross-sectional view showing one example of a surface taken along the line S-S' in FIG. 32.

FIG. 33 is a cross-sectional view showing a comparative example of short-circuit defects. FIG. 34 is a cross-sectional view showing one example of a surface taken along the line R-R' in FIG. 32. FIG. 35 is a cross-sectional view showing one example of a surface taken along the line S-S' in FIG. 32.

Referring to FIG. 33, when the two or more first gate voltage auxiliary lines GVAL1 are formed of the fourth conductive layer on the first planarization layer 160, a part of the one end EN_GVAL1 of the two or more first gate voltage auxiliary lines GVAL1 connected to the first gate voltage supply line GVPL1 through the first gate voltage line contact hole GVLH1 may not be covered with the second planarization layer 170.

Accordingly, a short-circuit defect SERR between the first gate voltage supply line GVPL1 and the anti-ESD pattern layer ESDP may be induced.

In order to prevent the above, as shown in FIG. 34, according to one or more embodiments, the one end EN_GVAL1 of each of the two or more first gate voltage auxiliary lines GVAL1 is not disposed to be closer to the edge of the substrate SUB beyond the first gate voltage supply line GVPL1.

In other words, the one end EN_GVAL1 of each of the two or more first gate voltage auxiliary lines GVAL1 may be spaced from the edge of the substrate SUB by a suitable first interval SD1 (e.g., a predetermined first interval SD1), and the first gate voltage supply line GVPL1 may be spaced from the edge of the substrate SUB by a second interval SD2 smaller than the first interval SD1.

Here, the one end EN_GVAL1 of each of the two or more first gate voltage auxiliary lines GVAL1 extends only up to the first gate voltage line contact hole GVLH1, and no longer extends to the edge of the substrate SUB through the first gate voltage supply line GVPL1.

Accordingly, the one end EN_GVAL1 of each of the two or more first gate voltage auxiliary lines GVAL1 may be reliably covered with the second planarization layer 170 because it is not disposed between the first gate voltage supply line GVPL1 and the edge of the substrate SUB. In other words, it is possible to improve the reliability of the one end EN_GVAL1 of each of the two or more first gate voltage auxiliary lines GVAL1 being covered with the second planarization layer 170.

In addition, although the second planarization layer 170 is disposed only to cover the first gate voltage supply line GVPL1, the one end EN_GVAL1 of each of the two or more first gate voltage auxiliary lines GVAL1 may be covered with the second planarization layer 170, so that it may be desirable to reduce the width of the non-display area NDA.

On the other hand, as shown in FIG. 35, because the second gate voltage supply line GVPL2 is further spaced from the edge of the substrate SUB than the first gate voltage supply line GVPL1, the one end EN_GVAL2 of each of the two or more second gate voltage auxiliary lines GVAL2 is highly unlikely to be exposed to the outside of the second planarization layer 170.

Accordingly, the one end EN_GVAL2 of each of the two or more second gate voltage auxiliary lines GVAL2 may be spaced from the edge of the substrate SUB by a third interval SD3 greater than the first interval SD1. In addition, the second gate voltage supply line GVPL2 may be spaced from the edge of the substrate SUB by a fourth interval SD4 greater than the third interval SD3.

Figure 36:
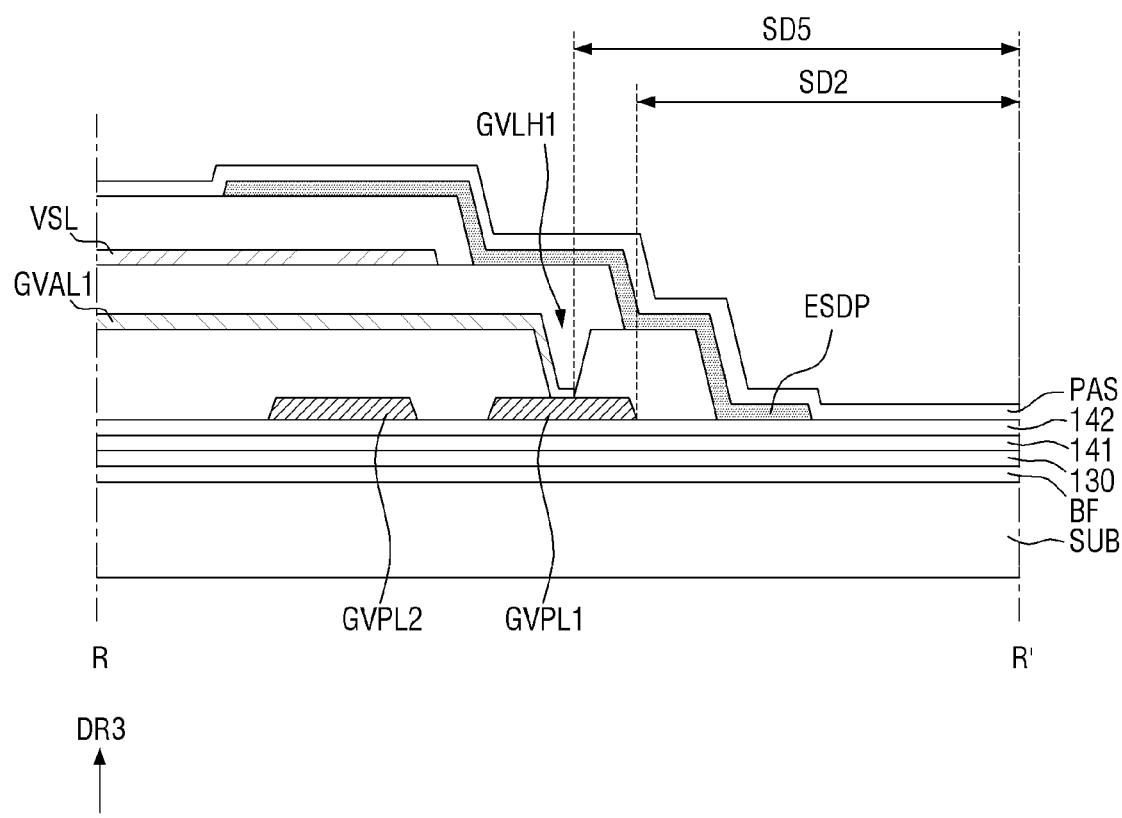
FIG. 36 is a cross-sectional view showing another example of FIG. 34.

FIG. 36 is a cross-sectional view showing another example of FIG. 34.

As shown in FIG. 36, according to one or more embodiments, the one end EN_GVAL1 of each of the two or more first gate voltage auxiliary lines GVAL1 may also extend only up to a part of the first gate voltage supply line GVPL1 exposed through the first gate voltage line contact hole GVLH1.

Accordingly, the one end EN_GVAL1 of each of the two or more first gate voltage auxiliary lines GVAL1 may be spaced from the edge of the substrate SUB by a fifth interval SD5 greater than the first interval SD1 in FIG. 34.

Accordingly, it is possible to improve the reliability of the one end EN_GVAL1 of each of the two or more first gate voltage auxiliary lines GVAL1 being covered with the second planarization layer 170, thereby further preventing the short-circuit defect.

However, the aspects of the present disclosure are not restricted to the one set forth herein. The above and other aspects of the present disclosure will become more apparent to one of daily skill in the art to which the disclosure pertains by referencing the claims, with functional equivalents thereof to be included therein.

What is claimed is:
1. A display device comprising:
a substrate including a display area in which a plurality of sub-pixels is arranged, and a non-display area at a periphery of the display area;
a transistor array layer on a first surface of the substrate; and
a plurality of light emitting elements in the display area on the transistor array layer, and corresponding to the plurality of sub-pixels,
wherein the transistor array layer comprises:
a plurality of pixel drivers in a circuit area of the display area, each of the plurality of pixel drivers corresponding to the plurality of sub-pixels, and each of the plurality of pixel drivers comprising at least one transistor;
two or more gate drivers in the circuit area, spaced from each other in one direction, and configured to supply each signal to gate lines connected to the plurality of pixel drivers;

a first gate voltage supply line around the circuit area of the display area, and extending in the one direction; and two or more first gate voltage auxiliary lines extending in the other direction crossing the one direction, and connected between the first gate voltage supply line and each of the two or more gate drivers, and one end of each of the two or more first gate voltage auxiliary lines is connected to the first gate voltage supply line through at least one first gate voltage line contact hole, and is further spaced from an edge of the substrate adjacent to the first gate voltage supply line than the first gate voltage supply line.

2. The display device of claim 1, wherein each of the plurality of light emitting elements is a flip chip type micro light emitting diode element.

3. The display device of claim 1, wherein each pixel of a plurality of pixels comprises two or more sub-pixels of the plurality of sub-pixels adjacent in the one direction or the other direction, wherein the display device further comprises an anti-ESD pattern layer in a part of the non-display area of the first surface of the substrate, wherein the anti-ESD pattern layer comprises a main pattern in parallel with an edge of the display area, and a plurality of sub-patterns protruding from the main pattern toward the display area, wherein the plurality of sub-patterns is respectively located between pixels adjacent to the main pattern from among the plurality of pixels, and wherein at least one of the plurality of sub-patterns overlaps the first gate voltage line contact hole.

4. The display device of claim 3, wherein the first gate voltage supply line is located adjacent to the main pattern of the anti-ESD pattern layer.

5. The display device of claim 3, wherein the non-display area includes at least one pad area in which pads connected to the transistor array layer are located, and wherein the anti-ESD pattern layer is spaced from the at least one pad area.

6. The display device of claim 5, further comprising:

connection lines on a second surface of the substrate opposite to the first surface of the substrate; and side surface lines on one side surface between the first surface and the second surface of the substrate, the side surface lines being connected between the line pads and the connection lines, and wherein each of the connection lines is connected to a flexible film through a conductive adhesive member.

7. The display device of claim 3, wherein the one end of each of the two or more first gate voltage auxiliary lines extends in the one direction and overlaps the first gate voltage supply line.

8. The display device of claim 3, wherein the transistor array layer further comprises:

a second gate voltage supply line located around the circuit area of the display area, extending in the one direction, and further spaced from the edge of the substrate than the first gate voltage supply line; and two or more second gate voltage auxiliary lines extending in the other direction, and connected between each of the two or more gate drivers and the second gate voltage supply line, wherein the first gate voltage supply line and the two or more first gate voltage auxiliary lines are configured to transmit a first gate level voltage to the two or more gate drivers, and wherein the second gate voltage supply line and the two or more second gate voltage auxiliary lines transmit a second gate level voltage having a voltage level different from the first gate level voltage to the two or more gate drivers.

9. The display device of claim 3, wherein the transistor array layer comprises:

a gate insulating layer covering a semiconductor layer on the first surface of the substrate;

a first interlayer insulating layer covering a first conductive layer on the gate insulating layer;

a second interlayer insulating layer covering a second conductive layer on the first interlayer insulating layer;

a first planarization layer covering a third conductive layer on the second interlayer insulating layer;

a second planarization layer covering a fourth conductive layer on the first planarization layer; and a third planarization layer covering a fifth conductive layer on the second planarization layer, wherein the third conductive layer comprises the first gate voltage supply line, and wherein the fourth conductive layer comprises the two or more first gate voltage auxiliary lines.

10. The display device of claim 9, wherein the transistor array layer further comprises:

a sixth conductive layer on the third planarization layer, the sixth conductive layer comprising a plurality of anode electrodes corresponding to the plurality of sub-pixels and a plurality of cathode electrodes corresponding to the plurality of sub-pixels, each of the plurality of cathode electrodes being adjacent to a corresponding one of the plurality of anode electrodes; and a seventh conductive layer on the sixth conductive layer and comprising a transparent conductive material, the seventh conductive layer comprising a plurality of anode pads covering the plurality of anode electrodes and a plurality of cathode pads covering the plurality of cathode electrodes, wherein the plurality of light emitting elements is located on the plurality of anode pads and the plurality of cathode pads.

11. The display device of claim 10, wherein the seventh conductive layer comprises the anti-ESD pattern layer, wherein a part of an edge of the second planarization layer adjacent to the edge of the substrate is exposed to the outside of the third planarization layer, and a part of an edge of the first planarization layer adjacent to the edge of the substrate is exposed to the outside of the second planarization layer, and wherein the plurality of sub-patterns of the anti-ESD pattern layer come into contact with the first planarization layer, the second planarization layer, and the third planarization layer.

12. The display device of claim 10, wherein the transistor array layer further comprises:

a scan write line configured to receive a scan write signal from any one of the two or more gate drivers;

a scan initialization line configured to receive a scan initialization signal from any one of the two or more gate drivers;

a sweep signal line configured to receive a sweep signal from any one of the two or more gate drivers;

a first data line configured to receive a first data voltage; and a second data line configured to receive a second data voltage, wherein the pixel driver of each of the plurality of sub-pixels is connected to the scan write line, the scan initialization line, the sweep signal line, the first data line, and the second data line, and wherein the pixel driver of each of the plurality of sub-pixels comprises:
- a first pixel drive circuit unit configured to generate a control current according to the first data voltage of the first data line;
- a second pixel drive circuit unit configured to generate a drive current applied to the anode electrode according to the second data voltage of the second data line; and
- a third pixel drive circuit unit configured to control a period in which the drive current is applied to the anode electrode according to the control current of the first pixel drive circuit unit, wherein the first pixel drive circuit unit comprises:
- a first transistor configured to generate the control current according to the first data voltage;
- a second transistor configured to apply the first data voltage of the first data line to a first electrode of the first transistor according to the scan write signal;
- a third transistor configured to apply an initialization voltage of an initialization voltage line to a gate electrode of the first transistor according to the scan initialization signal;
- a fourth transistor configured to connect the gate electrode and a second electrode of the first transistor according to the scan write signal; and
- a first capacitor located between the sweep signal line and the gate electrode of the first transistor.

13. The display device of claim 12, wherein the transistor array layer further comprises:
- a first power supply line configured to receive a first power supply voltage;
- a second power supply line configured to receive a second power supply voltage;
- a first light emitting line configured to receive a first light emitting signal from any one of the two or more gate drivers; and
- a scan control line configured to receive a scan control signal from any one of the two or more gate drivers, wherein the two or more first gate voltage auxiliary lines are further connected to the pixel driver of each of the plurality of sub-pixels, and wherein the first pixel drive circuit unit further comprises:
- a fifth transistor configured to connect the first power supply line to the first electrode of the first transistor according to the first light emitting signal;
- a sixth transistor configured to connect the second electrode of the first transistor to the third pixel drive circuit unit according to the first light emitting signal; and
- a seventh transistor configured to connect a first node between the sweep signal line and the first capacitor to the first gate voltage auxiliary line according to the scan control signal.

14. The display device of claim 13, wherein the second pixel drive circuit unit comprises:
- an eighth transistor configured to generate the drive current according to the second data voltage;
- a ninth transistor configured to apply the second data voltage of the second data line to a first electrode of the eighth transistor according to the scan write signal;
- a tenth transistor configured to apply the initialization voltage of the initialization voltage line to a gate electrode of the eighth transistor according to the scan initialization signal; and
- an eleventh transistor configured to connect the gate electrode and a second electrode of the eighth transistor according to the scan write signal.

15. The display device of claim 14, wherein the second pixel drive circuit unit further comprises:
- a twelfth transistor configured to connect the second power supply line to the first electrode of the eighth transistor according to the first light emitting signal;
- a thirteenth transistor configured to connect the first power supply line to a second node according to the scan control signal;
- a fourteenth transistor configured to connect the second power supply line to the second node according to the first light emitting signal; and
- a second capacitor located between the gate electrode of the eighth transistor and the second node.

16. The display device of claim 15, wherein the third pixel drive circuit unit is connected to the sixth transistor of the first pixel drive circuit unit at a third node, and wherein the third pixel drive circuit unit comprises:
- a fifteenth transistor comprising a gate electrode connected to the third node;
- a sixteenth transistor configured to connect the third node to the initialization voltage line according to the scan control signal;
- a seventeenth transistor configured to connect a second electrode of the fifteenth transistor to the anode electrode according to the second light emitting signal;
- an eighteenth transistor configured to connect the anode electrode to the initialization voltage line according to the scan control signal; and
- a third capacitor located between the third node and the initialization voltage line.

17. The display device of claim 16, wherein the transistor array layer further comprises:
- a third power supply line connected to the plurality of cathode electrodes, and configured to receive a third power supply voltage;
- a plurality of first anode connection electrodes corresponding to the plurality of sub-pixels; and
- a plurality of second anode connection electrodes corresponding to the plurality of sub-pixels, and each of the plurality of second anode connection electrodes are connected to the plurality of first anode connection electrodes, wherein the semiconductor layer comprises a channel, a source electrode, and a drain electrode of each of the first, second, third, fourth, fifth, sixth, seventh, eighth, ninth, tenth, eleventh, twelfth, thirteenth, fourteenth, fifteenth, sixteenth, seventeenth, and eighteenth transistors, wherein the first conductive layer comprises a gate electrode of each of the first, second, third, fourth, fifth, sixth, seventh, eighth, ninth, tenth, eleventh, twelfth, thirteenth, fourteenth, fifteenth, sixteenth, seventeenth, and eighteenth transistors, and first, third, and fifth capacitor electrodes that are one ends of the respective first, second, and third capacitors, wherein the second conductive layer comprises second, fourth, and sixth capacitor electrodes that are the other ends of the respective first, second, and third capacitors, wherein the third conductive layer comprises the initialization voltage line, the scan initialization line, the scan write line, the first light emitting line, the second light emitting line, a first power supply horizontal line configured to receive the first power supply voltage, the sweep signal line, the first gate voltage auxiliary line, the scan control line, and a third power supply auxiliary line configured to receive the third power supply voltage, wherein the fourth conductive layer comprises the first data line, a first power supply vertical line configured to receive the first power supply voltage, the second data line, and the plurality of first anode connection electrodes, wherein the fifth conductive layer comprises the second power supply line and the plurality of second anode connection electrodes, and wherein the third power supply line is spaced from the second power supply line, and is a part of the fifth conductive layer or the sixth conductive layer.

18. A tile-shaped display device comprising: a plurality of display devices arranged in parallel with each other; and a seaming part located between the plurality of display devices, wherein any one of the plurality of display devices comprises:

a substrate comprising a display area in which a plurality of sub-pixels is arranged, and a non-display area that is periphery of the display area;

a transistor array layer on a first surface of the substrate; and a plurality of light emitting elements in the display area on the transistor array layer, wherein the plurality of light emitting elements corresponds to the plurality of sub-pixels, wherein the transistor array layer further comprises:
 a plurality of pixel drivers in a circuit area of the display area, the plurality of pixel drivers corresponding to the plurality of sub-pixels, each of the plurality of sub-pixels comprising at least one transistor;
 a first gate voltage supply line at a part of an edge of the display area that is a periphery of the circuit area, and extending in one direction;
 two or more gate drivers in the circuit area, spaced from each other in the one direction, and configured to supply a gate signal to gate lines connected to the plurality of pixel drivers; and
 two or more first gate voltage auxiliary lines extending in the other direction crossing the one direction, and connected between the first gate voltage supply line and each of the two or more gate drivers, and
 one end of each of the two or more first gate voltage auxiliary lines is connected to the first gate voltage supply line through at least one first gate voltage line contact hole, and is further spaced from an edge of the substrate adjacent to the first gate voltage supply line than the first gate voltage supply line.

19. The tile-shaped display device of claim 18, wherein each of the plurality of light emitting elements is a flip chip type micro light emitting diode element.

20. The tile-shaped display device of claim 18, wherein each of the plurality of display devices comprises a plurality of pixels, each of the plurality of pixels comprising two or more sub-pixels adjacent in the one direction or the other direction from among the plurality of sub-pixels, wherein any one of the plurality of display devices further comprises an anti-ESD pattern layer on a part of the non-display area of the first surface of the substrate, wherein the anti-ESD pattern layer comprises a main pattern in parallel with an edge of the display area, and a plurality of sub-patterns protruding from the main pattern toward the display area, wherein the plurality of sub-patterns is respectively disposed between pixels adjacent to the main pattern from among the plurality of pixels, and wherein at least one of the plurality of sub-patterns overlaps the first gate voltage line contact hole.

21. The tile-shaped display device of claim 20, wherein the first gate voltage supply line is located adjacent to the main pattern of the anti-ESD pattern layer.

22. The tile-shaped display device of claim 20, wherein the non-display area includes at least one pad area in which pads connected to the transistor array layer are located, and
 wherein the anti-ESD pattern layer is spaced from the at least one pad area.

23. The tile-shaped display device of claim 22, wherein each of the plurality of display devices further comprises:
 connection lines on a second surface of the substrate opposite to the first surface of the substrate; and
 side surface lines on one side surface between the first surface and the second surface of the substrate, each of the side surface lines being connected between the line pads and the connection lines,
 wherein each of the connection lines is connected to a flexible film through a conductive adhesive member.

24. The tile-shaped display device of claim 20, wherein the one end of each of the two or more first gate voltage auxiliary lines extends in the one direction, and overlaps the first gate voltage supply line.

25. The tile-shaped display device of claim 20, wherein the transistor array layer further comprises:
 a second gate voltage supply line located at a part of the edge of the display area, extending in the one direction, and further spaced from the edge of the substrate than the first gate voltage supply line; and
 two or more second gate voltage auxiliary lines extending in the other direction, and connected between each of the two or more gate drivers and the second gate voltage supply line,
 wherein the first gate voltage supply line and the two or more first gate voltage auxiliary lines transmit a predetermined first gate level voltage to the two or more gate drivers, and
 wherein the second gate voltage supply line and the two or more second gate voltage auxiliary lines transmit a second gate level voltage having a voltage level different from the first gate level voltage to the two or more gate drivers.

26. The tile-shaped display device of claim 20, wherein the transistor array layer comprises:
 a gate insulating layer covering a semiconductor layer on the first surface of the substrate;
 a first interlayer insulating layer covering a first conductive layer on the gate insulating layer;
 a second interlayer insulating layer covering a second conductive layer on the first interlayer insulating layer;
 a first planarization layer covering a third conductive layer on the second interlayer insulating layer;
 a second planarization layer covering a fourth conductive layer on the first planarization layer; and
 a third planarization layer covering a fifth conductive layer on the second planarization layer, wherein the first gate voltage supply line is a part of the third conductive layer, and wherein the two or more first gate voltage auxiliary lines are a part of the fourth conductive layer.

27. The tile-shaped display device of claim 26, wherein the transistor array layer further comprises:

a sixth conductive layer on the third planarization layer, the sixth conductive layer comprising a plurality of anode electrodes corresponding to the plurality of sub-pixels and a plurality of cathode electrodes corresponding to the plurality of sub-pixels, each of the plurality of cathode electrodes being adjacent to a corresponding one of the plurality of anode electrodes; and a seventh conductive layer on the sixth conductive layer and comprising a transparent conductive material, the seventh conductive layer comprising a plurality of anode pads covering the plurality of anode electrodes and a plurality of cathode pads covering the plurality of cathode electrodes, wherein the plurality of light emitting elements is located on the plurality of anode pads and the plurality of cathode pads.

28. The tile-shaped display device of claim 27, wherein the anti-ESD pattern layer is a part of the seventh conductive layer, wherein a part of an edge of the second planarization layer adjacent to the edge of the substrate is exposed to the outside of the third planarization layer, and a part of an edge of the first planarization layer adjacent to the edge of the substrate is exposed to the outside of the second planarization layer, and wherein the plurality of sub-patterns of the anti-ESD pattern layer come into contact with the first planarization layer, the second planarization layer, and the third planarization layer.

29. The tile-shaped display device of claim 18, wherein the plurality of display devices is arranged in a matrix form having M rows and N columns.

* * * * *